(12) United States Patent
Yamazaki

(10) Patent No.: US 11,189,736 B2
(45) Date of Patent: Nov. 30, 2021

(54) SEMICONDUCTOR DEVICE AND MANUFACTURING METHOD THEREOF

(71) Applicant: Semiconductor Energy Laboratory Co., Ltd., Kanagawa-ken (JP)

(72) Inventor: Shunpei Yamazaki, Tokyo (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 15/213,719

(22) Filed: Jul. 19, 2016

(65) Prior Publication Data
US 2017/0025548 A1    Jan. 26, 2017

(30) Foreign Application Priority Data

Jul. 24, 2015 (JP) .............................. JP2015-146369

(51) Int. Cl.
*H01L 29/10* (2006.01)
*H01L 29/786* (2006.01)
(Continued)

(52) U.S. Cl.
CPC .. *H01L 29/78696* (2013.01); *G06K 19/07758* (2013.01); *H01L 27/1052* (2013.01);
(Continued)

(58) Field of Classification Search
CPC ........... H01L 27/1225; H01L 27/14616; H01L 29/42384; H01L 29/66969;
(Continued)

(56) References Cited

U.S. PATENT DOCUMENTS 5,731,856 A   3/1998 Kim et al.
5,744,864 A   4/1998 Cillessen et al.
(Continued)

FOREIGN PATENT DOCUMENTS

EP   1 737 044 A1   12/2006
EP   2 226 847 A2    9/2010
(Continued)

OTHER PUBLICATIONS

Seo et al., "Solution-Processed Flexible Fluorine-doped Indium Zinc Oxide Thin-Film Transistors Fabricated on Plastic Film at Low Temperature", Scientific Reports 3 : 2085 (2013) pp. 1-9.*
(Continued)

*Primary Examiner* — Jay C Kim
(74) *Attorney, Agent, or Firm* — Husch Blackwell LLP

(57) ABSTRACT

A minute transistor is provided. A transistor with low parasitic capacitance is provided. A transistor having high frequency characteristics is provided. A semiconductor device including the transistor is provided. The semiconductor device includes an oxide semiconductor; a second insulator; a first conductor and a first insulator that are embedded in the second insulator; a second conductor; a third conductor; and a third insulator covering the oxide semiconductor. The oxide semiconductor includes a region where an angle formed between a plane that is parallel to a bottom surface of the oxide semiconductor and the side surface of the oxide semiconductor is greater than or equal to 30° and less than or equal to 60°.

10 Claims, 52 Drawing Sheets

(51) Int. Cl.
*H01L 29/423* (2006.01)
*H01L 29/66* (2006.01)
*H01L 27/105* (2006.01)
*H01L 27/146* (2006.01)
*H01L 27/12* (2006.01)
*G06K 19/077* (2006.01)
*H04W 88/02* (2009.01)

(52) U.S. Cl.
CPC .... *H01L 27/1225* (2013.01); *H01L 27/14616* (2013.01); *H01L 29/42384* (2013.01); *H01L 29/66969* (2013.01); *H01L 29/7869* (2013.01); *H01L 29/78648* (2013.01); *H04W 88/02* (2013.01)

(58) Field of Classification Search
CPC ........... H01L 29/78648; H01L 29/7869; H01L 29/78696; H01L 27/1052; G06K 19/07758; H01W 88/02
See application file for complete search history.

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,586,123 B2 * | 9/2009 | Choi ........................ H01L 27/12 257/223 |
| 7,674,650 B2 | 3/2010 | Akimoto et al. |
| 7,732,819 B2 | 6/2010 | Akimoto et al. |
| 7,960,199 B2 | 6/2011 | Choi et al. |
| 8,237,166 B2 | 8/2012 | Kumomi et al. |
| 8,377,744 B2 * | 2/2013 | Yamazaki ........... H01L 29/7869 438/104 |
| 8,421,068 B2 * | 4/2013 | Yamazaki ........... H01L 27/1225 257/43 |
| 8,421,069 B2 * | 4/2013 | Yamazaki ................ H01L 21/84 257/43 |
| 8,445,902 B2 * | 5/2013 | Sato .................... H01L 29/7869 257/43 |
| 8,501,564 B2 | 8/2013 | Suzawa et al. |
| 8,502,221 B2 * | 8/2013 | Yamazaki ........... H01L 29/7869 257/43 |
| 8,502,225 B2 * | 8/2013 | Yamazaki ......... H01L 29/78693 257/59 |
| 8,547,771 B2 | 10/2013 | Koyama |
| 8,604,472 B2 | 12/2013 | Sasagawa et al. |
| 8,716,708 B2 * | 5/2014 | Yamazaki ......... H01L 29/41733 257/43 |
| 8,748,240 B2 | 6/2014 | Yamazaki |
| 8,766,252 B2 * | 7/2014 | Yamazaki ................ H01L 29/45 257/43 |
| 8,766,255 B2 * | 7/2014 | Isobe .................. H01L 27/1156 257/288 |
| 8,785,933 B2 * | 7/2014 | Endo ................... H01L 29/7869 257/57 |
| 8,809,854 B2 * | 8/2014 | Isobe .................. H01L 29/4236 257/43 |
| 8,809,870 B2 * | 8/2014 | Yamazaki ........... H01L 27/0688 257/77 |
| 8,823,074 B2 | 9/2014 | Suzawa et al. |
| 8,860,021 B2 * | 10/2014 | Isobe .................... H01L 29/786 257/43 |
| 8,878,177 B2 * | 11/2014 | Sasagawa ............... H01L 21/34 257/43 |
| 8,916,868 B2 * | 12/2014 | Isobe .................. H01L 27/1156 257/43 |
| 8,995,174 B2 | 3/2015 | Koyama |
| 9,006,736 B2 | 4/2015 | Sasagawa et al. |
| 9,040,981 B2 * | 5/2015 | Yamazaki ............. H01L 29/786 257/43 |
| 9,040,984 B2 | 5/2015 | Watanabe et al. |
| 9,048,265 B2 | 6/2015 | Hondo et al. |
| 9,048,323 B2 | 6/2015 | Yamazaki et al. |
| 9,059,219 B2 | 6/2015 | Sasagawa et al. |
| 9,064,967 B2 | 6/2015 | Suzawa et al. |
| 9,087,726 B2 * | 7/2015 | Sato ..................... H01L 29/7869 |
| 9,099,303 B2 | 8/2015 | Yamazaki |
| 9,136,388 B2 * | 9/2015 | Yamazaki ......... H01L 29/78618 |
| 9,209,092 B2 * | 12/2015 | Yamazaki ................ H01L 21/84 |
| 9,209,795 B2 | 12/2015 | Okamoto et al. |
| 9,219,165 B2 | 12/2015 | Sato et al. |
| 9,281,408 B2 | 3/2016 | Yamazaki et al. |
| 9,281,409 B2 | 3/2016 | Yamazaki et al. |
| 9,349,869 B2 | 5/2016 | Koezuka et al. |
| 9,419,145 B2 | 8/2016 | Sasagawa et al. |
| 9,431,547 B2 | 8/2016 | Yamazaki et al. |
| 9,443,876 B2 * | 9/2016 | Yamazaki ........... H01L 27/1255 |
| 9,443,934 B2 * | 9/2016 | Kobayashi ........... H01L 29/7869 |
| 9,449,819 B2 | 9/2016 | Sato et al. |
| 9,490,241 B2 * | 11/2016 | Nomura ............... H01L 27/1108 |
| 9,530,856 B2 * | 12/2016 | Miyairi ............. H01L 29/78648 |
| 9,559,211 B2 * | 1/2017 | Yamazaki ........... H01L 21/0237 |
| 9,590,109 B2 | 3/2017 | Miyairi et al. |
| 9,634,149 B2 | 4/2017 | Endo et al. |
| 9,647,125 B2 * | 5/2017 | Yamazaki ......... H01L 29/78648 |
| 9,660,100 B2 * | 5/2017 | Okazaki ............... H01L 27/1225 |
| 9,691,904 B2 | 6/2017 | Sasagawa et al. |
| 9,748,403 B2 * | 8/2017 | Koezuka ............. H01L 29/7869 |
| 9,768,318 B2 * | 9/2017 | Yamazaki ........... H01L 29/7869 |
| 9,812,583 B2 | 11/2017 | Sato et al. |
| 9,837,547 B2 * | 12/2017 | Koezuka ............. H01L 29/7869 |
| 9,837,552 B2 | 12/2017 | Yamazaki et al. |
| 9,847,429 B2 | 12/2017 | Yamazaki et al. |
| 9,865,712 B2 * | 1/2018 | Okamoto ........... H01L 29/42376 |
| 9,917,209 B2 * | 3/2018 | Endo ................... H01L 21/8258 |
| 9,947,794 B2 | 4/2018 | Miyairi et al. |
| 9,947,801 B2 * | 4/2018 | Yamazaki ........... H01L 27/1225 |
| 10,002,971 B2 * | 6/2018 | Jintyou ............... H01L 29/7869 |
| 10,128,384 B2 | 11/2018 | Yamazaki et al. |
| 10,217,736 B2 * | 2/2019 | Kato ................... H01L 27/1255 |
| 10,236,287 B2 * | 3/2019 | Yamazaki ........... H01L 27/0629 |
| 10,361,291 B2 | 7/2019 | Koezuka et al. |
| 10,361,318 B2 | 7/2019 | Sato et al. |
| 10,411,136 B2 | 9/2019 | Yamazaki et al. |
| 10,699,904 B2 | 6/2020 | Endo et al. |
| 10,720,532 B2 | 7/2020 | Yamazaki et al. |
| 2001/0046027 A1 | 11/2001 | Taly et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |

(56) References Cited

U.S. PATENT DOCUMENTS

| | | |
|---|---|---|
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0133177 A1 | 6/2011 | Suzawa et al. |
| 2012/0025191 A1* | 2/2012 | Yamazaki ............ H01L 21/0237 257/57 |
| 2012/0032163 A1 | 2/2012 | Yamazaki |
| 2012/0193625 A1* | 8/2012 | Sasagawa ......... H01L 29/41733 257/57 |
| 2012/0248544 A1 | 10/2012 | Yokoyama |
| 2013/0020571 A1* | 1/2013 | Yamazaki ......... H01L 29/78618 257/43 |
| 2013/0187151 A1* | 7/2013 | Yamazaki ............. H01L 29/786 257/43 |
| 2013/0277676 A1 | 10/2013 | Yamazaki |
| 2013/0285050 A1 | 10/2013 | Yamazaki et al. |
| 2013/0320332 A1 | 12/2013 | Hondo et al. |
| 2014/0004656 A1 | 1/2014 | Sasagawa et al. |
| 2014/0034954 A1* | 2/2014 | Yamazaki ............ H01L 27/1255 257/59 |
| 2014/0110705 A1* | 4/2014 | Koezuka ............... H01L 21/022 257/43 |
| 2014/0131701 A1 | 5/2014 | Watanabe et al. |
| 2014/0138674 A1* | 5/2014 | Sato .................... H01L 29/7869 257/43 |
| 2014/0339540 A1 | 11/2014 | Takemura |
| 2014/0339560 A1 | 11/2014 | Yamazaki et al. |
| 2015/0014679 A1 | 1/2015 | Sasagawa et al. |
| 2015/0021596 A1 | 1/2015 | Yamazaki et al. |
| 2015/0041803 A1 | 2/2015 | Endo et al. |
| 2015/0060844 A1 | 3/2015 | Miyairi et al. |
| 2015/0187898 A1* | 7/2015 | Miyairi ............. H01L 29/66969 257/43 |
| 2015/0221754 A1 | 8/2015 | Hondo et al. |
| 2015/0270402 A1 | 9/2015 | Endo et al. |
| 2015/0280003 A1 | 10/2015 | Yamazaki et al. |
| 2015/0280013 A1 | 10/2015 | Yamazaki et al. |
| 2015/0372009 A1 | 12/2015 | Yamazaki |
| 2016/0218225 A1 | 7/2016 | Yamazaki |
| 2016/0240684 A1 | 8/2016 | Yamazaki et al. |
| 2017/0236848 A1 | 8/2017 | Yamazaki |
| 2019/0288093 A1 | 9/2019 | Koezuka et al. |
| 2019/0341502 A1 | 11/2019 | Sato et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086090 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-013513 A | 1/2006 |
| JP | 2012-049514 A | 3/2012 |
| JP | 2012-257187 A | 12/2012 |
| JP | 2013-149968 A | 8/2013 |
| JP | 2014-116588 A | 6/2014 |
| JP | 2014-116591 A | 6/2014 |
| JP | 2014-199907 A | 10/2014 |
| JP | 2014-240833 A | 12/2014 |
| JP | 2014-241407 A | 12/2014 |
| JP | 2015-005740 A | 1/2015 |
| JP | 2015-035590 A | 2/2015 |
| JP | 2015-038974 A | 2/2015 |
| JP | 2015-053478 A | 3/2015 |
| JP | 2015-065426 A | 4/2015 |
| JP | 2015-122509 A | 7/2015 |
| KR | 2014-0136381 A | 11/2014 |
| KR | 2015-0007958 A | 1/2015 |
| KR | 2015-0017676 A | 2/2015 |
| KR | 2015-0026875 A | 3/2015 |
| WO | WO 2004/114391 A1 | 12/2004 |
| WO | WO-2012/014786 A1 | 2/2012 |
| WO | WO 2014/077207 A1 | 5/2014 |

OTHER PUBLICATIONS

Bak et al., "Origin of Degradation Phenomenon under Drain Bias Stress for Oxide Thin Film Transistors using IGZO and IGO Channel Layers", Scientific Reports 5: 7884 (2014) pp. 1-5.*

Kim et al., "SINx charge-trap nonvolatile memory based on ZnO thin-film transistors", Applied Physics Letters 99 (2011) 112115.*

Hwang et al., "Role of ultrathin Al2O3 layer in organic/inorganic hybrid gate dielectrics for flexibility improvement of InGaZnO thin film transistors", Organic Electronics 15 (2014) pp. 1458-1464.*

(56) References Cited

OTHER PUBLICATIONS

Ryu et al., "Comparative studies on electrical bias temperature instabilities of In—Ga—Zn—O thin film transistors with different device configurations", Solid-State Electronics 89 (2013) pp. 171-176.*
Takechi et al., "Sensitivity Evaluation on Amorphous InGaZnO4 Thin-Film Transistor pH Sensors Having Various Capacitances of Ion-Sensitive and Bottom-Gate Insulators", ECS Journal of Solid State Science and Technology, 3 (2014) pp. Q3076-Q3080.*
Kamiya et al., "Present status of amorphous In—Ga—Zn—O thin-film transistors", Science and Technology of Advanced Materials 11 (2010) 044305.*
Lee et al., "Removal of Negative-Bias-Illumination-Stress Instability in Amorphous-InGaZnO Thin-Film Transistors by Top-Gate Offset Structure", IEEE Electron Device Letters 35 (2014) pp. 930-932.*
Tai et al., "Active matrix touch sensor detecting time-constant change implemented by dual-gate IGZO TFTs", Solid-State Electronics 72 (2012) pp. 67-72.*
Bak et al., "Effect of In—Ga—Zn—O active layer channel composition on process temperature for flexible oxide thin-film transistors", Journal of Vacuum Science and Technology B 30 (2012) 041208.*
Jeon et al., "Short channel device performance of amorphous InGaZnO thin film transistor", Applied Physics Letters 99 (2011) 082104.*
Fortunato, E.M.C et al., "Wide-Bandgap High-Mobility ZnO Thin-Film Transistors Produced at Room Temperature," Applied Physics Letters, Sep. 27, 2004, vol. 85, No. 13, pp. 2541-2543.
Dembo, H. et al., "RFCPUS on Glass and Plastic Substrates Fabricated By TFT Transfer Technology," IEDM 05: Technical Digest of International Electron Devices Meeting, Dec. 5, 2005, pp. 1067-1069.
Ikeda, T. et al., "Full-Functional System Liquid Crystal Display Using CG-Silicon Technology," SID Digest '04: SID International Symposium Digest of Technical Papers, 2004, vol. 35, pp. 860-863.
Nomura, K. et al., "Room-Temperature Fabrication of Transparent Flexible Thin-Film Transistors Using Amorphous Oxide Semiconductors," Nature, Nov. 25, 2004, vol. 432, pp. 488-492.
Park, J-S. et al., "Improvements in the Device Characteristics of Amorphous Indium Gallium Zinc Oxide Thin-Film Transistors By Ar Plasma Treatment," Applied Physics Letters, Jun. 26, 2007, vol. 90, No. 26, p. 262106-1-262106-3.
Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.
Hayashi, R. et al., "42.1: Invited Paper: Improved Amorphous In—Ga—Zn—O TFTs," SID Digest '08: SID International Symposium Digest of Technical Papers, May 20, 2008, vol. 39, pp. 621-624.
Prins, M.W.J et al., "A Ferroelectric Transparent Thin-Film Transistor," Applied Physics Letters, Jun. 17, 1996, vol. 68, No. 25, pp. 3650-3652.
Nakamura, M. et al., "The Phase Relations in the In2O3—Ga2ZnO4—ZnO System at 1350° C.," Journal of Solid State Chemistry, Aug. 1, 1991, vol. 93, No. 2, pp. 298-315.
Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.
Nomura, K. et al., "Thin-Film Transistor Fabricated in Single-Crystalline Transparent Oxide Semiconductor," Science, May 23, 2003, vol. 300, No. 5623, pp. 1269-1272.
Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.

Asakuma, N. et al., "Crystallization and Reduction of Sol-Gel-Derived Zinc Oxide Films By Irradiation With Ultraviolet Lamp," Journal of Sol-Gel Science and Technology, 2003, vol. 26, pp. 181-184.
Osada, T. et al., "15.2: Development of Driver-Integrated Panel using Amorphous In—Ga—Zn-Oxide TFT," SID Digest '09: SID International Symposium Digest of Technical Papers, May 31, 2009, pp. 184-187.
Nomura, K. et al., "Carrier Transport in Transparent Oxide Semiconductor with Intrinsic Structural Randomness Probed Using Single-Crystalline InGaO3(ZnO)5 Films,"Applied Physics Letters, Sep. 13, 2004, vol. 85, No. 11, pp. 1993-1995.
Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Son, K.-S. et al., "42.4L: Late-News Paper: 4 Inch QVGA AMOLED Driven By the Threshold Voltage Controlled Amorphous GIZO (Ga2O3—In2O3—ZnO) TFT," SID Digest '08: SID International Symposium Digest of Technical Papers, May 20, 2008, vol. 39, pp. 633-636.
Lee, J-H. et al., "World's Largest (15-Inch) XGA AMLCD Panel Using IGZO Oxide TFT," SID Digest '08: SID International Symposium Digest of Technical Papers, May 20, 2008, vol. 39, pp. 625-628.
Nowatari, H. et al., "60.2: Intermediate Connector With Suppressed Voltage Loss for White Tandem OLEDs," SID Digest '09: SID International Symposium Digest of Technical Papers, May 31, 2009, vol. 40, pp. 899-902.
Kanno, H. et al., "White Stacked Electrophosphorecent Organic Light-Emitting Devices Employing MoO3 as a Charge-Generation Layer,"Advanced Materials, 2006, vol. 18, No. 3, pp. 339-342.
Tsuda, K. et al., "Ultra Low Power Consumption Technologies for Mobile TFT-LCDs ," IDW '02: Proceedings of the 9th International Display Workshops, Dec. 4, 2002, p. 295-298.
Van de Walle, C.G., "Hydrogen as a Cause of Doping in Zinc Oxide," Physical Review Letters, Jul. 31, 2000, vol. 85, No. 5, pp. 1012-1015.
Fung, T.C. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Jeong, J.K. et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.
Park, J.C. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.
Kurokawa, Y. et al., "UHF RFCPUS on Flexible and Glass Substrates for Secure RFID Systems," Journal of Solid-State Circuits , 2008, vol. 43, No. 1, pp. 292-299.
Ohara, H. et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Coates, D. et al., "Optical Studies of the Amorphous Liquid-Cholesteric Liquid Crystal Transition: the 'Blue Phase'," Physics Letters, Sep. 10, 1973, vol. 45A, No. 2, pp. 115-116.
Cho, D-H. et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.
Lee, M-H. et al., "15.4: Excellent Performance of Indium-Oxide-Based Thin-Film Transistors By DC Sputtering," SID Digest '09: SID International Symposium Digest of Technical Papers, May 31, 2009, pp. 191-193.
Jin, D-U. et al., "65.2: Distinguished Paper:World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

(56) References Cited

OTHER PUBLICATIONS

Sakata, J. et al., "Development of 4.0-In. AMOLED Display With Driver Circuit Using Amorphous In—Ga—Zn-Oxide TFTs," IDW '09: Proceedings of the 16th International Display Workshops, 2009, pp. 689-692.

Park, J-S. et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S. et al., "Challenge to Future Displays: Transparent AM-OLED Driven by PEALD Grown ZNO TFT," IMID '07 Digest, 2007, pp. 1249-1252.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Osada, T. et al., "Development of Driver-Integrated Panel Using Amorphous In—Ga—Zn-Oxide TFT," AM-FPD '09 Digest of Technical Papers, Jul. 1, 2009, pp. 33-36.

Hirao, T. et al., "Novel Top-Gate Zinc Oxide Thin-Film Transistors (ZnO TFTs) for AMLCDs," Journal of the SID, 2007, vol. 15, No. 1, pp. 17-22.

Hosono, H., "68.3: Invited Paper:Transparent Amorphous Oxide Semiconductors for High Performance TFT," SID Digest '07: SID International Symposium Digest of Technical Papers, 2007, vol. 38, pp. 1830-1833.

Godo, H. et al., "P-9: Numerical Analysis On Temperature Dependence of Characteristics of Amorphous In—Ga—Zn-Oxide TFT," SID Digest '09: SID International Symposium Digest of Technical Papers, May 31, 2009, pp. 1110-1112.

Ohara, H. et al., "21.3: 4.0 In. QVGA AMOLED Display Using In—Ga—Zn-Oxide TFTs With a Novel Passivation Layer," SID Digest '09: SID International Symposium Digest of Technical Papers, May 31, 2009, pp. 284-287.

Miyasaka, M., "SUFTLA Flexible Microelectronics on Their Way To Business," SID Digest '07: SID International Symposium Digest of Technical Papers, 2007, vol. 38, pp. 1673-1676.

Chern, H.N. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.

Asaoka, Y. et al., "29.1: Polarizer-Free Reflective LCD Combined With Ultra Low-Power Driving Technology," SID Digest '09: SID International Symposium Digest of Technical Papers, May 31, 2009, pp. 395-398.

Lee, H.N. et al., "Current Status of, Challenges to, and Perspective View of AM-OLED ," IDW'06: Proceedings of the 13th International Display Workshops, Dec. 7, 2006, pp. 663-666.

Kikuchi, H. et al., "62.2: Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, M., "Synthesis of Homologous Compound with New Long-Period Structure," NIRIM Newsletter, Mar. 1, 1995, vol. 150, pp. 1-4.

Kikuchi, H. et al., "Polymer-Stabilized Liquid Crystal Blue Phases," Nature Materials, Sep. 2, 2002, vol. 1, pp. 64-68.

Kimizuka, N. et al., "SPINEL,YbFe2O4, and Yb2Fe3O7 Types of Structures for Compounds in the IN2O3 and Sc2O3-A2O3-BO Systems [A; Fe, Ga, or Al; B: Mg, Mn, Fe, Ni, Cu,Or Zn] at Temperatures Over 1000° C.," Journal of Solid State Chemistry, 1985, vol. 60, pp. 382-384.

Kitzerow, H-S. et al., "Observation of Blue Phases in Chiral Networks," Liquid Crystals, 1993, vol. 14, No. 3, pp. 911-916.

Costello, M.J. et al., "Electron Microscopy of a Cholesteric Liquid Crystal and Its Blue Phase," Physical Review. A, May 1, 1984, vol. 29, No. 5, pp. 2957-2959.

Meiboom, S. et al., "Theory of the Blue Phase of Cholesteric Liquid Crystals," Physical Review Letters, May 4, 1981, vol. 46, No. 18, pp. 1216-1219.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita, M. et al., "Mechanism of Electrical Conductivity of Transparent InGaZnO4," Physical Review. B, Jan. 15, 2000, vol. 61, No. 3, pp. 1811-1816.

Nomura, K. et al., "Amorphous Oxide Semiconductors for High-Performance Flexible Thin-Film Transistors," Japanese Journal of Applied Physics, 2006, vol. 45, No. 5B, pp. 4303-4308.

Janotti, A. et al., "Native Point Defects In ZnO," Physical Review. B, Oct. 4, 2007, vol. 76, No. 16, p. 165202-1-165202-22.

Park, J-S. et al., "Electronic Transport Properties of Amorphous Indium-Gallium-Zinc Oxide Semiconductor Upon Exposure to Water," Applied Physics Letters, 2008, vol. 92, pp. 072104-1-072104-3.

Hsieh, H-H. et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti, A. et al., "Oxygen Vacancies In ZnO," Applied Physics Letters, 2005, vol. 87, p. 122102-1-122102-3.

Oba, F. et al., "Defect Energetics in ZnO: A Hybrid Hartree-Fock Density Functional Study," Physical Review. B, 2008, vol. 77, p. 245202-1-245202-6.

Orita, M. et al., "Amorphous Transparent Conductive Oxide lnGaO3(ZnO)m (m<4): a Zn4s Conductor," Philosophical Magazine, 2001, vol. 81, No. 5, pp. 501-515.

Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.

Mo, Y-G., et al., "Amorphous Oxide TFT Backplanes for Large Size AMOLED Displays," IDW '08: Proceedings of the 6th International Display Workshops, Dec. 3, 2008, pp. 581-584.

Kim, S. et al., "High-Performance Oxide Thin Film Transistors Passivated by Various Gas Plasmas," 214th ECS Meeting, 2008, No. 2317, ECS.

Clark, S.J et al., "First Principles Methods Using CASTEP," Zeitschrift fur Kristallographie, 2005, vol. 220, pp. 567-570.

Lany, S. et al., "Dopability, Intrinsic Conductivity, and Nonstoichiometry of Transparent Conducting Oxides," Physical Review Letters, Jan. 26, 2007, vol. 98, p. 045501-1-045501-4.

Park, J.S. et al., "Dry Etching of ZnO Films and Plasma-Induced Damage to Optical Properties," Journal of Vacuum Science & Technology B, Mar. 1, 2003, vol. 21, No. 2, pp. 800-803.

Oh, M.S. et al., "Improving the Gate Stability of ZnO Thin-Film Transistors With Aluminum Oxide Dielectric Layers," Journal of the Electrochemical Society, 2008, vol. 155, No. 12, pp. H1009-H1014.

Ueno, K. et al., "Field-Effect Transistor On SrTiO3 With Sputtered Al2O3 Gate Insulator," Applied Physics Letters, Sep. 1, 2003, vol. 83, No. 9, pp. 1755-1757.

\* cited by examiner

FIG. 11A
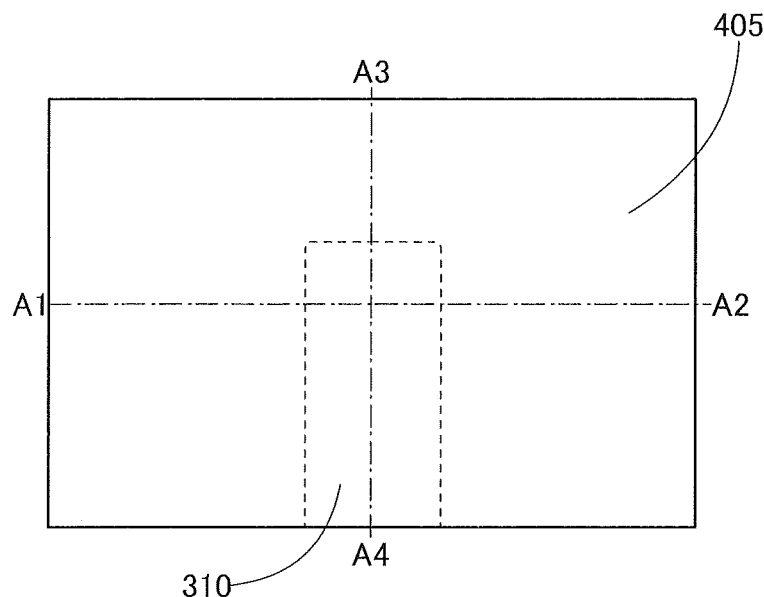
FIG. 11B
FIG 11C
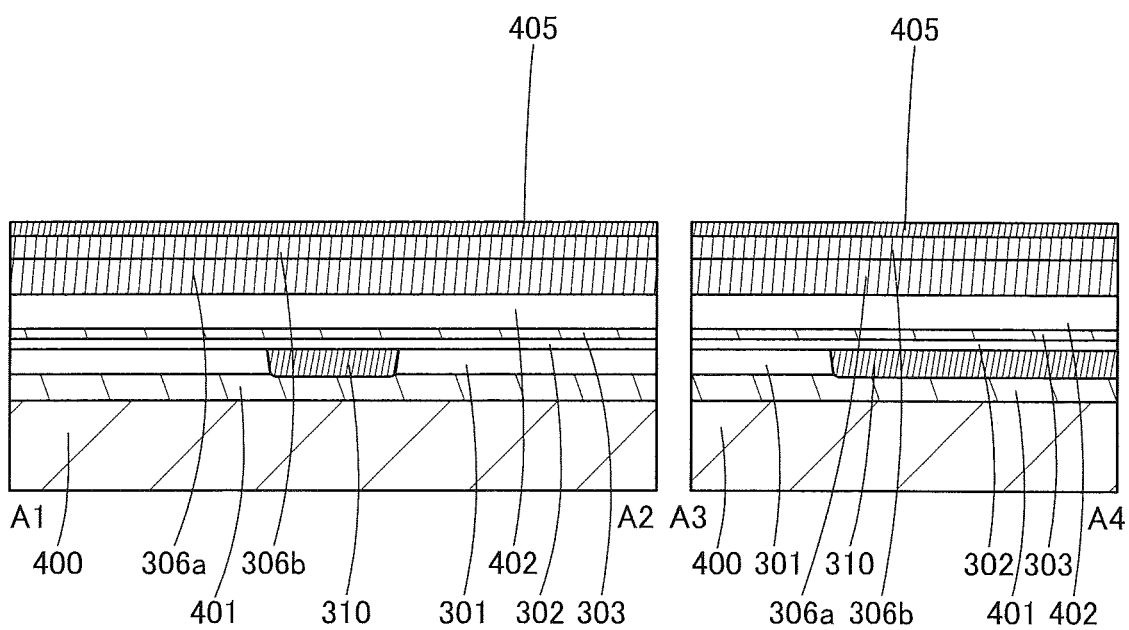

FIG. 15A
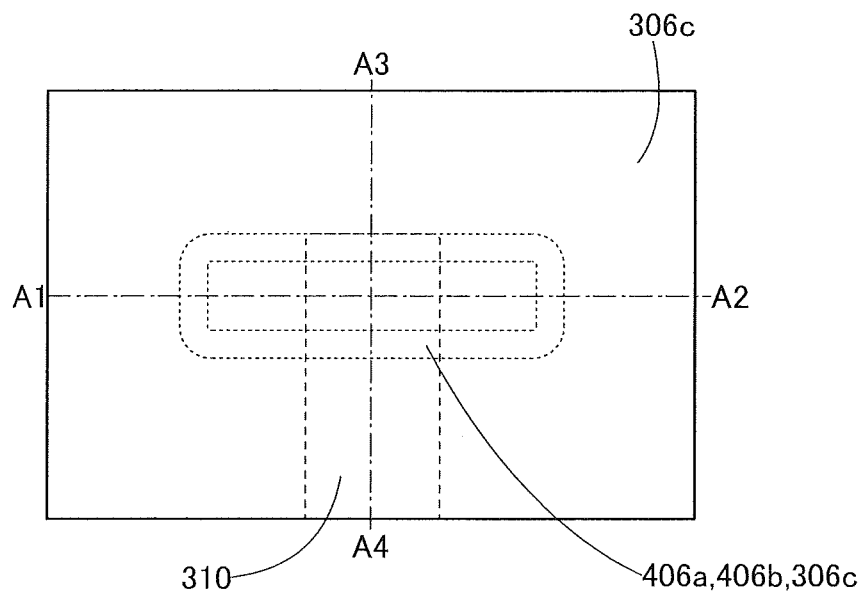
FIG. 15B
FIG. 15C
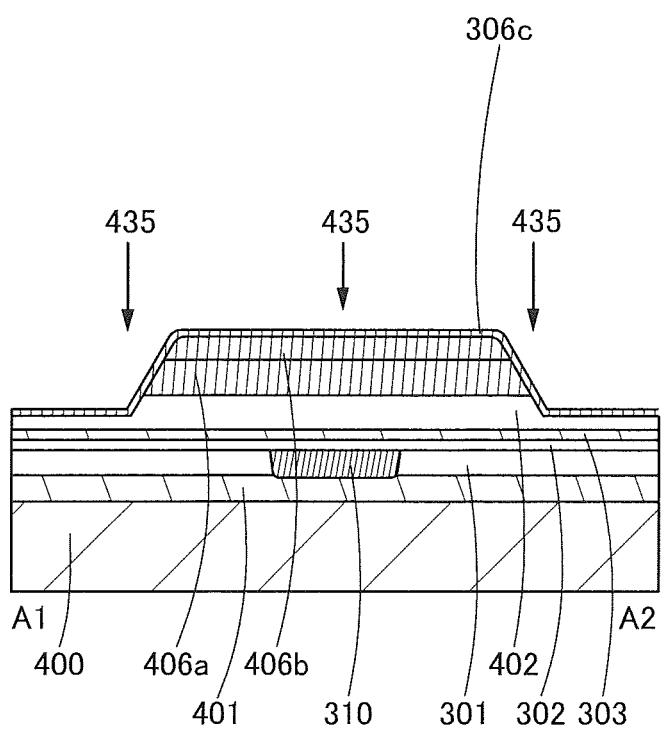
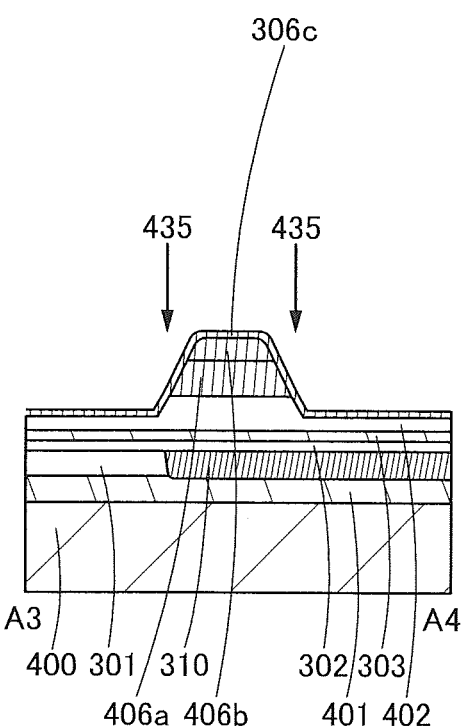

FIG. 17A
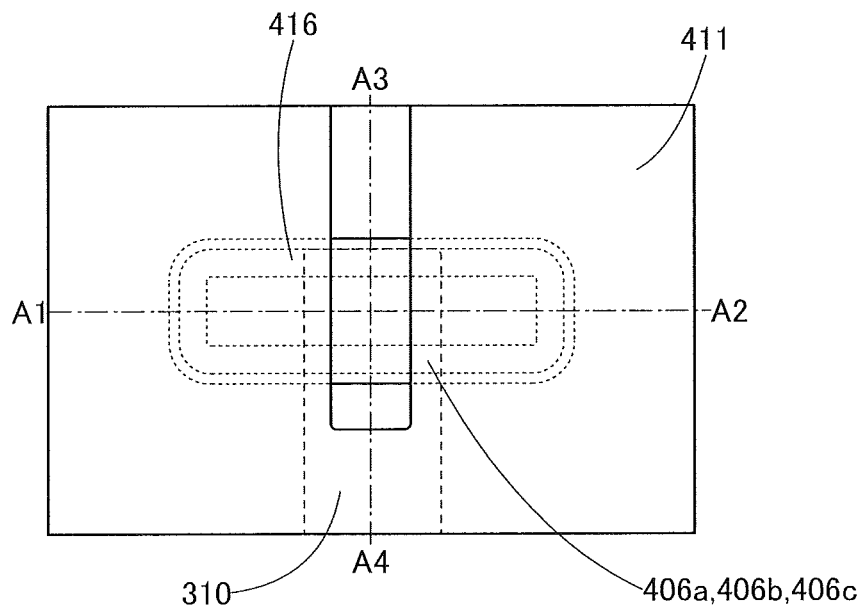
FIG 17B
FIG. 17C
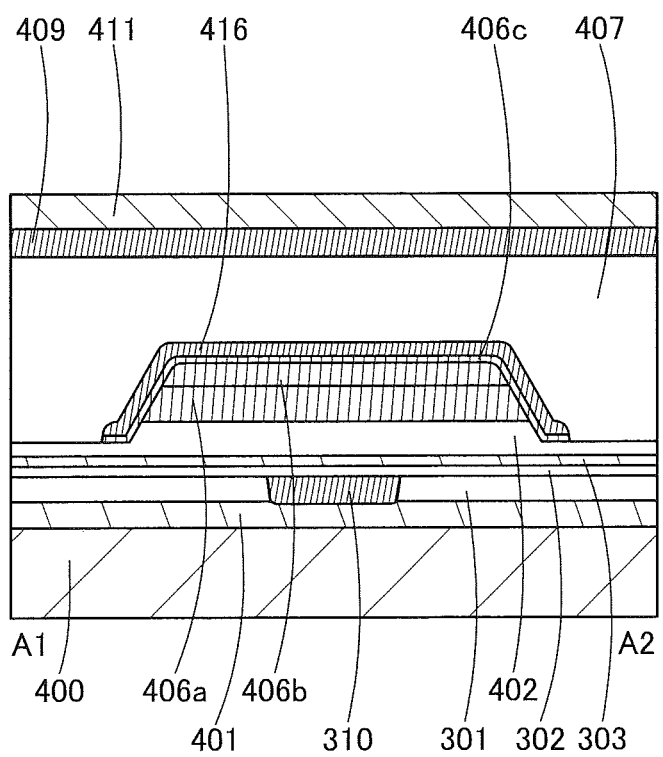
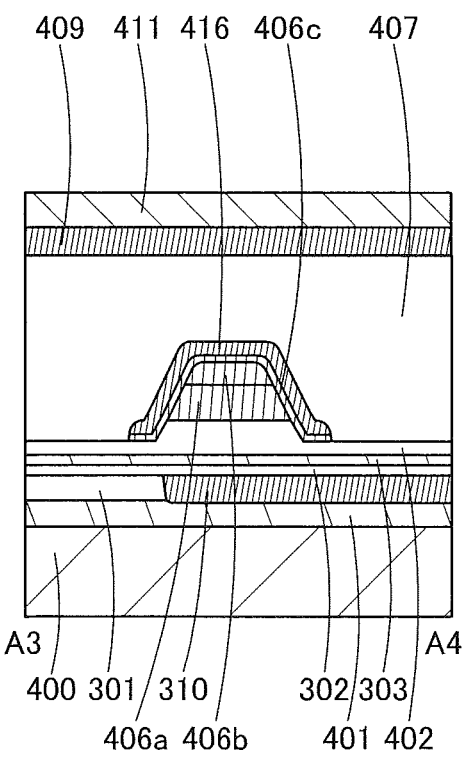

FIG. 22A
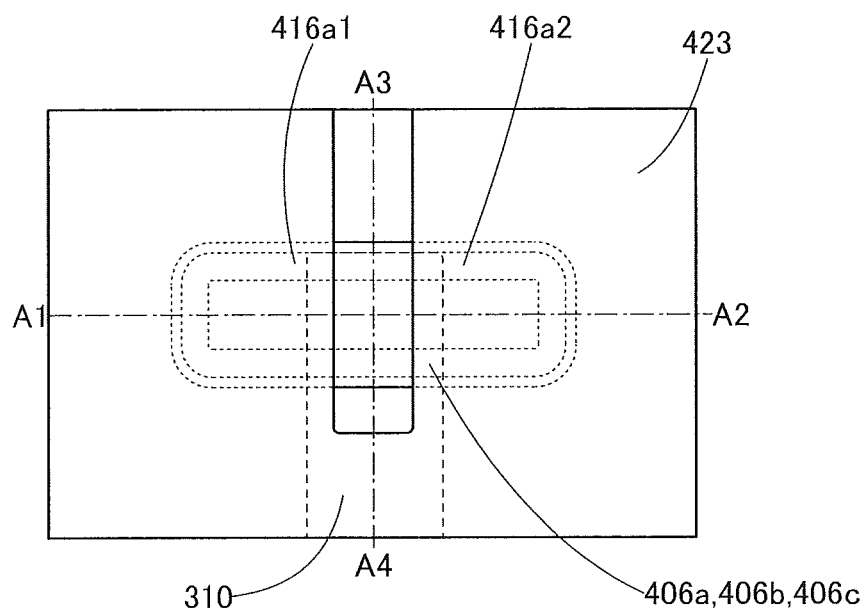
FIG. 22B
FIG. 22C
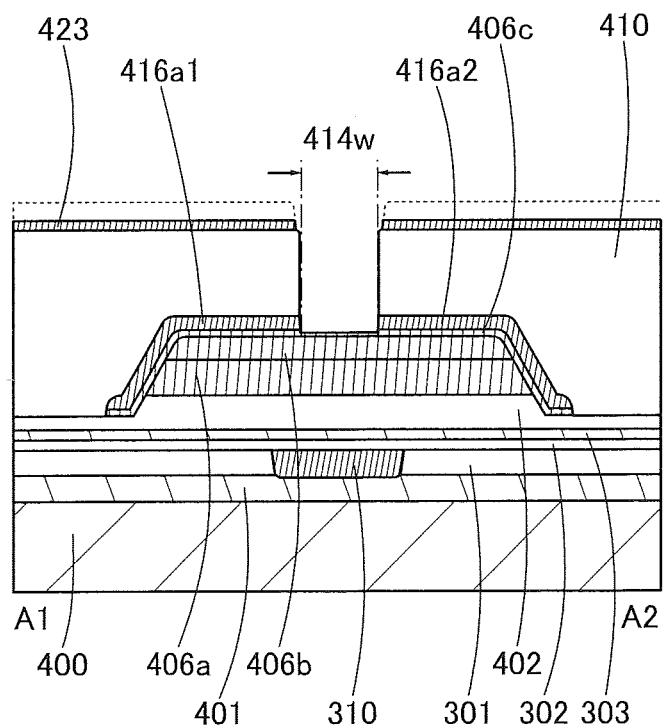
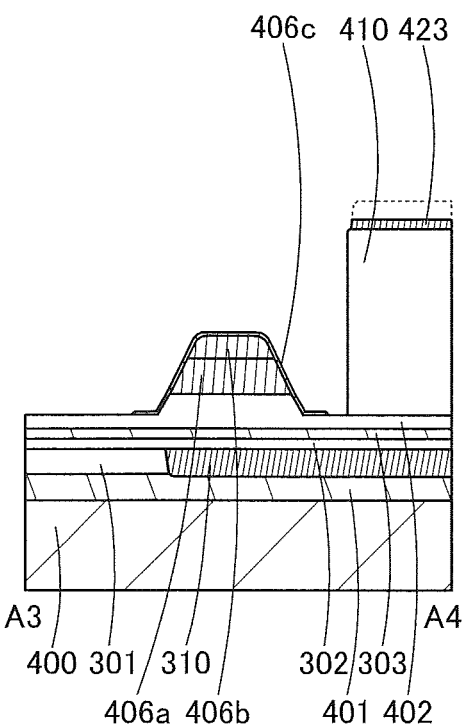

FIG. 24A
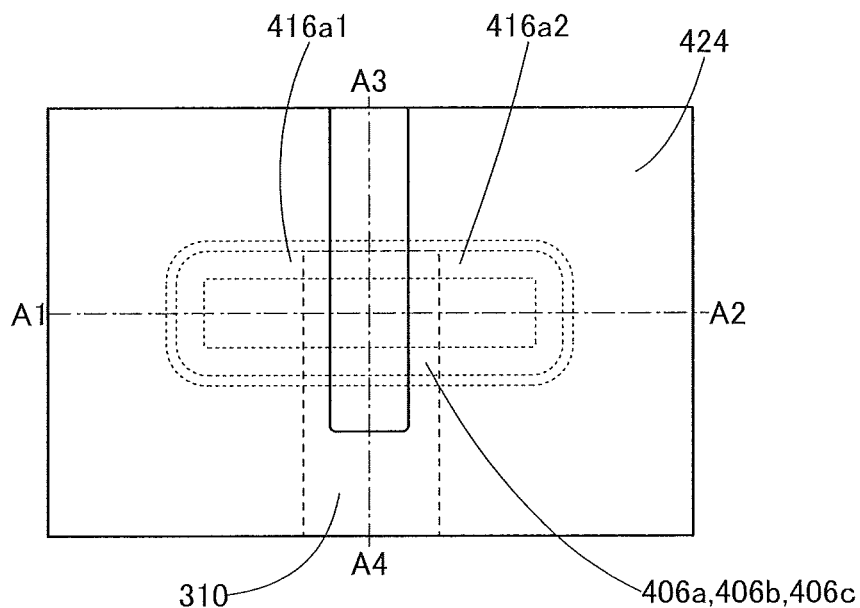
FIG. 24B
FIG. 24C
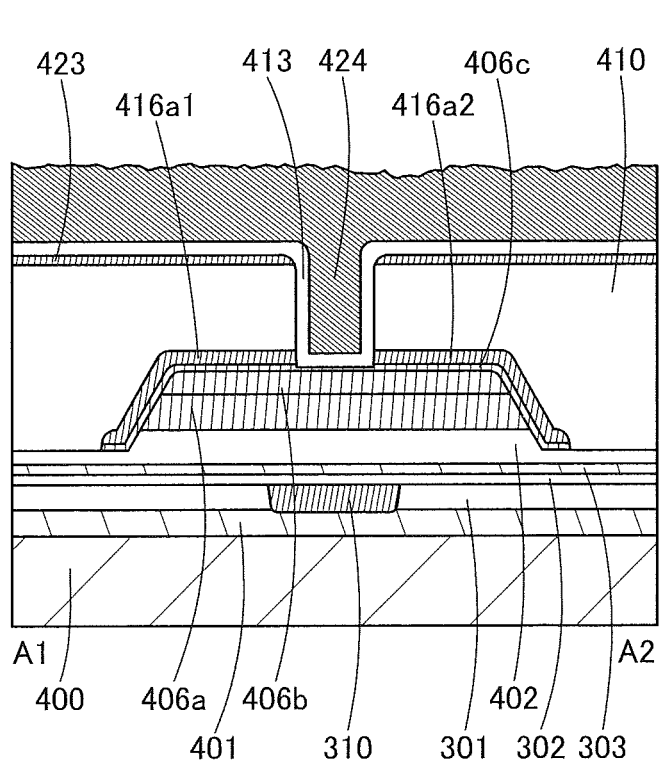
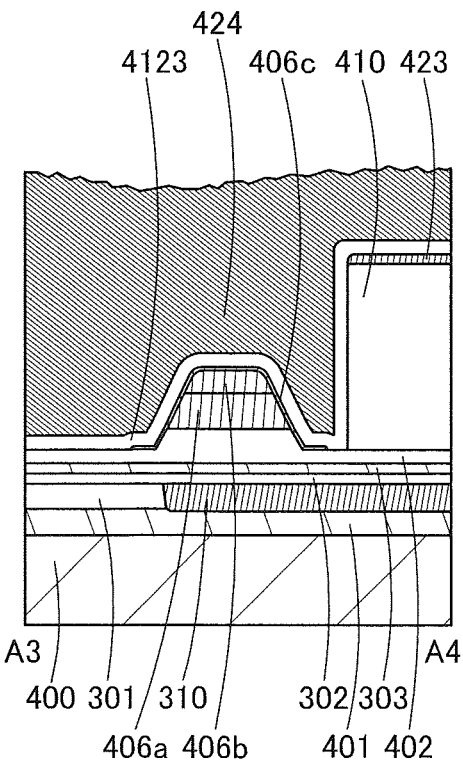

SEMICONDUCTOR DEVICE AND MANUFACTURING METHOD THEREOF

BACKGROUND OF THE INVENTION

1. Field of the Invention

The present invention relates to, for example, a transistor, a semiconductor device, and manufacturing methods thereof. The present invention relates to, for example, a display device, a light-emitting device, a lighting device, a power storage device, a memory device, a processor, and an electronic device. The present invention relates to a method for manufacturing a display device, a liquid crystal display device, a light-emitting device, a memory device, and an electronic device. The present invention relates to a driving method of a semiconductor device, a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

In recent years, a transistor including an oxide semiconductor has attracted attention. An oxide semiconductor can be formed by a sputtering method or the like, and thus can be used for a semiconductor of a transistor in a large display device. In addition, the transistor including an oxide semiconductor is advantageous in reducing capital investment because part of production equipment for a transistor including amorphous silicon can be retrofitted and utilized.

It is known that a transistor including an oxide semiconductor has an extremely low leakage current in an off state. For example, a low-power-consumption CPU utilizing a characteristic of low leakage current of the transistor including an oxide semiconductor is disclosed (see Patent Document 1).

Furthermore, a method for manufacturing a transistor including an oxide semiconductor in which a gate electrode is embedded in an opening is disclosed (see Patent Documents 2 and 3).

REFERENCE

Patent Document

[Patent Document 1] Japanese Published Patent Application No. 2012-257187
[Patent Document 2] Japanese Published Patent Application No. 2014-241407
[Patent Document 3] Japanese Published Patent Application No. 2014-240833

SUMMARY OF THE INVENTION

An object is to provide a minute transistor. Another object is to provide a transistor with low parasitic capacitance. Another object is to provide a transistor having high frequency characteristics. Another object is to provide a transistor with favorable electrical characteristics. Another object is to provide a transistor having stable electrical characteristics. Another object is to provide a transistor having low off-state current. Another object is to provide a novel transistor. Another object is to provide a semiconductor device including the transistor. Another object is to provide a semiconductor device that operates at high speed. Another object is to provide a novel semiconductor device. Another object is to provide a module including any of the above semiconductor devices. Another object is to provide an electronic device including any of the above semiconductor devices or the module.

Note that the descriptions of these objects do not disturb the existence of other objects. In one embodiment of the present invention, there is no need to achieve all the objects. Other objects are apparent from and can be derived from the description of the specification, the drawings, the claims, and the like.

(1)

One embodiment of the present invention is a semiconductor device including an oxide semiconductor, a first conductor, a second conductor, a third conductor, a first insulator, a second insulator, and a third insulator. The first conductor includes a region where the first conductor and the oxide semiconductor overlap with each other with the first insulator and the third insulator positioned therebetween. The second insulator includes an opening. The first insulator includes a region in contact with a side surface of the second insulator in the opening. The first conductor includes a region facing the side surface of the second insulator with the first insulator positioned therebetween. The oxide semiconductor includes a region where a side surface and a top surface of the oxide semiconductor are in contact with the third insulator. The third insulator includes a region where a top surface of the third insulator is in contact with the second conductor and a region where the top surface of the third insulator is in contact with the third conductor. The oxide semiconductor includes a region where an angle formed between a plane that is parallel to a bottom surface of the oxide semiconductor and the side surface of the oxide semiconductor is greater than or equal to 30° and less than or equal to 60°.

(2)

Another embodiment of the present invention is the semiconductor device according to (1), in which the second conductor includes a first conductor layer that is in contact with the second insulator and a second conductor layer that is not in contact with the second insulator, and the first conductor layer is less likely to transmit oxygen than the second conductor layer.

(3)

Another embodiment of the present invention is the semiconductor device according to (1) or (2), in which the third conductor includes a third conductor layer that is in contact with the second insulator and a fourth conductor layer that is not in contact with the second insulator, and the third conductor layer is less likely to transmit oxygen than the fourth conductor layer.

(4)

Another embodiment of the present invention is the semiconductor device according to any one of (1) to (3), in which the third insulator includes at least one of main component elements of the oxide semiconductor other than oxygen.

(5)

Another embodiment of the present invention is the semiconductor device according to any one of (1) to (4), which includes a fourth insulator, in which the fourth insulator includes a region overlapping with the oxide semiconductor, and in which the fourth insulator contains at least one of main component elements of the oxide semiconductor other than oxygen.

(6)

Another embodiment of the present invention is the semiconductor device according to any one of (1) to (5) that further includes a transistor. The first conductor includes a region functioning as a gate electrode of the transistor. A line width of a gate electrode of the transistor is greater than or equal to 3 nm and less than or equal to 60 nm.

(7)

Another embodiment of the present invention is the semiconductor device according to any one of (1) to (6), including a region where a distance between an end portion of the second conductor and an end portion of the third conductor that face each other is greater than or equal to 5 nm and less than or equal to 80 nm.

(8)

Another embodiment of the present invention is a method for manufacturing a semiconductor device including the following steps: forming a second insulator over a first insulator; forming an oxide semiconductor over the second insulator; forming a first conductor over the oxide semiconductor; forming a first resist mask over the first conductor by a lithography method; etching the first conductor using the first resist mask as an etching mask; etching the oxide semiconductor and the second insulator using the first resist mask and the first conductor as etching masks so that the oxide semiconductor and the second insulator include regions where a taper angle of the oxide semiconductor and a taper angle of the second insulator are each greater than or equal to 30° and less than or equal to 60°; removing the first resist mask and the first conductor; forming a third insulator over the first insulator, the second insulator, and the oxide semiconductor; performing treatment using plasma containing oxygen on the third insulator, so that oxygen in the plasma is added to the third insulator as excess oxygen; performing heat treatment, so that the excess oxygen in the third insulator moves to the oxide semiconductor; forming a second conductor over the third insulator; forming a second resist mask over the second conductor by a lithography method; etching the second conductor and the third insulator using the second resist mask as an etching mask; forming a fourth insulator over the first insulator and the second conductor; forming, in the fourth insulator, an opening that exposes the second conductor; forming, in the second conductor, an opening that exposes the third insulator, so that the second conductor is divided into a first conductor layer and a second conductor layer; forming a fifth insulator over the fourth insulator and the third insulator; forming a third conductor over the fifth insulator; and polishing the third conductor and the fifth insulator, so that the fourth insulator is exposed. The second insulator and the third insulator include at least one of main component elements of the oxide semiconductor other than oxygen.

Note that in the semiconductor device of one embodiment of the present invention, the oxide semiconductor may be replaced with another semiconductor.

A minute transistor can be provided. Alternatively, a transistor with low parasitic capacitance can be provided. Alternatively, a transistor having high frequency characteristics can be provided. Alternatively, a transistor with favorable electrical characteristics can be provided. Alternatively, a transistor with stable electrical characteristics can be provided. Alternatively, a transistor with low off-state current can be provided. Alternatively, a novel transistor can be provided. Alternatively, a semiconductor device including the transistor can be provided. Alternatively, a semiconductor device that can operate at high speed can be provided. Alternatively, a novel semiconductor device can be provided. A module including any of the above semiconductor devices can be provided. An electronic device including any of the above semiconductor devices or the module can be provided.

Note that the description of these effects does not disturb the existence of other effects. One embodiment of the present invention does not necessarily achieve all the effects listed above. Other effects are apparent from and can be derived from the description of the specification, the drawings, the claims, and the like.

BRIEF DESCRIPTION OF THE DRAWINGS

FIGS. 11A to 11C are a top view and cross-sectional views illustrating a method for manufacturing a transistor of one embodiment of the present invention.

FIGS. 15A to 15C are a top view and cross-sectional views illustrating a method for manufacturing a transistor of one embodiment of the present invention.

FIGS. 17A to 17C are a top view and cross-sectional views illustrating a method for manufacturing a transistor of one embodiment of the present invention.

FIGS. 22A to 22C are a top view and cross-sectional views illustrating a method for manufacturing a transistor of one embodiment of the present invention.

FIGS. 24A to 24C are a top view and cross-sectional views illustrating a method for manufacturing a transistor of one embodiment of the present invention.

DETAILED DESCRIPTION OF THE INVENTION

Figure 1A:
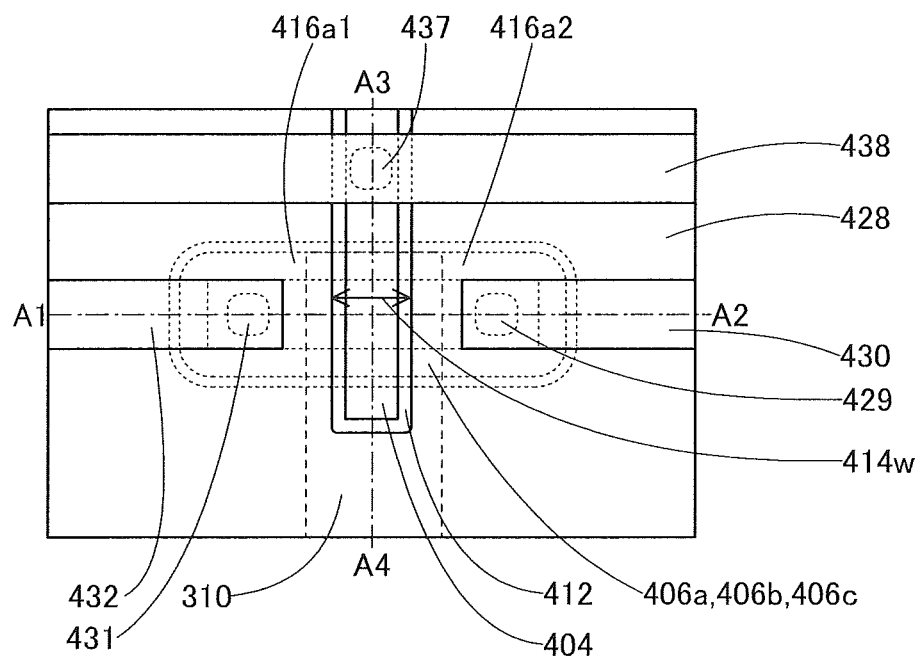
FIGS. 1A to 1C are a top view and cross-sectional views of a transistor of one embodiment of the present invention.

Hereinafter, embodiments of the present invention are described in detail with the reference to the drawings. However, the present invention is not limited to the description below, and it is easily understood by those skilled in the art that modes and details disclosed herein can be modified in various ways. Furthermore, the present invention is not construed as being limited to description of the embodiments and the examples. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or the region in drawings is sometimes exaggerated for simplicity.

In this specification, for example, when the shape of an object is described with the use of a term such as "diameter", "grain size (diameter)", "dimension", "size", or "width", the term can be regarded as the length of one side of a minimal cube where the object fits, or an equivalent circle diameter of a cross section of the object. The term "equivalent circle diameter of a cross section of the object" refers to the diameter of a perfect circle having the same area as that of the cross section of the object.

A voltage usually refers to a potential difference between a given potential and a reference potential (e.g., a ground potential (GND) or a source potential). A voltage can be referred to as a potential and vice versa.

Note that the ordinal numbers such as "first" and "second" in this specification are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those that specify one embodiment of the present invention.

Note that an impurity in a semiconductor refers to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity that changes characteristics of the semiconductor include Group 1 elements, Group 2 elements, Group 14 elements, Group 15 elements, and transition metals other than the main components;

specifically, there are hydrogen (included in water), lithium, sodium, silicon, boron, phosphorus, carbon, and nitrogen, for example. In the case of an oxide semiconductor, oxygen vacancy may be formed by entry of impurities such as hydrogen. Furthermore, in the case where the semiconductor is a silicon film, examples of an impurity that changes characteristics of the semiconductor include oxygen, Group 1 elements except hydrogen, Group 2 elements, Group 13 elements, and Group 15 elements.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel formation region formed in a side surface of a semiconductor is increased in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

Note that in this specification, the description "A has a shape such that an end portion extends beyond an end portion of B" may indicate, for example, the case where at least one of end portions of A is positioned on an outer side of at least one of end portions of B in a top view or a cross-sectional view. Thus, the description "A has a shape such that an end portion extends beyond an end portion of B" can be read as the description "one end portion of A is positioned on an outer side of one end portion of B in a top view," for example.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "substantially parallel" indicates that the angle formed between two straight lines is greater than or equal to $-30°$ and less than or equal to $30°$. The term "perpendicular" indicates that the angle formed between two straight lines is greater than or equal to $80°$ and less than or equal to $100°$, and accordingly also includes the case where the angle is greater than or equal to $85°$ and less than or equal to $95°$. In addition, the term "substantially perpendicular" indicates that the angle formed between two straight lines is greater than or equal to $60°$ and less than or equal to $120°$.

In this specification, the trigonal and rhombohedral crystal systems are included in the hexagonal crystal system.

Embodiment 1

<Transistor Structure 1>

Figures 1B, 1C:
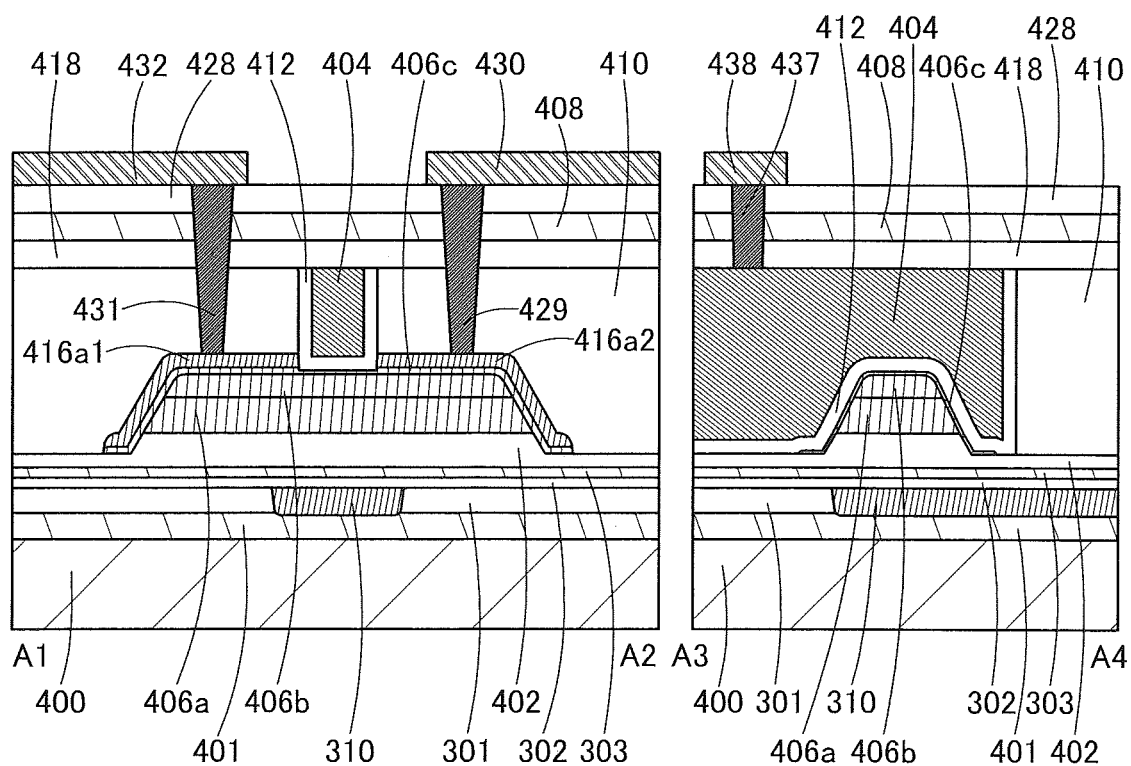

The structures of transistors included in semiconductor devices of embodiments of the present invention are described below. FIGS. 1A to 1C are a top view and cross-sectional views of the semiconductor device of one embodiment of the present invention. FIG. 1A is the top view. FIG. 11B is a cross-sectional view taken along dashed-dotted line A1-A2 illustrated in FIG. 1A. FIG. 1C is a cross-sectional view taken along dashed-dotted line A3-A4 illustrated in FIG. 1A. Note that for simplification of the drawing, some components in the top view in FIG. 1A are not illustrated.

In FIGS. 1B and 1C, a transistor includes an insulator 401 over a substrate 400; an insulator 301 and a conductor 310 over the insulator 401; an insulator 302 over the insulator 301 and the conductor 310; an insulator 303 over the insulator 302; an insulator 402 over the insulator 303; an insulator 406a over the insulator 402; a semiconductor 406b over the insulator 406a; an insulator 406c that is over the insulator 402 and is in contact with a side surface of the insulator 406a and side and top surfaces of the semiconductor 406b; conductors 416a1 and 416a2 each including a region in contact with a top surface of the insulator 406c; an insulator 410 in contact with top surfaces of the conductors 416a1 and 416a2; an insulator 412 over the insulator 406c; a conductor 404 over the semiconductor 406b with the insulator 412 and the insulator 406c positioned therebetween; an insulator 418 over the insulator 410, the conductor 404, and the insulator 412; an insulator 408 over the insulator 418; an insulator 428 over the insulator 408; an opening reaching the conductor 404 through the insulator 428, the insulator 408, and the insulator 418; an opening reaching the conductor 416a1 through the insulator 428, the insulator 408, the insulator 418, and the insulator 410; an opening reaching the conductor 416a2 through the insulator 428, the insulator 408, the insulator 418, and the insulator 410; a conductor 437, a conductor 431, and a conductor 429 that are embedded in the corresponding openings; a conductor 438 over the insulator 428, which includes a region in contact with the conductor 437; a conductor 432 over the insulator 428, which includes a region in contact with the conductor 431; and a conductor 430 over the insulator 428, which includes a region in contact with the conductor 429.

In the transistor, the conductor 404 functions as a first gate electrode. Furthermore, the conductor 404 can have a stacked structure including a conductor that has a function of inhibiting penetration of oxygen. For example, when the conductor that has a function of inhibiting penetration of oxygen is formed as a lower layer, an increase in the electric resistance value due to oxidation of the conductor 404 can be prevented. The insulator 412 functions as a gate insulator. Note that the electric resistance value of the conductor can be measured by a two-terminal method.

The conductors 416a1 and 416a2 function as a source electrode and a drain electrode. The conductors 416a1 and 416a2 each can have a stacked structure including a conductor that has a function of inhibiting penetration of oxygen. For example, when the conductor that has a function of inhibiting penetration of oxygen is formed as an upper layer, an increase in the electric resistance value due to oxidation of the conductors 416a1 and 416a2 can be prevented.

Therefore, the resistance of the semiconductor 406b can be controlled by a potential applied to the conductor 404. That is, conduction or non-conduction between the conductors 416a1 and 416a2 can be controlled by the potential applied to the conductor 404.

As illustrated in FIGS. 1B and 1C, the top and side surfaces of the semiconductor 406b include regions overlapping with the conductors 416a1 and 416a2 with the insulator 406c positioned therebetween. In addition, the insulator 406a, the semiconductor 406b, and the insulator 406c can be electrically surrounded by an electric field of the conductor 404 functioning as the gate electrode. A structure in which a semiconductor is electrically surrounded by an electric field of a gate electrode is referred to as a surrounded channel (s-channel) structure. Therefore, a channel is formed in the entire semiconductor 406b (bulk) in some cases. In the s-channel structure, a large amount of current can flow between a source and a drain of the transistor, so that an on-state current can be increased. In addition, since the insulator 406a and the semiconductor 406b are surrounded by the electric field of the conductor 404, an off-state current can be decreased.

The transistor can also be referred to as a trench-gate self-aligned (TGSA) s-channel FET because the region functioning as a gate electrode is formed in a self-aligned manner to fill the opening formed by the insulator 410 and the like.

Figure 2A:
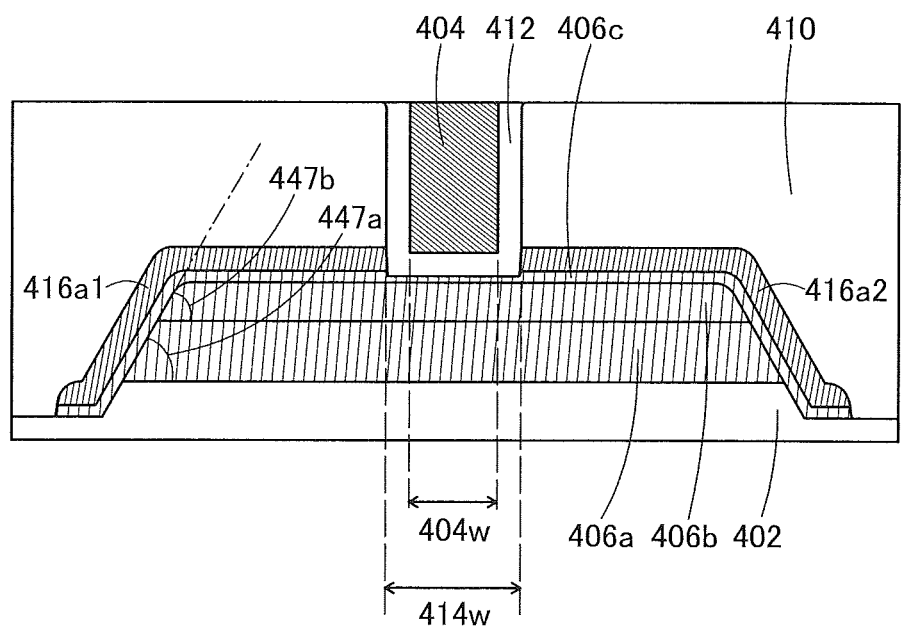
FIGS. 2A and 2B are cross-sectional views each illustrating part of a transistor of one embodiment of the present invention.
Figure 2B:
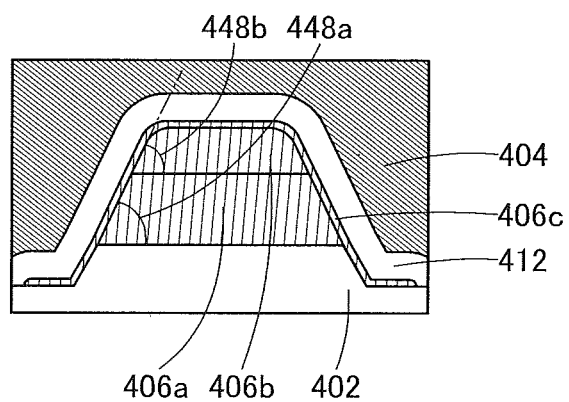

FIGS. 2A and 2B are enlarged views illustrating part of the transistor illustrated in FIGS. 1A to 1C. FIG. 2A illustrates a cross-sectional view of the transistor in the channel length direction and FIG. 2B illustrates a cross-sectional view of the transistor in the channel width direction. Note that the conductor 431 and the conductor 429 illustrated in FIG. 1A are not illustrated in FIG. 2A. In a cross section taken along the channel length direction, an angle formed between a plane parallel to a bottom surface of the insulator 406a and the side surface of the insulator 406a is a taper angle 447a. Furthermore, an angle formed between a plane parallel to a bottom surface of the semiconductor 406b and a side surface of the semiconductor 406b is a taper angle 447b (see FIG. 2A).

In a cross section taken along the channel width direction, an angle formed between the plane parallel to the bottom surface of the insulator 406a and a side surface of the insulator 406a is a taper angle 448a. Furthermore, an angle formed between the plane parallel to the bottom surface of the semiconductor 406b and a side surface of the semiconductor 406b is a taper angle 448b (see FIG. 2B).

In the cross-sectional view of the transistor in the channel length direction, the length of a bottom surface of the conductor 404 serving as a gate electrode is referred to as a gate line width 404w. Furthermore, in FIG. 1A, the top view of the transistor, a channel length is a distance between the conductors 416a1 and 416a2, which serve as the source and drain electrodes, in a region where the semiconductor 406b overlaps with the conductor 404, which serves as the gate electrode, or in a region where a channel is formed. This distance is referred to as a channel length 414w (see FIG. 1A and FIG. 2A).

In the transistor of one embodiment of the present invention, the gate line width 404w can be smaller than the width of the opening that is in the insulator 410 and reaches the insulator 406c. That is, the gate line width 404w can be smaller than the minimum feature size. Specifically, the gate line width 404w can be greater than or equal to 5 nm and less than or equal to 60 nm, preferably greater than or equal to 5 nm and less than or equal to 30 nm. Furthermore, the channel length 414w can be greater than or equal to 5 nm and less than or equal to 80 nm.

When the taper angles 447a, 447b, 448a, and 448b are each smaller than or equal to 80°, preferably smaller than or equal to 60°, the coverage by the insulator 406c and the insulator 412, which serves as the gate insulator, that are formed over the side surface of the insulator 406a and the side and top surfaces of the semiconductor 406b is improved. When the coverage by the insulator 406c and the insulator 412 is improved, leakage current flowing through the conductor 404 serving as the gate electrode and the conductor 416a1 or 416a2 serving as the source electrode or the drain electrode can be kept low. Alternatively, leakage current flowing through the conductor 404 serving as the gate electrode and the semiconductor 406b having a channel formation region can be kept low.

The taper angles 447a, 447b, 448a, and 448b are each greater than or equal to 20° and smaller than or equal to 80°, preferably greater than or equal to 30° and smaller than or equal to 60°.

When the thickness of the insulator 412 in a region between the conductors 416a1 and 416a2 is smaller than that of the conductor 416a1 or 416a2 in FIG. 2A, an electric field from the gate electrode is applied to the entire channel formation region, making the operation of the transistor favorable. The thickness of the insulator 412 in the region between the conductors 416a1 and 416a2 is smaller than or equal to 30 nm, preferably smaller than or equal to 10 nm.

The conductor 310 functions as a second gate electrode. The conductor 310 can be a multilayer film including a conductor that has a function of inhibiting penetration of oxygen. The use of the multilayer film including a conductor that has a function of inhibiting penetration of oxygen can prevent a decrease in conductivity due to oxidation of the conductor 310. The insulator 302, the insulator 303, and the insulator 402 function as a second gate insulating film. The potential applied to the conductor 310 can control the threshold voltage of the transistor. Furthermore, the potential applied to the conductor 310 can inject electrons to the insulator 303 and control the threshold voltage of the transistor. When the first gate electrode is electrically connected to the second gate electrode, the current in a conducting state (on-state current) can be increased. Note that the function of the first gate electrode and that of the second gate electrode may be interchanged.

Figure 5:
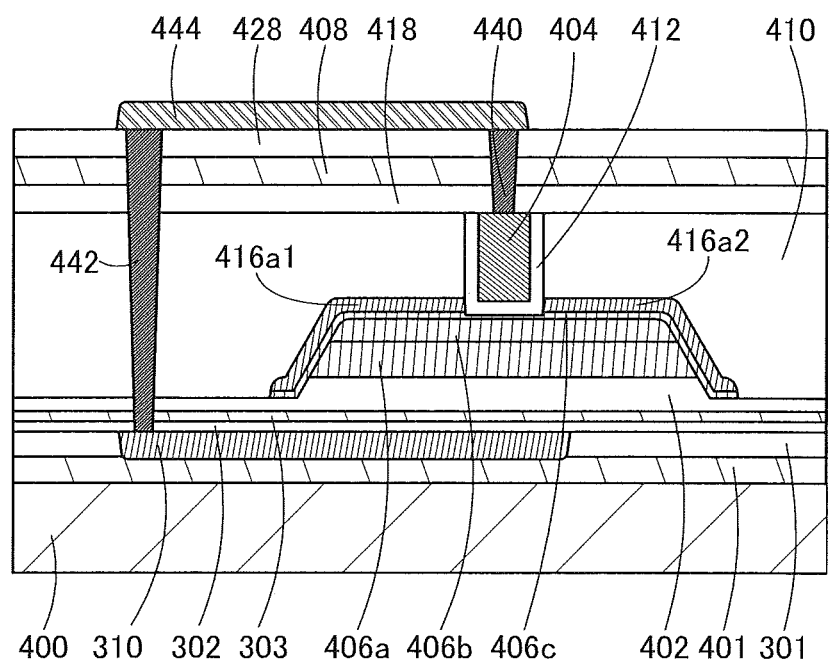
FIG. 5 is a cross-sectional view of a transistor of one embodiment of the present invention.

FIG. 5 illustrates an example in which the first gate electrode and the second gate electrode are electrically connected. In an opening reaching the conductor 404 through the insulator 428, the insulator 408, and the insulator 418, a conductor 440 is embedded, and a top surface of the conductor 440 is electrically connected to a conductor 444 formed over the insulator 428. In an opening reaching the conductor 310 through the insulators 428, 408, 418, 410, 402, 303, and 302, a conductor 442 is embedded, and a top surface of the conductor 442 is electrically connected to the conductor 444. That is, the conductor 404 functioning as the first gate electrode is electrically connected to the conductor 310 functioning as the second gate electrode through the conductors 440, 444, and 442.

The transistor is surrounded by an insulator having a function of blocking oxygen and impurities such as hydrogen, so that the electronic characteristics of the transistor can be stable. For example, as the insulator 408, an insulator that has a function of blocking oxygen and impurities such as hydrogen may be used.

An insulator with a function of blocking oxygen and impurities such as hydrogen may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used.

Furthermore, for example, the insulator 408 may be formed of aluminum oxide, magnesium oxide, silicon nitride oxide, silicon nitride, gallium oxide, germanium oxide, yttrium oxide, zirconium oxide, lanthanum oxide, neodymium oxide, hafnium oxide, or tantalum oxide. Note that the insulator 408 preferably contains aluminum oxide. For example, when the insulator 408 is formed by plasma including oxygen, oxygen can be added to the insulator 410 through the insulator 418 functioning as a base layer of the insulator 408. Furthermore, oxygen can also be added to the side surface of the insulator 412. The added oxygen becomes excess oxygen in the insulator 410 or the insulator 412. When the insulator 408 contains aluminum oxide, entry of impurities such as hydrogen into the semiconductor 406b can be inhibited. For another example, when the insulator 408 contains aluminum oxide, outward diffusion of the excess oxygen added to the insulators 410 and 412 can be reduced.

The insulator 401 may be formed using, for example, aluminum oxide, magnesium oxide, silicon nitride oxide, silicon nitride, gallium oxide, germanium oxide, yttrium oxide, zirconium oxide, lanthanum oxide, neodymium oxide, hafnium oxide, or tantalum oxide. Note that the insulator 401 preferably includes aluminum oxide or silicon nitride. For example, the insulator 401 containing aluminum oxide or silicon nitride can reduce entry of impurities such as hydrogen into the semiconductor 406b. For another example, the insulator 401 containing aluminum oxide or silicon nitride can reduce outward diffusion of oxygen.

The insulators 301 and 302 may each be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 301 and the insulator 302 preferably contain silicon oxide or silicon oxynitride.

The insulator 303 may function as, for example, an electron-injection layer. The insulator 303 may each be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 303 preferably contains silicon nitride, hafnium oxide, or aluminum oxide.

The insulator 402 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 402 preferably contains silicon oxide or silicon oxynitride.

Note that the insulator 410 preferably includes an insulator with low dielectric constant. For example, the insulator 410 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 410 preferably has a stacked structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and low dielectric constant. Examples of the resin include polyester, polyolefin, polyamide (e.g., nylon or aramid), polyimide, polycarbonate, and acrylic.

The insulator 412 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 412 preferably includes silicon oxide or silicon oxynitride.

Note that the insulator 412 preferably contains an insulator with a high dielectric constant. For example, the insulator 412 preferably includes gallium oxide, hafnium oxide, oxide including aluminum and hafnium, oxynitride including aluminum and hafnium, oxide including silicon and hafnium, oxynitride including silicon and hafnium, or the like. The insulator 412 preferably has a stacked-layer structure including silicon oxide or silicon oxynitride and an insulator with a high dielectric constant. Because silicon oxide and silicon oxynitride have thermal stability, combination of silicon oxide or silicon oxynitride with an insulator with a high dielectric constant allows the stacked-layer structure to be thermally stable and have a high dielectric constant. For example, when aluminum oxide, gallium oxide, or hafnium oxide is on the insulator 406c side, entry of silicon included in the silicon oxide or the silicon oxynitride into the semiconductor 406b can be suppressed. When silicon oxide or silicon oxynitride is on the insulator 406c side, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

The insulators 412 and 428 may each be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 301 preferably contains silicon oxide or silicon oxynitride.

Each of the conductors 416a1 and 416a2 may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, platinum, silver, indium, tin, tantalum, and tungsten. Alternatively, an alloy film or a compound film may be used, and a conductor containing aluminum, a conductor containing copper and titanium, a conductor containing copper and manganese, a conductor containing indium, tin, and oxygen, a conductor containing titanium and nitrogen, or the like may be used.

The conductor 404 may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. Alternatively, an alloy film or a compound film may be used, and a conductor containing aluminum, a conductor containing copper and titanium, a conductor containing copper and manganese, a conductor containing indium, tin, and oxygen, a conductor containing titanium and nitrogen, or the like may be used.

Each of the conductors 429, 430, 431, 432, 437, and 438 may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. Alternatively, an alloy film or a compound film may be used, and a conductor containing aluminum, a conductor containing copper and titanium, a conductor containing copper and manganese, a conductor containing indium, tin, and oxygen, a conductor containing titanium and nitrogen, or the like may be used.

Each of the conductors 310, 440, 442, and 444 may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. For example, an alloy film or a compound film may be used: a conductor containing aluminum, a conductor containing copper and titanium, a conductor containing copper and manganese, a conductor containing indium, tin, and oxygen, a conductor containing titanium and nitrogen, or the like may be used.

As the semiconductor 406b, an oxide semiconductor is preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

The insulators 406a and 406c are desirably oxides including one or more, or two or more elements other than oxygen included in the semiconductor 406b. However, silicon (including strained silicon), germanium, silicon germanium, silicon carbide, gallium arsenide, aluminum gallium arsenide, indium phosphide, gallium nitride, an organic semiconductor, or the like can be used in some cases.

<Transistor Structure 2>

Figure 3A:
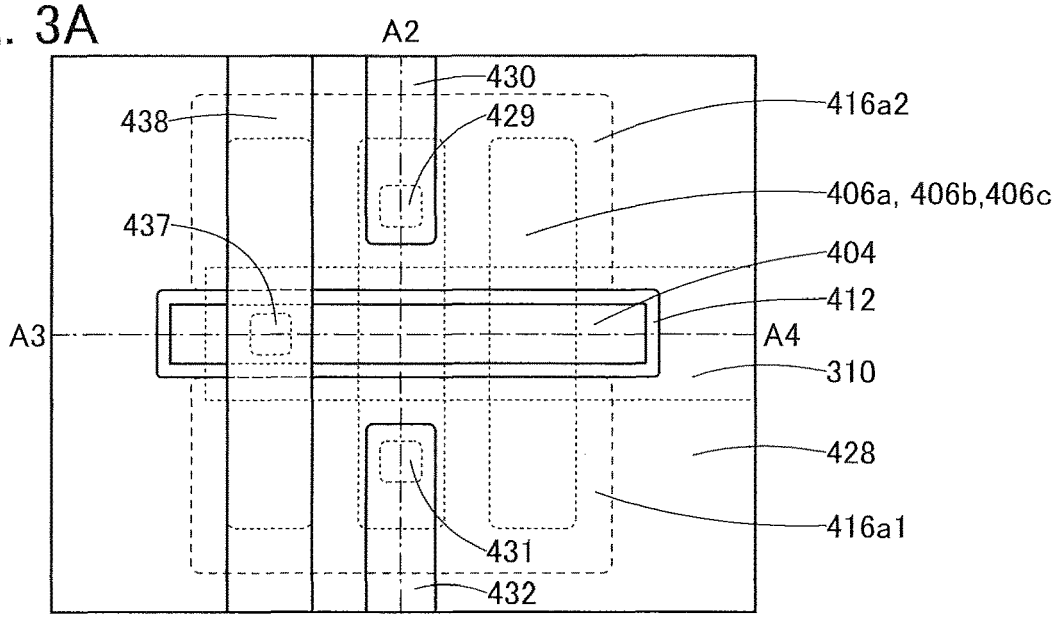
FIGS. 3A to 3C are a top view and cross-sectional views of a transistor of one embodiment of the present invention.
Figure 3B:
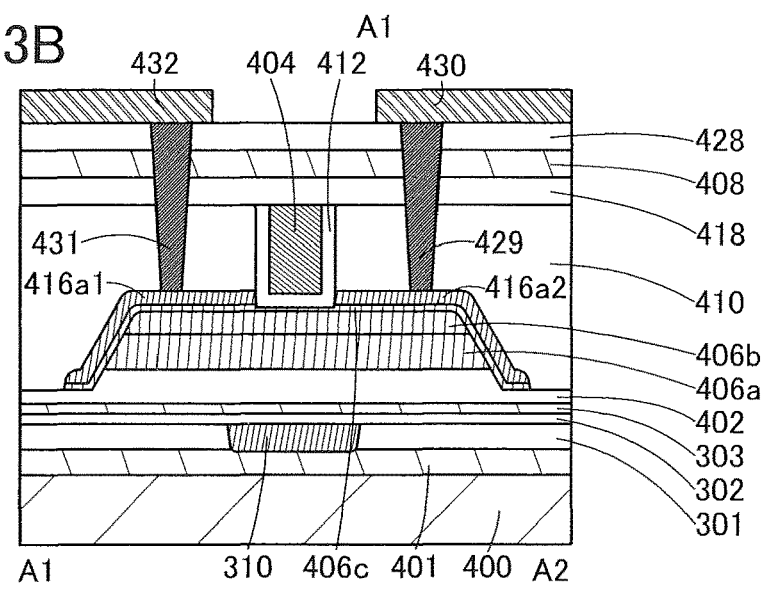
Figure 3C:
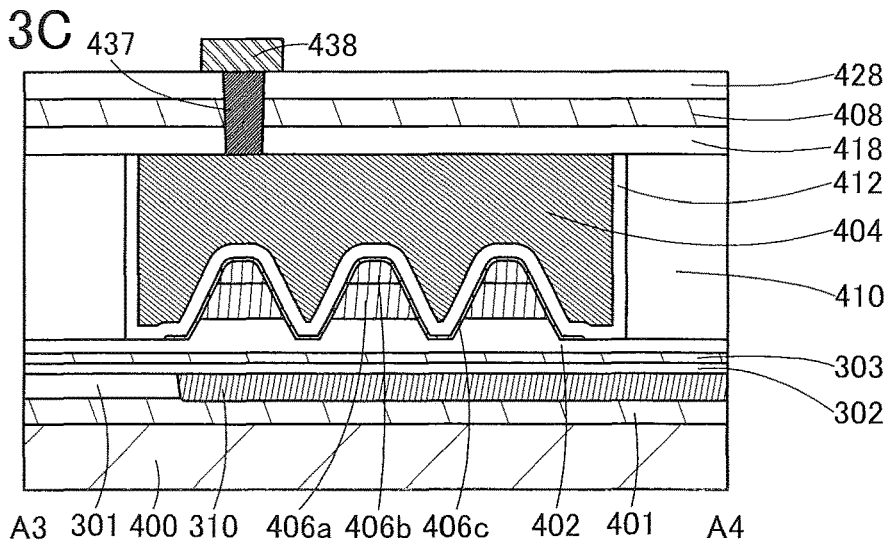

Here, a transistor having a structure different from that in FIGS. 1A to 1C is described with reference to FIGS. 3A to 3C. FIGS. 3A to 3C are a top view and cross-sectional views of the semiconductor device of one embodiment of the present invention. FIG. 3A is a top view thereof. FIG. 3B is a cross-sectional view taken along dashed-dotted line A1-A2 illustrated in FIG. 3A. FIG. 3C is a cross-sectional view taken along dashed-dotted line A3-A4 illustrated in FIG. 3A. Note that for simplification of the drawing, some components in the top view in FIG. 3A are not illustrated.

This transistor is different from the transistor in FIGS. 1A to 1C in that the transistor has a plurality of channel formation regions for one gate electrode. Although the transistor in FIGS. 3A to 3C includes three channel formation regions, the number of the channel formation regions is not limited to three. For other components, refer to the components of the transistor illustrated in FIGS. 1A to 1C.

<Transistor Structure 3>

Figure 4A:
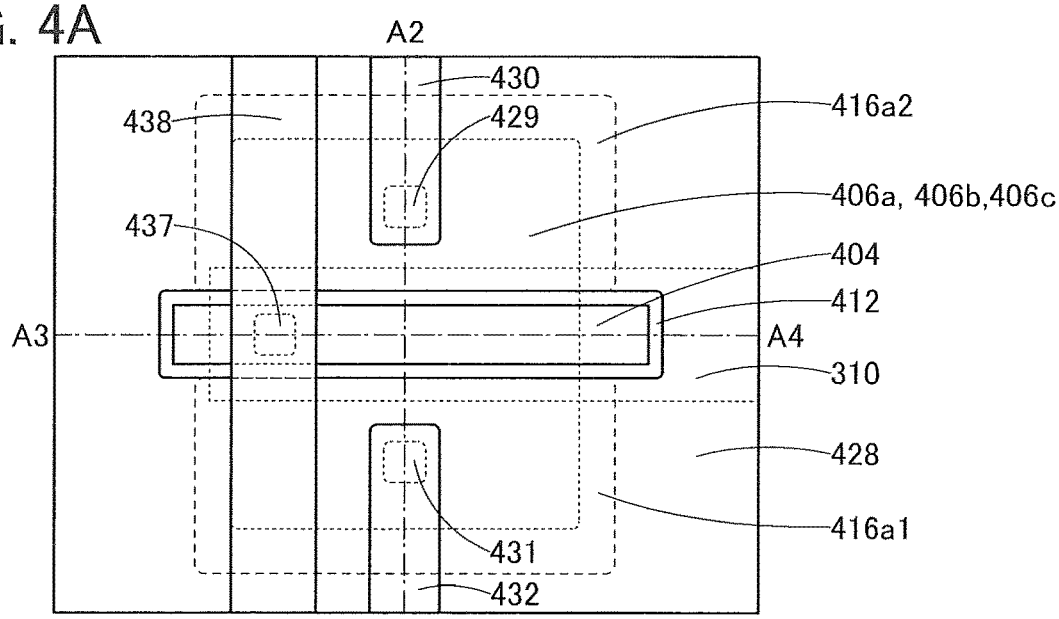
FIGS. 4A to 4C are a top view and cross-sectional views of a transistor of one embodiment of the present invention.
Figure 4B:
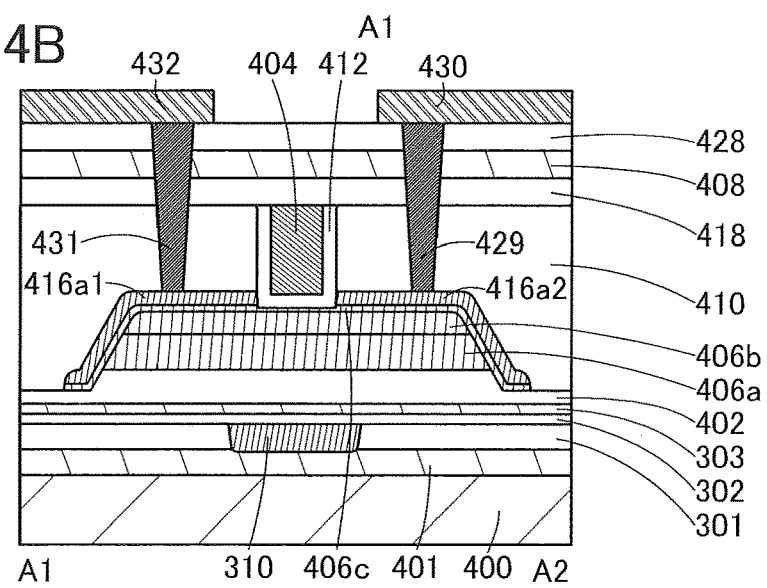
Figure 4C:
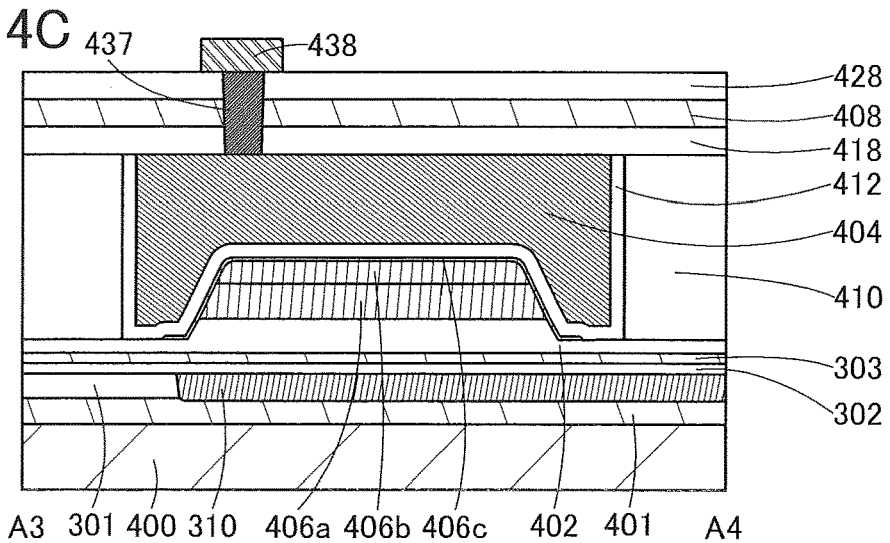

A transistor having a structure different from that in FIGS. 1A to 1C is described with reference to FIGS. 4A to 4C. FIGS. 4A to 4C are a top view and cross-sectional views of the semiconductor device of one embodiment of the present invention. FIG. 4A is the top view. FIG. 4B is a cross-sectional view taken along dashed-dotted line A1-A2 illustrated in FIG. 4A. FIG. 4C is a cross-sectional view taken along dashed-dotted line A3-A4 illustrated in FIG. 4A. Note that for simplification of the drawing, some components in the top view in FIG. 4A are not illustrated.

This transistor has a channel width that is twice or more as large as the gate line width 404w in FIG. 2A. For other components, refer to the components of the transistor illustrated in FIGS. 1A to 1C.

At least part of this embodiment can be implemented in combination with any of the embodiments described in this specification as appropriate.

Embodiment 2

<Structure of Oxide Semiconductor>

The structure of an oxide semiconductor is described below.

An oxide semiconductor is classified into a single crystal oxide semiconductor and a non-single-crystal oxide semiconductor. Examples of the non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of the crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 6A:
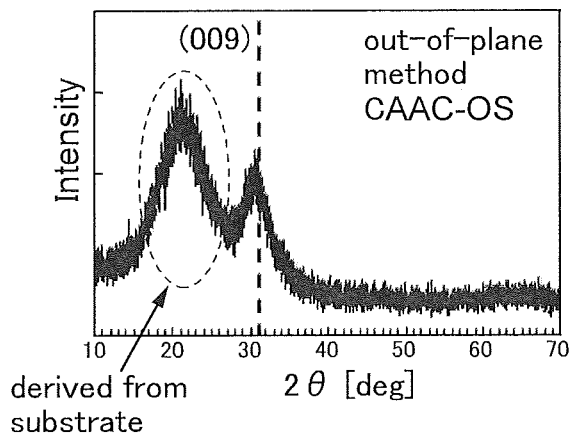
FIGS. 6A to 6E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle ($2\theta$) of around 31° as shown in FIG. 6A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a $2\theta$ of around 36° in addition to the peak at a $2\theta$ of around 31°. The peak at a $2\theta$ of around 36° is derived from a crystal structure classified into the space group Fd-3m. Therefore, it is preferable that the CAAC-OS do not show the peak.

Figure 6B:
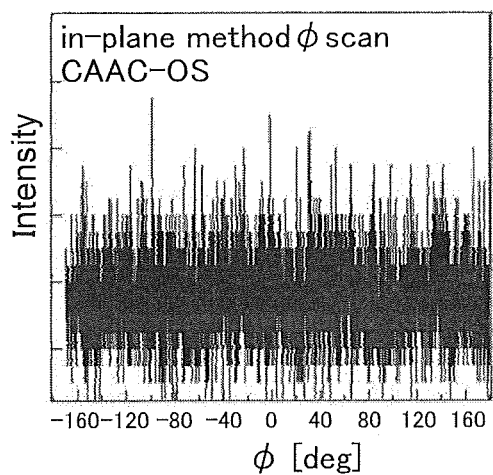
Figure 6C:
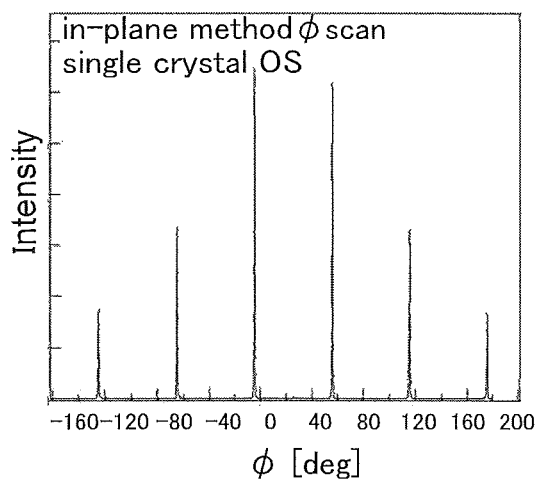

On the other hand, in structural analysis of the CAAC-OS by an in-plane method in which an X-ray is incident on the CAAC-OS in a direction parallel to the formation surface, a peak appears at a $2\theta$ of around 56°. This peak is derived from the (110) plane of the $InGaZnO_4$ crystal. When analysis ($\phi$ scan) is performed with $2\theta$ fixed at around 56° and with the sample rotated using a normal vector to the sample surface as an axis ($\phi$ axis), as shown in FIG. 6B, a peak is not clearly observed. In contrast, in the case where single crystal $InGaZnO_4$ is subjected to $\phi$ scan with $2\theta$ fixed at around 56°, as shown in FIG. 6C, six peaks that are derived from crystal planes equivalent to the (110) plane are observed. Accordingly, the structural analysis using XRD shows that the directions of a-axes and b-axes are irregularly orientated in the CAAC-OS.

Figure 6D:
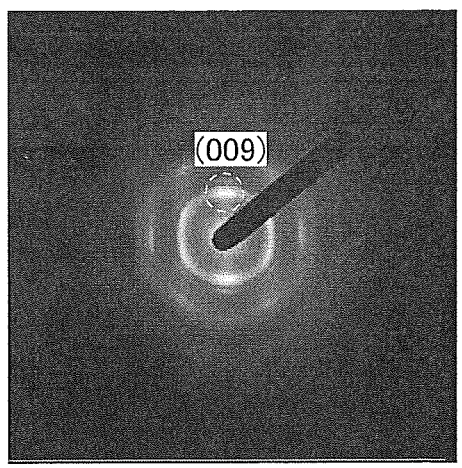
Figure 6E:
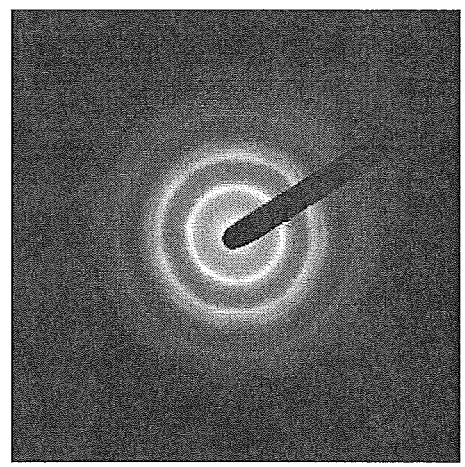

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 6D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 6E shows a diffraction pattern obtained in such a manner that an electron beam with a probe diameter of 300 nm is incident on the same sample in a direction perpendicular to the sample surface. As shown in FIG. 6E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 6E is considered to be derived from the (010) plane, the (100) plane, and the like of the $InGaZnO_4$ crystal. The second ring in FIG. 6E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 7A:
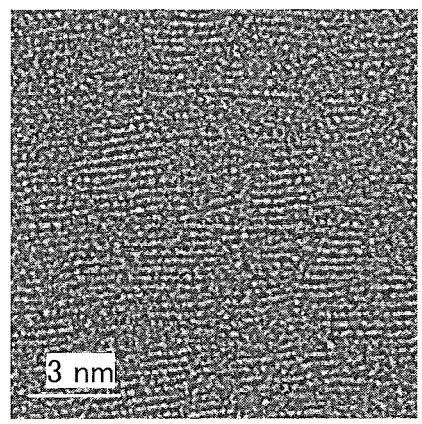
FIGS. 7A to 7E show a cross-sectional IBM image and plan-view TEM images of a CAAC-OS and images obtained through analysis thereof.

FIG. 7A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 7A shows pellets in which metal atoms are arranged in a layered manner. FIG. 7A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 7B:
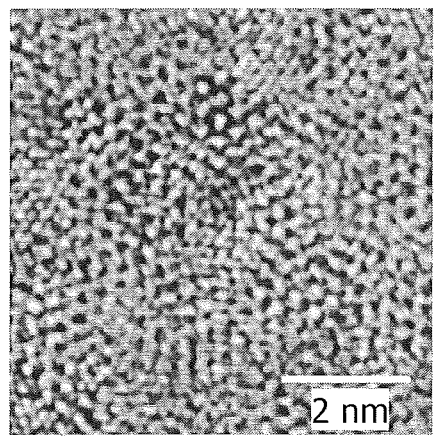
Figure 7C:
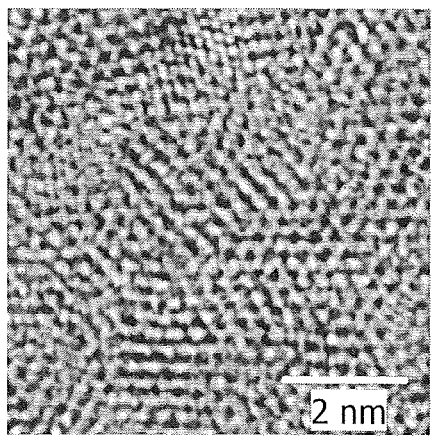
Figure 7D:
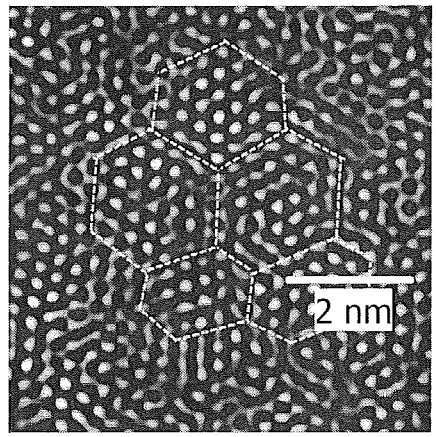
Figure 7E:
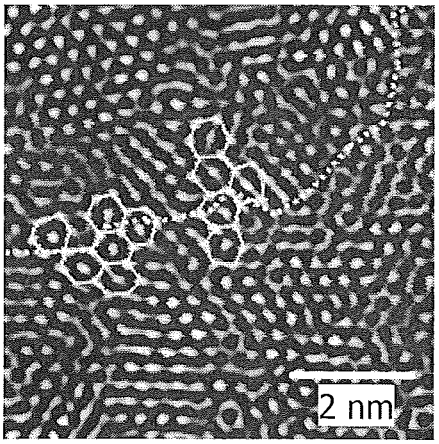

FIGS. 7B and 7C show Cs-corrected high-resolution TEM images of a plane of the CAAC-OS observed from a direction substantially perpendicular to the sample surface. FIGS. 7D and 7E are images obtained through image processing of FIGS. 7B and 7C. The method of image processing is as follows. The image in FIG. 7B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 7D, a portion where a lattice arrangement is broken is shown by a dashed lines. A region surrounded by a dashed line is one pellet. The portion shown by the dashed line is a junction of pellets. The dashed line draws a hexagon, which means that the pellet has a hexagonal shape. Note that the shape of the pellet is not always a regular hexagon but is a non-regular hexagon in many cases.

In FIG. 7E, a dotted line denotes a portion between a region where a lattice arrangement is well aligned and another region where a lattice arrangement is well aligned. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be faulted, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, for example, a peak indicating orientation does not appear. That is, a crystal of an nc-OS does not have orientation.

Figure 8A:
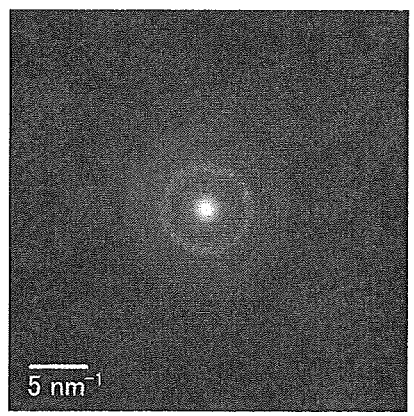
FIGS. 8A to 8D show electron diffraction patterns and a cross-sectional TEM image of an nc-OS.
Figure 8B:
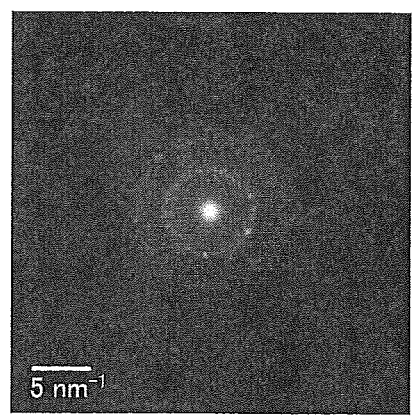

For example, when an electron beam with a probe diameter of 50 nm is incident on a 34-nm-thick region of a thinned nc-OS including an $InGaZnO_4$ crystal in a direction parallel to the formation surface, a ring-shaped diffraction pattern (nanobeam electron diffraction pattern) shown in FIG. 8A is observed. FIG. 8B shows a diffraction pattern obtained when an electron beam with a probe diameter of 1 nm is incident on the same sample. As shown in FIG. 8B, a plurality of spots are observed in a ring-like region. In other words, ordering in an nc-OS is not observed with an electron beam with a probe diameter of 50 nm but is observed with an electron beam with a probe diameter of 1 nm.

Figure 8C:
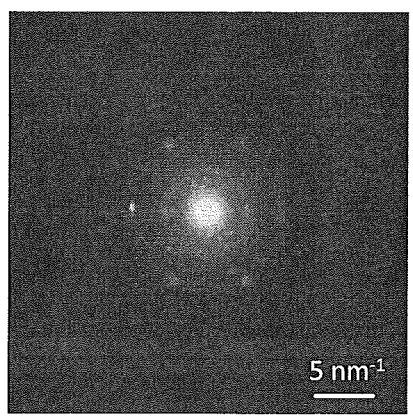

Furthermore, an electron diffraction pattern in which spots are arranged in an approximately hexagonal shape is observed in some cases as shown in FIG. 8C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 8D:
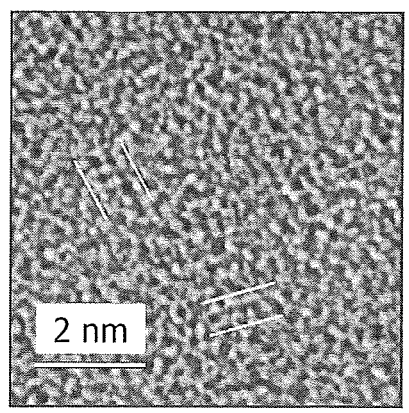

FIG. 8D shows a Cs-corrected high-resolution TEM image of a cross section of an nc-OS observed from the direction substantially parallel to the formation surface. In a high-resolution TEM image, an nc-OS has a region in which a crystal part is observed, such as a part indicated by additional lines in FIG. 8D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS might be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Thus, the nc-OS has a lower density of defect states than the a-like OS and the amorphous oxide semiconductor. Note that there is no regularity of crystal orientation between different pellets in the nc-OS; thus, the nc-OS has a higher density of defect states than the CAAC-OS.

<a-Like OS>

An a-like OS is an oxide semiconductor having a structure between the nc-OS and the amorphous oxide semiconductor.

Figure 9A:
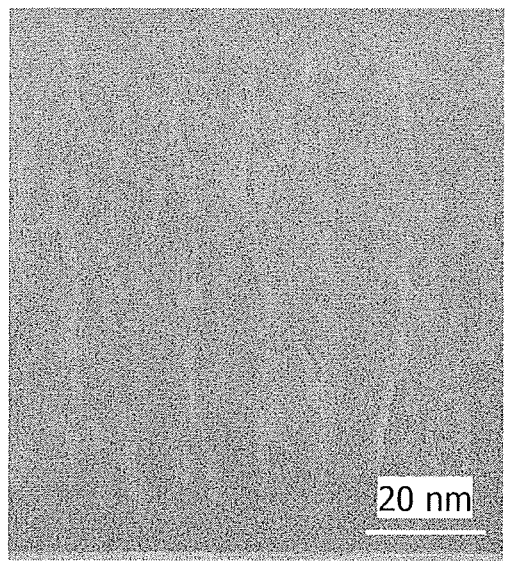
FIGS. 9A and 9B are cross-sectional TEM images of an a-like OS.
Figure 9B:
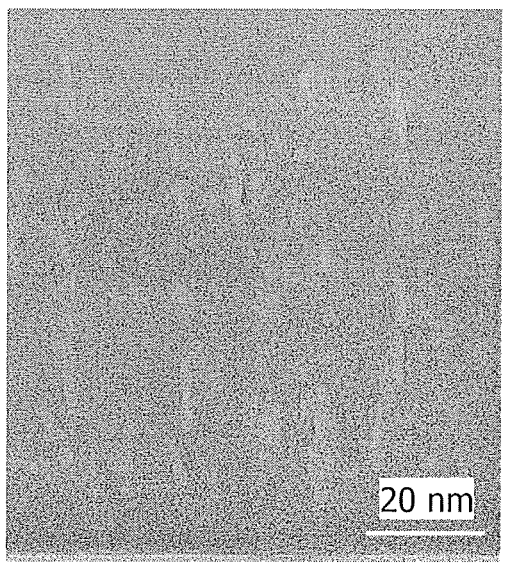

FIGS. 9A and 9B are high-resolution cross-sectional TEM images of an a-like OS. FIG. 9A is the high-resolution cross-sectional TEM image of the a-like OS at the start of electron irradiation. FIG. 9B is the high-resolution cross-sectional TEM image of a-like OS after electron ($e^-$) irradiation at $4.3\times10^8$ $e^-/nm^2$. FIGS. 9A and 9B show that stripe-like bright regions extending vertically are observed in the a-like OS from the start of electron irradiation. It can be also found that the shape of the bright region changes after electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of the $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as a d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 10:
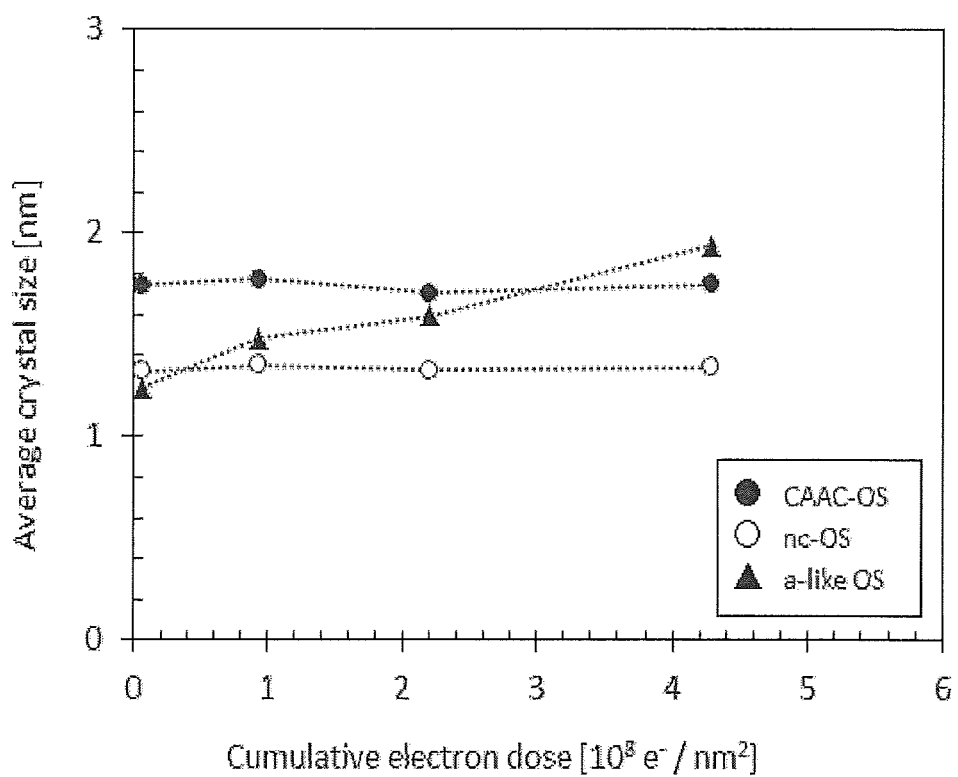
FIG. 10 shows a change in the crystal part of an In—Ga—Zn oxide induced by electron irradiation.

FIG. 10 shows a change in the average size of crystal parts (at 22 to 30 points) in each sample. Note that the crystal part size corresponds to the length of the lattice fringe. FIG. 10 indicates that the crystal part size in the a-like OS increases with an increase in the cumulative electron dose in obtaining TEM images, for example. As shown in FIG. 10, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part sizes in the nc-OS and the CAAC-OS show little change from the start of electron irradiation to a cumulative electron dose of $4.2 \times 10^8$ $e^-/nm^2$. As shown in FIG. 10, the crystal part sizes in the nc-OS and the CAAC-OS are approximately 1.3 nm and approximately 1.8 nm, respectively, regardless of the cumulative electron dose. For electron beam irradiation and TEM observation, a Hitachi H-9000NAR transmission electron microscope was used. The conditions of electron beam irradiation were as follows: accelerating voltage was 300 kV; current density was $6.7 \times 10^5$ $e^-/(nm^2 \cdot s)$; and the diameter of an irradiation region was 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in the case of an oxide semiconductor with an atomic ratio of In:Ga:Zn=1:1:1, the density of single-crystal $InGaZnO_4$ with a rhombohedral crystal structure is 6.357 $g/cm^3$. Thus, for example, in the case of the oxide semiconductor with an atomic ratio of In:Ga:Zn=1:1:1, the density of an a-like OS is higher than or equal to 5.0 $g/cm^3$ and lower than 5.9 $g/cm^3$. In addition, for example, in the case of the oxide semiconductor with an atomic ratio of In:Ga:Zn=1:1:1, the density of an nc-OS or a CAAC-OS is higher than or equal to 5.9 $g/cm^3$ and lower than 6.3 $g/cm^3$.

Note that in the case where single crystals with the same composition do not exist, by combining single crystals with different compositions at a given proportion, it is possible to estimate density that corresponds to the density of a single crystal with a desired composition. The density of the single crystal with a desired composition may be estimated using weighted average with respect to the combination ratio of the single crystals with different compositions. Note that it is preferable to combine as few kinds of single crystals as possible for density estimation.

As described above, oxide semiconductors have various structures and various properties. An oxide semiconductor may be a stacked film including two or more of an amorphous oxide semiconductor, an a-like OS, an nc-OS, and a CAAC-OS, for example.

An oxide that can be used as the insulator 406a, the semiconductor 406b, the insulator 406c, or the like is described.

The semiconductor 406b is an oxide semiconductor containing indium, for example. The oxide semiconductor 406b can have high carrier mobility (electron mobility) by containing indium, for example. The semiconductor 406b preferably contains an element M. The element M is preferably aluminum, gallium, tin, or the like. Other elements that can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 406b preferably contains zinc. When the oxide semiconductor contains zinc, the oxide semiconductor is easily crystallized, in some cases.

Note that the semiconductor 406b is not limited to the oxide semiconductor containing indium. The semiconductor 406b may be, for example, an oxide semiconductor that does not contain indium and contains zinc, an oxide semiconductor that does not contain indium and contains gallium, or an oxide semiconductor that does not contain indium and contains tin, e.g., a zinc tin oxide, a gallium tin oxide, or a gallium oxide.

For the semiconductor 406b, an oxide with a wide energy gap may be used, for example. For example, the energy gap of the semiconductor 406b is greater than or equal to 2.5 eV and less than or equal to 4.2 eV, preferably greater than or equal to 2.8 eV and less than or equal to 3.8 eV, and further preferably greater than or equal to 3 eV and less than or equal to 3.5 eV.

For example, the insulators 406a and 406c are oxides including one or more, or two or more elements other than oxygen included in the semiconductor 406b. Since the insulators 406a and 406c each include one or more, or two or more elements other than oxygen included in the semiconductor 406b, an interface state is less likely to be formed at the interface between the insulator 406a and the semiconductor 406b and the interface between the semiconductor 406b and the insulator 406c.

The case where the insulator 406a, the semiconductor 406b, and the insulator 406c contain indium is described. In the case of using an In-M-Zn oxide as the insulator 406a, when a summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor 406b, when the summation of In and M is assumed to be 100 atomic %, the proportions of In and Mare preferably set to be greater than 25 atomic % and less than 75 atomic %, respectively, further preferably greater than 34 atomic % and less than 66 atomic %, respectively. In the case of using an In-M-Zn oxide as the insulator 406c, when the summation of In and M is assumed to be 100 atomic %, the proportions of In and Mare preferably set to be less than 50 atomic % and greater than 50 atomic %, respectively, further preferably less than 25 atomic % and greater than 75 atomic %, respectively. Note that the insulator 406c may be an oxide that is a type the same as that of the insulator 406a.

As the semiconductor 406b, an oxide having an electron affinity higher than those of the insulators 406a and 406c is used. For example, as the semiconductor 406b, an oxide having an electron affinity higher than those of the insulators 406a and 406c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy gap between the vacuum level and the bottom of the conduction band.

An indium gallium oxide has a small electron affinity and a high oxygen-blocking property. Therefore, the insulator 406c preferably includes an indium gallium oxide. The gallium atomic ratio [Ga/(In+Ga)] is, for example, higher than or equal to 70%, preferably higher than or equal to 80%, further preferably higher than or equal to 90%.

Note that the insulator 406a and/or the insulator 406c may be gallium oxide. For example, when gallium oxide is used as the insulator 406c, leakage current between the conductor 404 and the conductor 416a1 or the conductor 416a2 can be reduced. In other words, the off-state current of the transistor can be reduced.

At this time, when a gate voltage is applied, a channel is formed in the semiconductor 406b having the highest electron affinity in the insulator 406a, the semiconductor 406b, and the insulator 406c.

Here, in some cases, there is a mixed region of the insulator 406a and the semiconductor 406b between the insulator 406a and the semiconductor 406b. Furthermore, in some cases, there is a mixed region of the semiconductor 406b and the insulator 406c between the semiconductor 406b and the insulator 406c. The mixed region has a low density of interface states. For that reason, the stack of the insulator 406a, the semiconductor 406b, and the insulator 406c has a band structure where energy at each interface and in the vicinity of the interface is changed continuously (continuous junction).

At this time, electrons move mainly in the semiconductor 406b, not in the insulators 406a and 406c. Thus, when the interface state density at the interface between the insulator 406a and the semiconductor 406b and the interface state density at the interface between the semiconductor 406b and the insulator 406c are decreased, electron movement in the semiconductor 406b is less likely to be inhibited and the on-state current of the transistor can be increased.

In the case where the transistor has an s-channel structure, a channel is formed in the whole of the semiconductor 406b. Therefore, as the semiconductor 406b has a larger thickness, a a taper angle of the oxide semiconductor and a taper angle of the second insulator becomes larger. In other words, the thicker the semiconductor 406b is, the larger the on-state current of the transistor is. For example, the semiconductor 406b has a region with a thickness greater than or equal to 10 nm, preferably greater than or equal to 20 nm, more preferably greater than or equal to 40 nm, further preferably greater than or equal to 60 nm, still further preferably greater than or equal to 100 nm. Note that the semiconductor 406b has a region with a thickness of, for example, less than or equal to 300 nm, preferably less than or equal to 200 nm, or more preferably less than or equal to 150 nm because the productivity of the semiconductor device including the transistor might be decreased. In some cases, when the channel formation region is reduced in size, electrical characteristics of the transistor with a smaller thickness of the semiconductor 406b may be improved. Therefore, the semiconductor 406b may have a thickness less than 10 nm.

Moreover, the thickness of the insulator 406c is preferably as small as possible to increase the on-state current of the transistor. The thickness of the insulator 406c is less than 10 nm, preferably less than or equal to 5 nm, more preferably less than or equal to 3 nm, for example. Meanwhile, the insulator 406c has a function of blocking entry of elements other than oxygen (such as hydrogen and silicon) included in the adjacent insulator into the semiconductor 406b where a channel is formed. For this reason, it is preferable that the insulator 406c have a certain thickness. The thickness of the insulator 406c is greater than or equal to 0.3 nm, preferably greater than or equal to 1 nm, further preferably greater than or equal to 2 nm, for example. The insulator 406c preferably has an oxygen blocking property to suppress outward diffusion of oxygen released from the insulator 402 and the like.

To improve reliability, preferably, the thickness of the insulator 406a is large and the thickness of the insulator 406c is small. For example, the insulator 406a has a region with a thickness greater than or equal to 10 nm, preferably greater than or equal to 20 nm, further preferably greater than or equal to 40 nm, still further preferably greater than or equal to 60 nm. When the thickness of the insulator 406a is made large, a distance from an interface between the adjacent insulator and the insulator 406a to the semiconductor 406b in which a channel is formed can be large. Since the productivity of the semiconductor device including the transistor might be decreased, the insulator 406a has a region with a thickness, for example, less than or equal to 200 nm, preferably less than or equal to 120 nm, further preferably less than or equal to 80 nm.

For example, silicon in the oxide semiconductor might serve as a carrier trap or a carrier generation source. Therefore, the silicon concentration of the semiconductor 406b is preferably as low as possible. For example, a region in which the concentration of silicon that is measured by secondary ion mass spectrometry (SIMS) is lower than $1 \times 10^{19}$ atoms/cm$^3$, preferably lower than $5 \times 10^{18}$ atoms/cm$^3$, or further preferably lower than $2 \times 10^{18}$ atoms/cm$^3$ is provided between the semiconductor 406b and the insulator 406a. A region with a silicon concentration lower than $1 \times 10^{19}$ atoms/cm$^3$, preferably lower than $5 \times 10^{18}$ atoms/cm$^3$, further preferably lower than $2 \times 10^{18}$ atoms/cm$^3$ that is measured by SIMS is provided between the semiconductor 406b and the insulator 406c.

It is preferable to reduce the concentration of hydrogen in the insulators 406a and 406c in order to reduce the concentration of hydrogen in the semiconductor 406b. The insulators 406a and 406c each have a region in which the concentration of hydrogen measured by SIMS is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. It is preferable to reduce the concentration of nitrogen in the insulators 406a and 406c in order to reduce the concentration of nitrogen in the semiconductor 406b. The insulators 406a and 406c each have a region in which the concentration of nitrogen measured by SIMS is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Note that when copper enters the oxide semiconductor, an electron trap might be generated. The electron trap might shift the threshold voltage of the transistor in the positive direction. Therefore, the concentration of copper on the surface of or in the semiconductor 406b is preferably as low as possible. For example, the semiconductor 406b preferably has a region in which the copper concentration is lower than or equal to $1 \times 10^{19}$ atoms/cm$^3$, lower than or equal to $5 \times 10^{18}$ atoms/cm$^3$, or lower than or equal to $1 \times 10^{18}$ atoms/cm$^3$.

The above three-layer structure is an example. For example, a two-layer structure without the insulator 406a or a two-layer structure without the insulator 406c may be employed. Alternatively, a four-layer structure in which any one of the insulators or the semiconductors described as examples of the insulator 406a, the semiconductor 406b, and the insulator 406c is provided below or over the insulator 406a or below or over the insulator 406c may be employed. Alternatively, an n-layer structure (n is an integer of 5 or more) may be employed in which any one of the insulators or the semiconductors described as examples of the insulator 406a, the semiconductor 406b, and the insulator 406c is provided at two or more of the following positions: over the insulator 406a, below the insulator 406a, over the insulator 406c, and below the insulator 406c.

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate containing silicon carbide, silicon germanium, gallium arsenide, indium phosphide, zinc oxide, or gallium oxide as a material is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing the transistor over a flexible substrate, there is a method in which the transistor is formed over a non-flexible substrate and then the transistor is separated and transferred to the substrate 400 that is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The substrate 400 has a region with a thickness of, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 400 has a small thickness, the weight of the semiconductor device including the transistor can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 that is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

At least part of this embodiment can be implemented in combination with any of the embodiments described in this specification as appropriate.

Embodiment 3

<Method for Manufacturing Transistor>

A method for manufacturing the transistor of one embodiment of the present invention in FIGS. 1A to 1C is described below with reference to FIGS. 11A to 11C, FIGS. 12A to 12C, FIGS. 13A to 13C, FIGS. 14A to 14C, FIGS. 15A to 15C, FIGS. 16A to 16C, FIGS. 17A to 17C, FIGS. 18A to 18C, FIGS. 19A to 19C, FIGS. 20A to 20C, FIGS. 21A to 21C, FIGS. 22A to 22C, FIGS. 23A to 23C, FIGS. 24A to 24C, FIGS. 25A to 25C, and FIGS. 26A to 26C.

First, the substrate 400 is prepared.

Next, the insulator 401 is formed. The insulator 401 may be formed by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

In the case of a PECVD method, a high quality film can be obtained at relatively low temperature. Furthermore, a TCVD method does not use plasma and thus causes less plasma damage to an object. For example, a wiring, an electrode, an element (e.g., transistor or capacitor), or the like included in a semiconductor device might be charged up by receiving electric charges from plasma. In that case, accumulated electric charges might break the wiring, electrode, element, or the like included in the semiconductor device. Such plasma damage is not caused in the case of using a TCVD method, and thus the yield of a semiconductor device can be increased. In addition, since plasma damage does not occur in the deposition by a TCVD method, a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by the CVD method or the ALD method, a film with a desired composition can be formed by adjusting the flow ratio of a source gas. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the deposition can be reduced because time taken for transfer and pressure adjustment is omitted. Thus, semiconductor devices can be manufactured with improved productivity.

Next, an insulator to be the insulator 301 is formed over the insulator 401. The insulator to be the insulator 301 can be formed by a sputtering method, a CVD method, an MBE method, a PLD method, an ALD method, or the like.

Then, a groove is formed in the insulator to be the insulator 301 so as to reach the insulator 401; thus, the insulator 301 is formed. Examples of the groove include a hole and an opening. In forming the groove, wet etching may be employed; however, dry etching is preferably employed in terms of microfabrication. The insulator 401 is preferably an insulator that serves as an etching stopper film used in forming the groove by etching the insulator to be the insulator 301. For example, in the case where a silicon oxide film is used as the insulator to be the insulator 301 in which the groove is to be formed, the insulator 401 is preferably formed using a silicon nitride film, an aluminum oxide film, or a hafnium oxide film.

After the formation of the groove, a conductor to be the conductor 310 is formed. The conductor to be the conductor 310 desirably contains a conductor that has a function of inhibiting penetration of oxygen. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. The conductor to be the conductor 310 can be formed by a sputtering method, a CVD method, an MBE method, a PLD method, an ALD method, or the like.

Next, chemical mechanical polishing (CMP) is performed to remove the conductor to be the conductor 310 over the insulator 301. Consequently, the conductor to be the conductor 310 remains only in the groove; thus, the conductor 310 that has a flat top surface and is a wiring layer can be formed.

Alternatively, the conductor to be the conductors 310 may be formed over the insulator 301 and processed by a lithography method or the like to form the conductor 310.

Next, the insulator 302 is formed over the insulator 301 and the conductors 310. The insulator 302 can be formed by a sputtering method, a CVD method, an MBE method, a PLD method, an ALD method, or the like. The insulator 303 is formed over the insulator 302. It is preferable that the insulator 303 hardly allow impurities such as hydrogen and oxygen to pass therethrough. It is preferable to use, for example, a silicon nitride film, an aluminum oxide film, or a hafnium oxide film. The insulator 303 can be deposited by a sputtering method, a CVD method, an MBE method, a PLD method, an ALD method, or the like.

Next, the insulator 402 is formed over the insulator 303. The insulator 402 can be formed by a sputtering method, a CVD method, an MBE method, a PLD method, an ALD method, or the like. Next, treatment to add oxygen to the insulator 402 may be performed. For the treatment to add oxygen, an ion implantation method, a plasma treatment method, or the like can be used. Note that oxygen added to the insulator 402 becomes excess oxygen.

Next, an insulator 306a is deposited over the insulator 402. The insulator 306a can be formed by a sputtering method, a CVD method, an MBE method, a PLD method, an ALD method, or the like.

Next, treatment to add oxygen to the insulator 306a may be performed. Examples of the treatment for adding oxygen to the insulator 306a include ion implantation and plasma treatment. Note that oxygen added to the insulator 306a is excess oxygen. Next, a semiconductor 306b is fainted over the insulator 306a. The semiconductor 306b can be formed by a sputtering method, a CVD method, an MBE method, a PLD method, an ALD method, or the like.

Next, first heat treatment may be performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, crystallinity of the semiconductor can be increased and impurities such as hydrogen and moisture can be removed, for example. Alternatively, in the first heat treatment, plasma treatment using oxygen may be performed under a reduced pressure. The treatment using plasma containing oxygen is preferably performed using an apparatus including a power source for generating high-density plasma using microwaves, for example. Alternatively, a plasma power source for applying a radio frequency (RF) to a substrate side may be provided. The use of high-density plasma enables high-density oxygen radicals to be produced, and the application of the RF voltage to the substrate side allows oxygen radicals generated by the high-density plasma to be efficiently introduced into the semiconductor 306b. Alternatively, after plasma treatment using an inert gas with the apparatus, plasma treatment using oxygen in order to compensate released oxygen may be performed. The first heat treatment is not necessarily performed.

Then, a conductor 405 is formed over the semiconductor 306b. The conductor 405 can be formed by a sputtering method, a CVD method, an MBE method, a PLD method, an ALD method, or the like (see FIG. 11A, 11B, or 11C).

Next, a resist mask is formed over the conductor 405 by a lithography method or the like. In a lithography method, first, a resist is exposed to light through a photomask. Next, a region exposed to light is removed or left using a developing solution, so that a resist mask is formed. Then, etching with the resist mask is conducted. As a result, a conductor, a semiconductor, an insulator, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a photomask is not necessary in the case of using an electron beam or an ion beam. To remove the resist mask, dry etching treatment such as ashing or wet etching treatment can be used. Alternatively, wet etching treatment can be performed after dry etching treatment. Still alternatively, dry etching treatment can be performed after wet etching treatment.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, part of the conductor 405 is etched using a resist mask as an etching mask, so that a conductor 415 is formed. Here, an organic coating film may be formed between the resist mask and the conductor 405. The organic coating film may improve adhesion between the resist mask and the conductor 405. Then, part of the semiconductor 306b and part of the insulator 306a are etched using the resist mask and the conductor 415 as etching masks, so that the semiconductor 406b and the insulator 406a are formed. By this etching, the semiconductor 406b and the insulator 406a are preferably processed to have tapered shapes. The description "having a tapered shape" means that the angle formed between the side surface of the insulator 406a and the plane parallel to the bottom surface of the insulator 406a is smaller than 90° and that the angle formed between the side surface of the semiconductor 406b and the plane parallel to the bottom surface of the semiconductor 406b is smaller than 90°. These angles can be referred to as taper angles. The taper angle is preferably greater than or equal to 20° and smaller than or equal to 80°, further preferably greater than or equal to 30° and smaller than or equal to 60°. The resist mask is eliminated by this etching in some cases.

The etching of the part of the semiconductor 306b and the part of the insulator 306a can be performed by a wet etching method or a dry etching method. Microfabrication can be realized by performing dry etching. As a gas for dry etching, for example, any of a $CH_4$ gas, a $Cl_2$ gas, a $BCl_3$ gas, and the like can be used alone or in combination. Alternatively, an oxygen gas, a helium gas, an argon gas, a hydrogen gas, or the like can be added to any of the above gases as appropriate. As the dry etching apparatus, any of the above-described dry etching apparatuses can be used; however, a dry etching apparatus including a high-density plasma source or a dry etching apparatus in which high-frequency power sources with different frequencies are connected to the parallel-plate-type electrodes is preferably used.

Figure 12A:
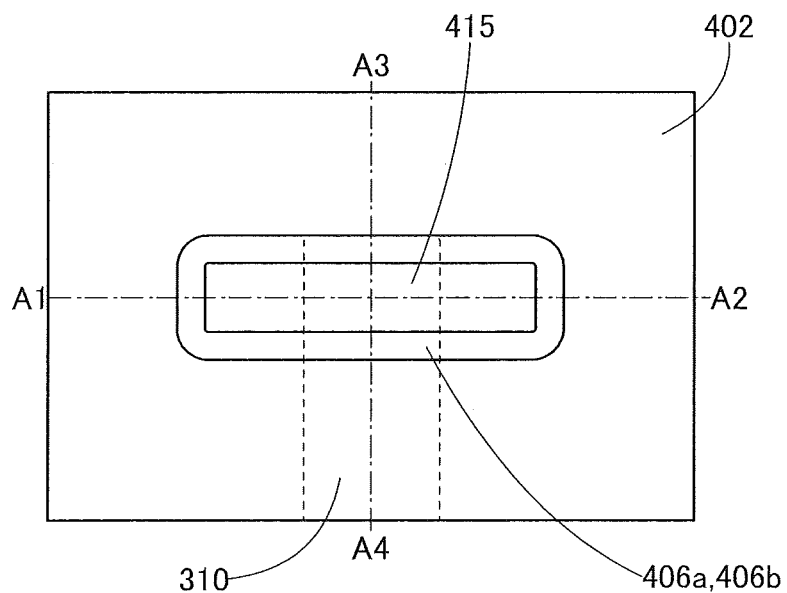
FIGS. 12A to 12C are a top view and cross-sectional views illustrating a method for manufacturing a transistor of one embodiment of the present invention.
Figures 12B, 12C:
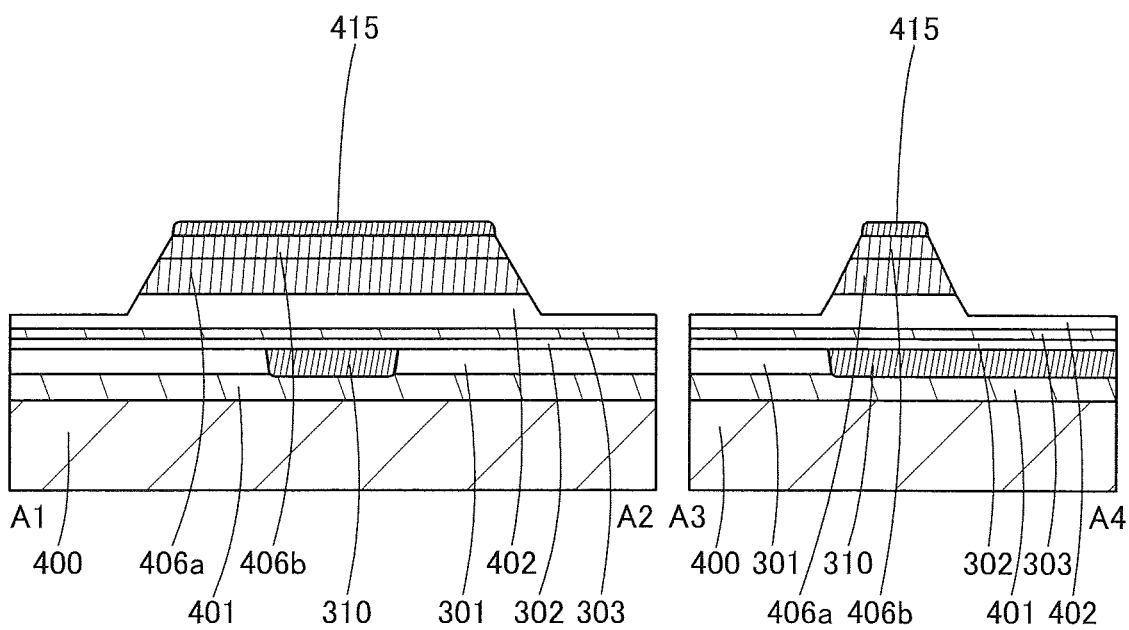
Figure 13A:
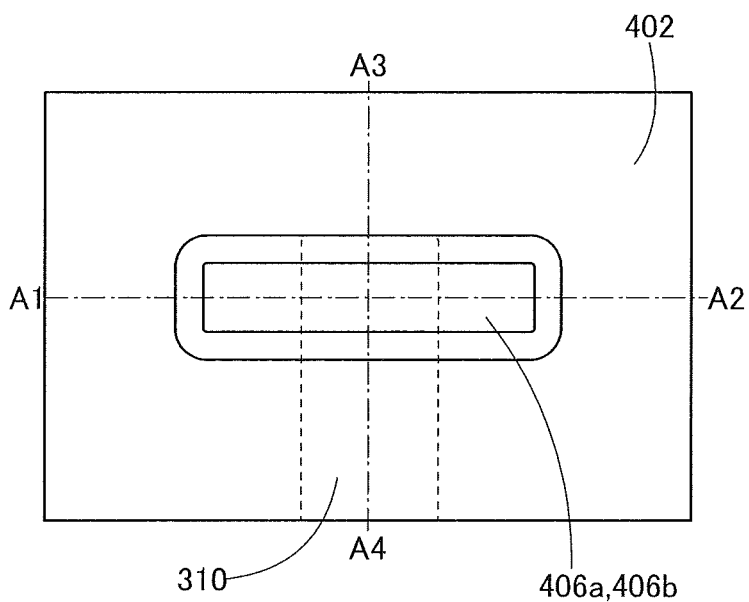
FIGS. 13A to 13C are a top view and cross-sectional views illustrating a method for manufacturing a transistor of one embodiment of the present invention.
Figures 13B, 13C:
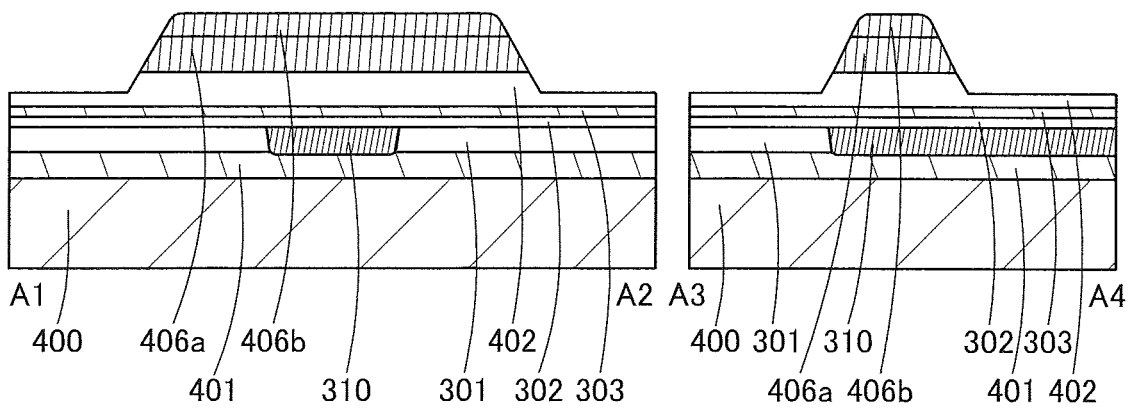
Figure 14A:
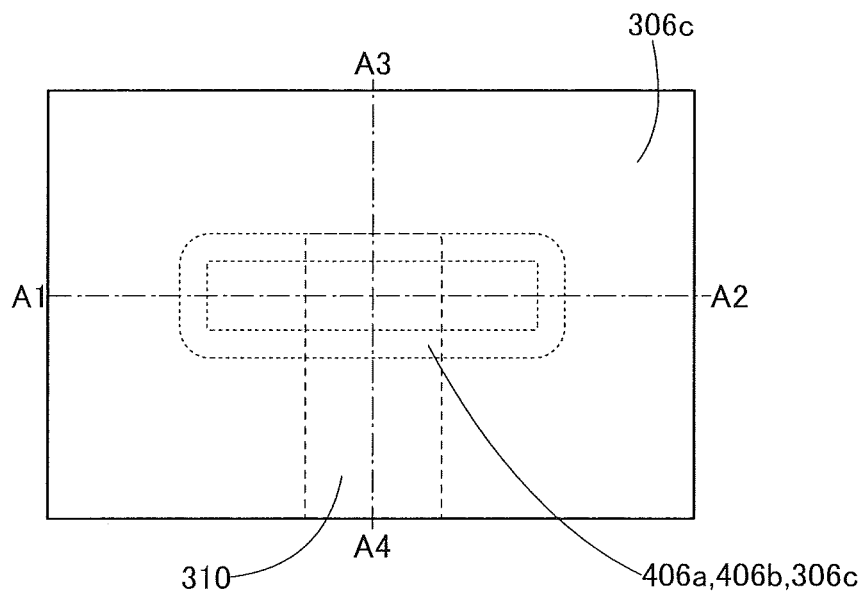
FIGS. 14A to 14C are a top view and cross-sectional views illustrating a method for manufacturing a transistor of one embodiment of the present invention.
Figure 14B:
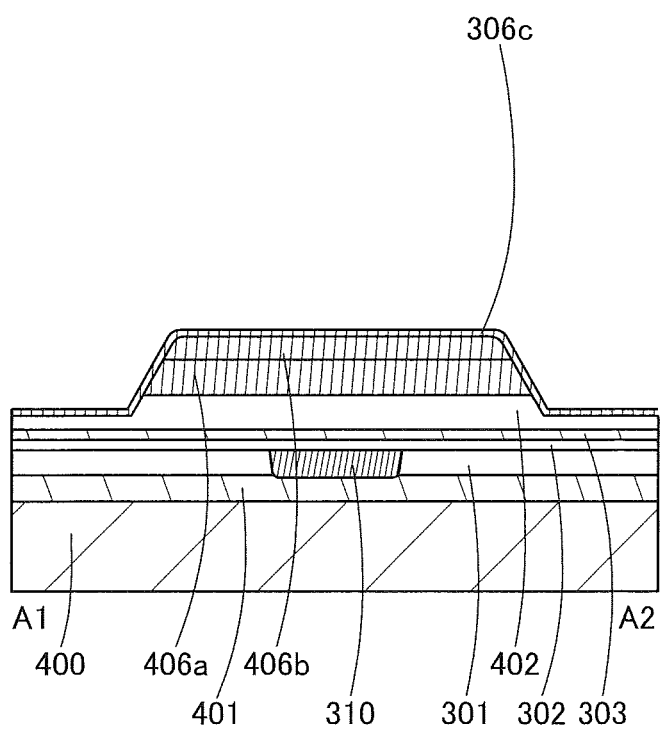
Figure 14C:
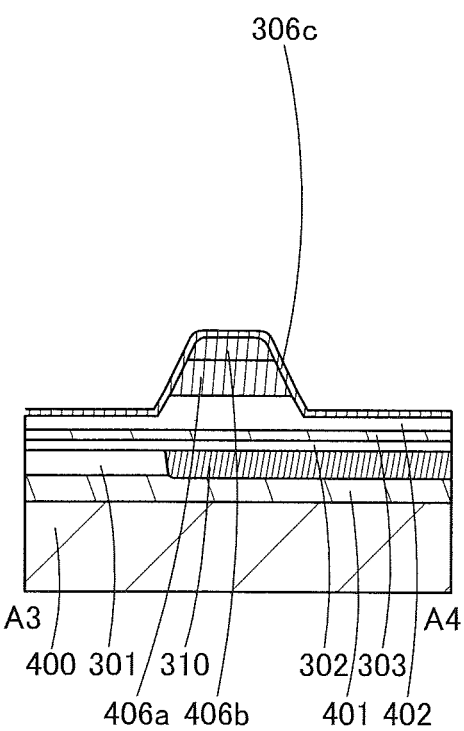

In the above-described example, in the etching of the part of the semiconductor 306b and the part of the insulator 306a, the resist mask and the conductor 415 are used as the etching masks; however, only the resist mask or the resist mask and the organic coating film can be used as the etching mask (see FIG. 12A, 12B, or 12C).

Accordingly, a multilayer film including the insulator 406a, the semiconductor 406b, and the conductor 415 is formed. At this time, the insulator 402 is also etched, so that part of the insulator 402 is thinned in some cases. That is, the insulator 402 may have a protruding portion in a region in contact with the multilayer film. Next, the conductor 415 having been used as an etching mask is etched by a dry etching method or the like (see FIG. 13A, 13B, or 13C).

Then, an insulator 306c is formed. The insulator 306c can be formed by a sputtering method, a CVD method, an MBE method, a PLD method, an ALD method, or the like (see FIG. 14A, 14B, or 14C).

Next, treatment using plasma containing oxygen is performed. Alternatively, treatment using plasma containing oxygen and heat treatment may be simultaneously performed. By the treatment using plasma containing oxygen and the heat treatment, the crystallinity of the semiconductor can be improved, and impurities such as hydrogen and water can be removed. The treatment using plasma containing oxygen is preferably performed using an apparatus including a power source for generating high-density plasma using microwaves, for example. Alternatively, a plasma power source for applying a radio frequency (RF) to a substrate side may be provided. The use of high-density plasma enables high-density oxygen radicals to be produced, the application of the RF voltage to the substrate side allows oxygen radicals generated by the high-density plasma to be efficiently added to the insulator 306c as excess oxygen, and the heat treatment allows excess oxygen in the insulator 306c to be efficiently introduced into the semiconductor 406b. Oxygen radicals 435 are illustrated in FIGS. 15A and 15B. Each arrow indicates an example of the moving direction of the oxygen radicals 435; however, the moving direction of the oxygen radicals 435 is not limited to this direction indicated by the arrows. Since the semiconductor 406b has a tapered shape, excess oxygen in the insulator 306c can be efficiently introduced into the semiconductor 406b. Alternatively, after plasma treatment using an inert gas with the apparatus, plasma treatment using oxygen in order to compensate released oxygen may be performed. The heat treatment is performed at a temperature higher than or equal to 250° C. and lower than or equal to 650° C., preferably higher than or equal to 350° C. and lower than or equal to 600° C., and further preferably higher than or equal to 400° C. and lower than or equal to 570° C. (see FIG. 15A, 15B, or 15C).

Then, a conductor to be the conductor 416 is deposited over the insulator 306c. The conductor to be the conductor 416 can be formed by a sputtering method, a CVD method, an MBE method, a PLD method, an ALD method, or the like. Next, the conductor 416 and the insulator 406c are formed by a lithography method or the like.

The insulator 406c and a conductor 416 are formed to cover the insulator 406a and the semiconductor 406b. Since the insulator 406a and the semiconductor 406b each have a tapered shape, the coverage by the insulator 406c and the conductor 416 is excellent; thus, the above-described excess oxygen introduced into the semiconductor 406b is blocked by the insulator 406c and the conductor 416, so that outward diffusion of the excess oxygen is suppressed, which is preferable.

Figure 16A:
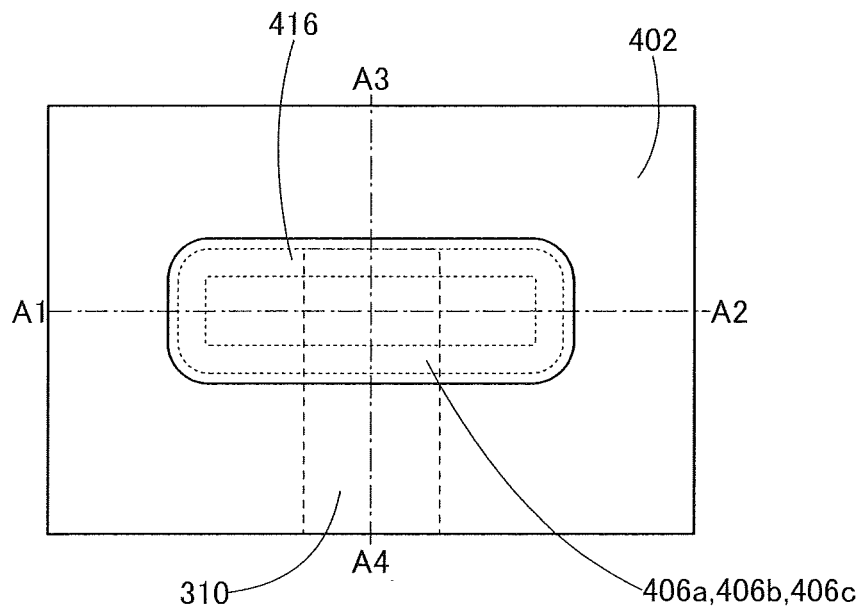
FIGS. 16A to 16C are a top view and cross-sectional views illustrating a method for manufacturing a transistor of one embodiment of the present invention.
Figure 16B:
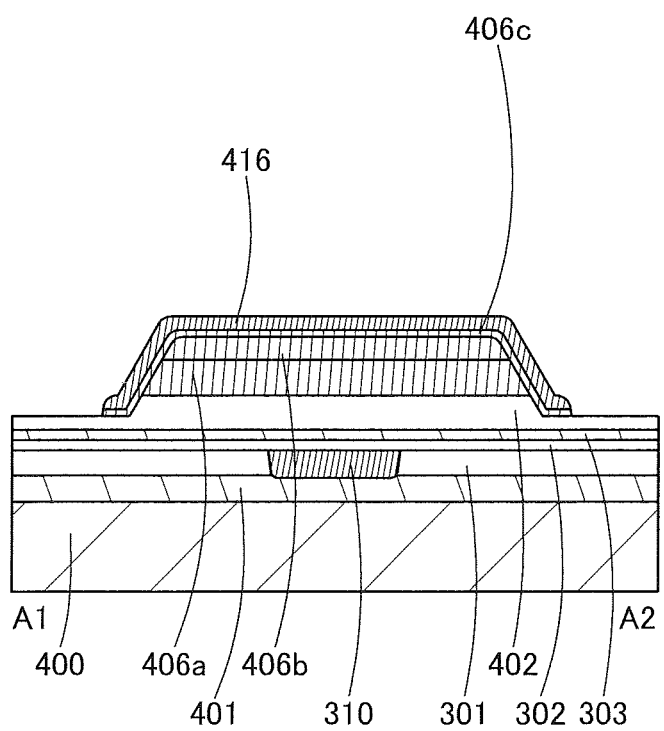
Figure 16C:
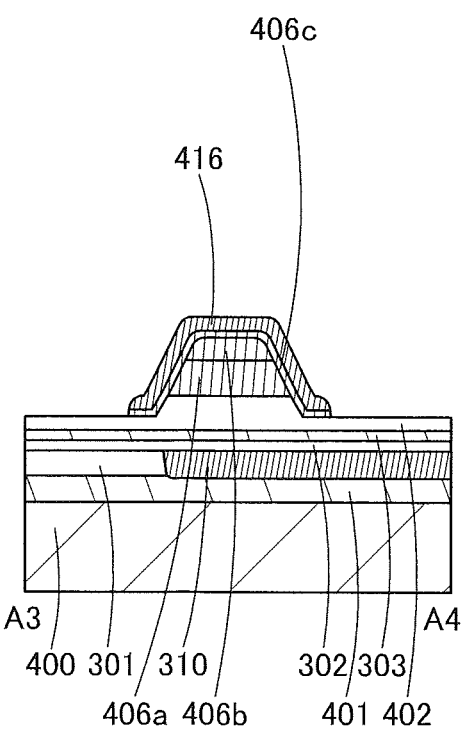
Figure 18A:
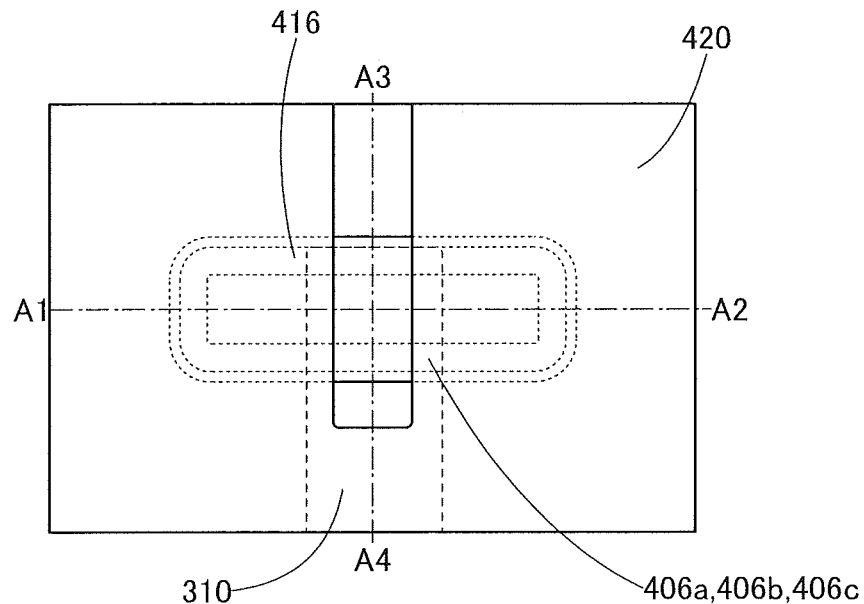
FIGS. 18A to 18C are a top view and cross-sectional views illustrating a method for manufacturing a transistor of one embodiment of the present invention.
Figure 18B:
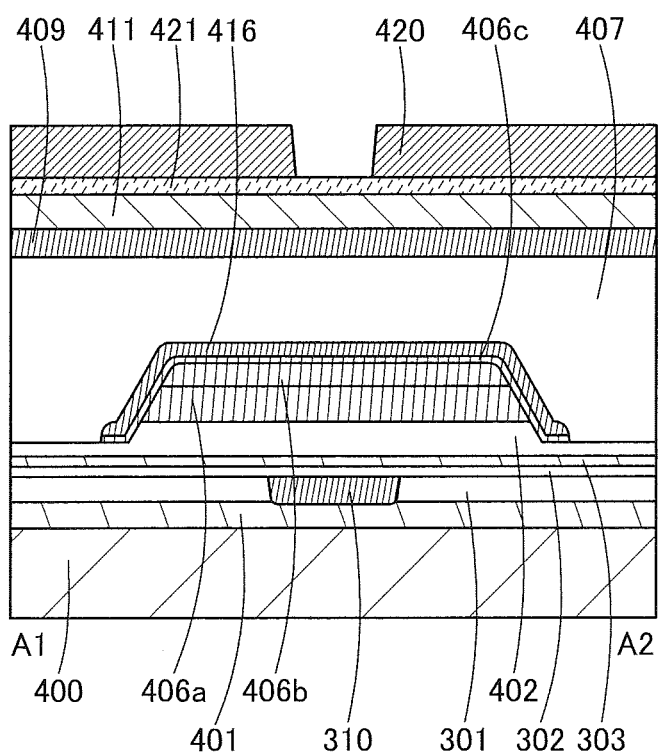
Figure 18C:
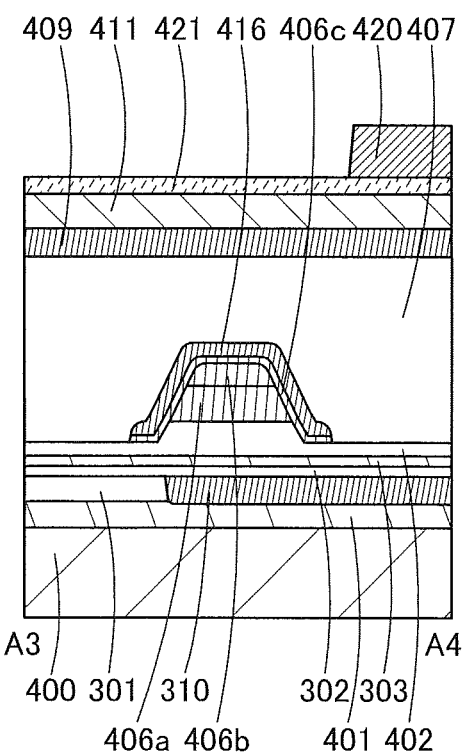
Figure 19A:
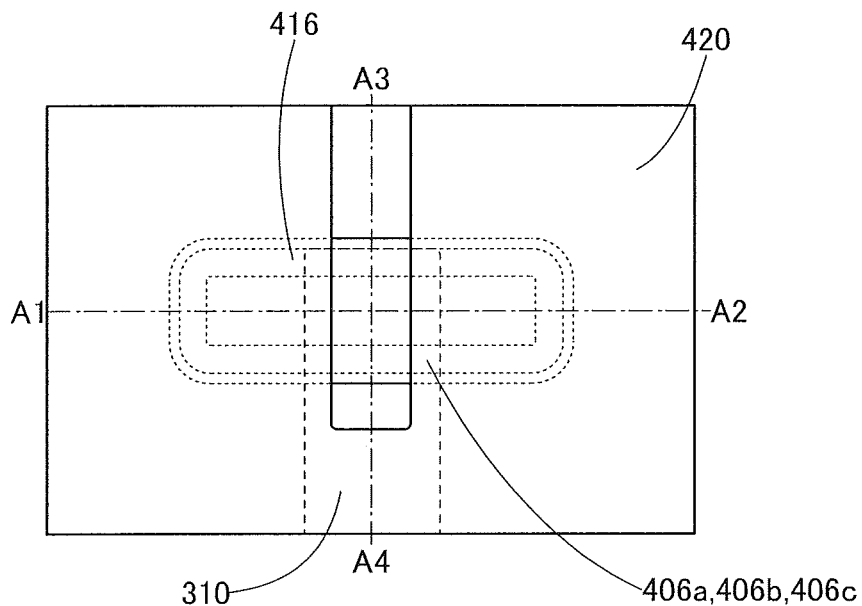
FIGS. 19A to 19C are a top view and cross-sectional views illustrating a method for manufacturing a transistor of one embodiment of the present invention.
Figure 19B:
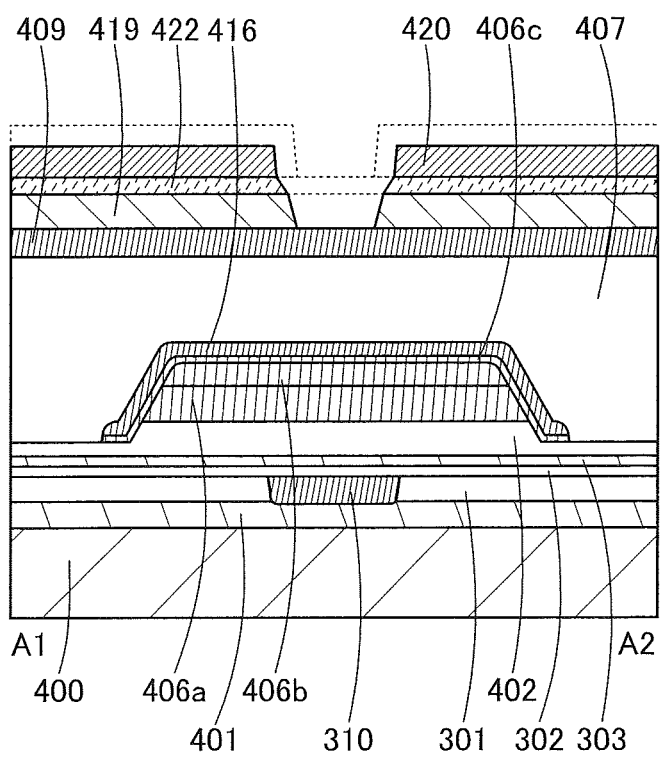
Figure 19C:
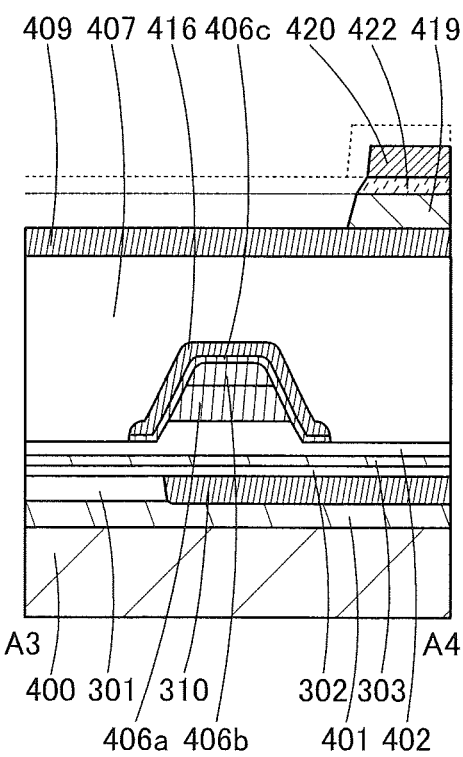
Figure 20A:
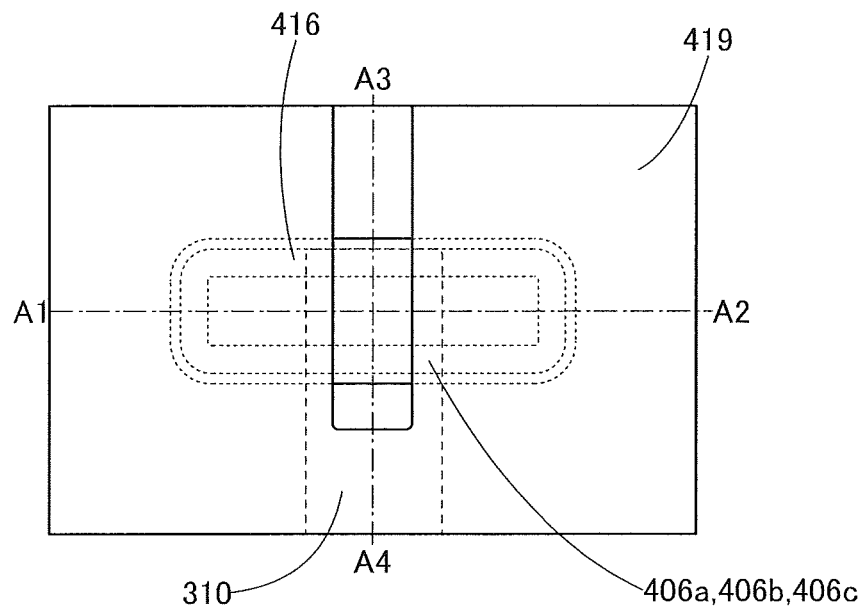
FIGS. 20A to 20C are a top view and cross-sectional views illustrating a method for manufacturing a transistor of one embodiment of the present invention.
Figure 20B:
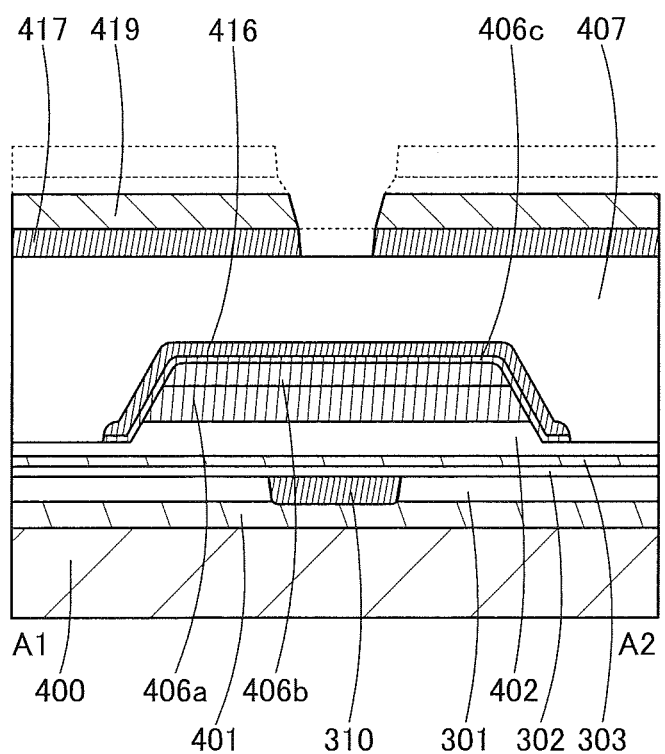
Figure 20C:
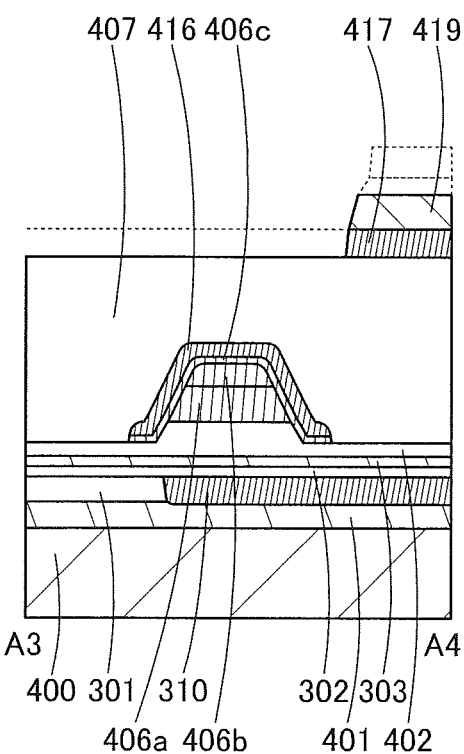
Figure 21A:
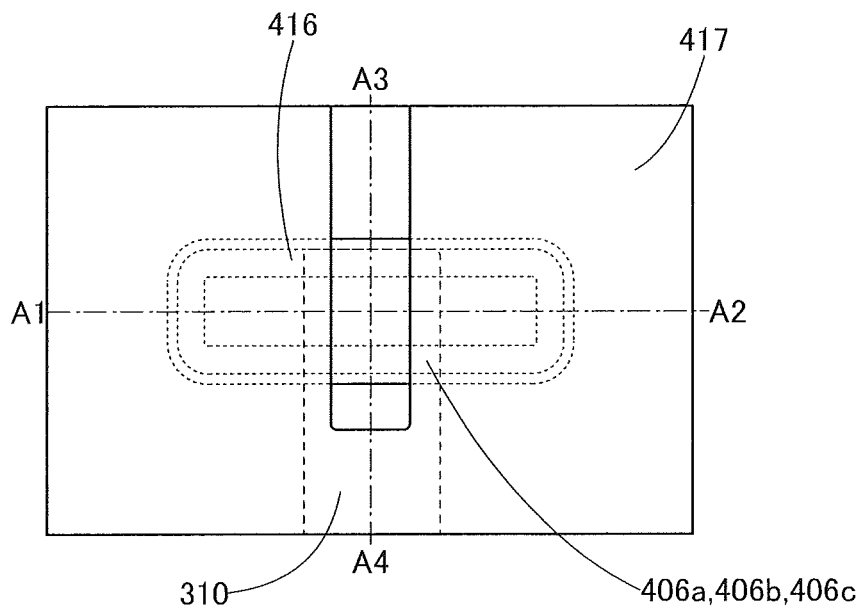
FIGS. 21A to 21C are a top view and cross-sectional views illustrating a method for manufacturing a transistor of one embodiment of the present invention.
Figure 21B:
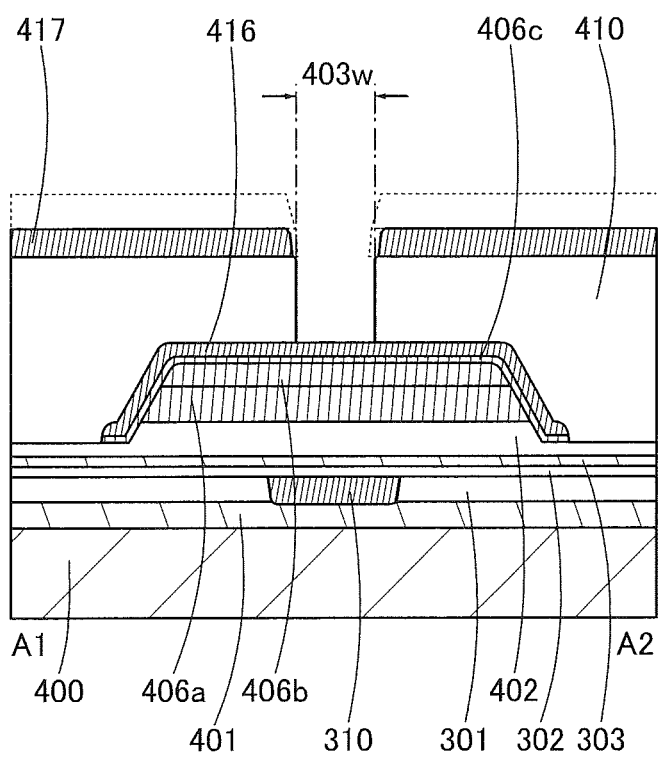
Figure 21C:
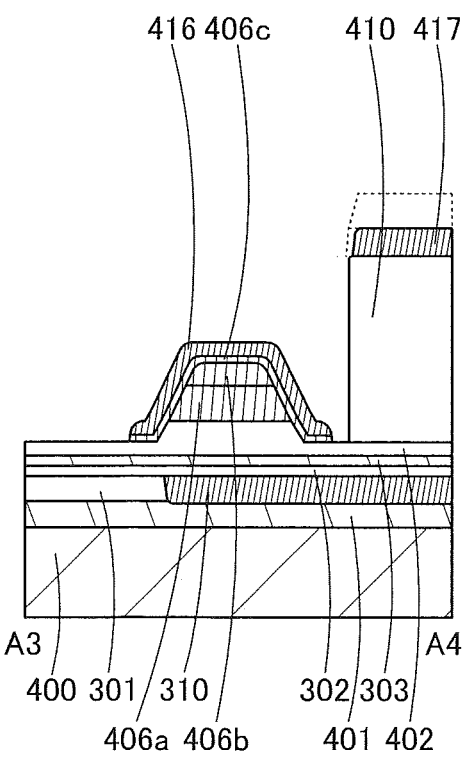
Figure 23A:
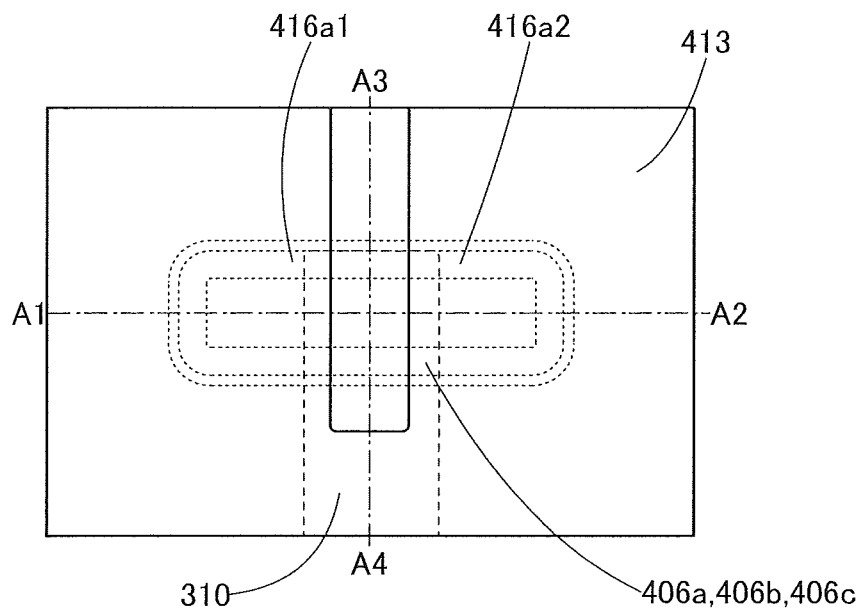
FIGS. 23A to 23C are a top view and cross-sectional views illustrating a method for manufacturing a transistor of one embodiment of the present invention.
Figure 23B:
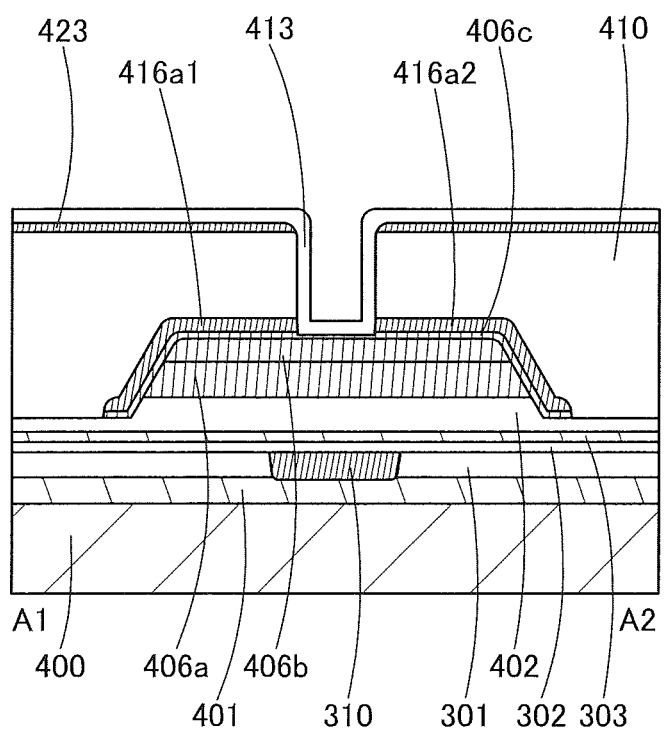
Figure 23C:
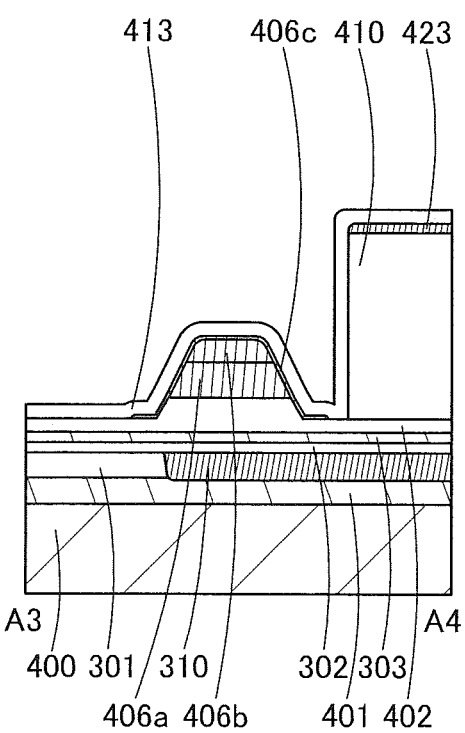
Figure 25A:
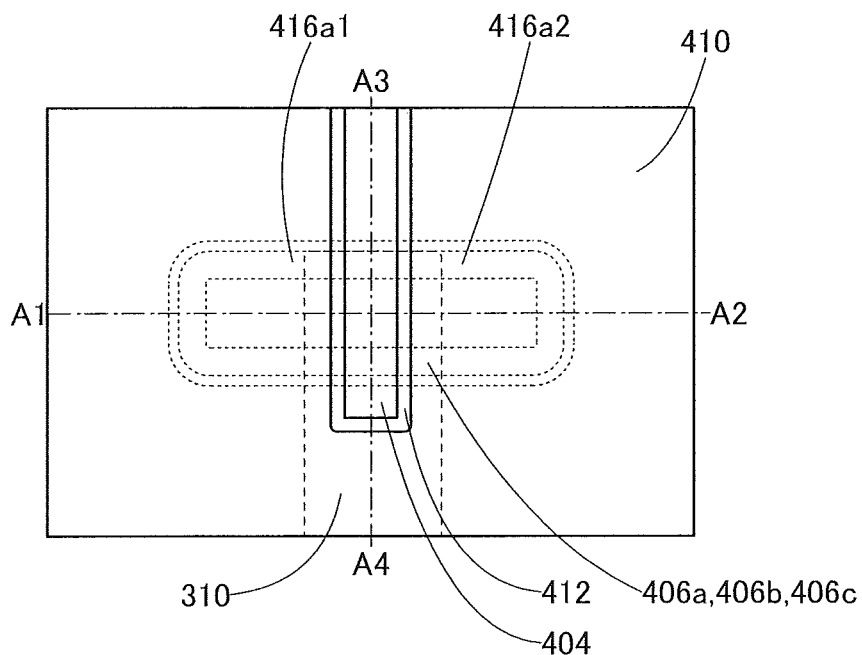
FIGS. 25A to 25C are a top view and cross-sectional views illustrating a method for manufacturing a transistor of one embodiment of the present invention.
Figures 25B, 25C:
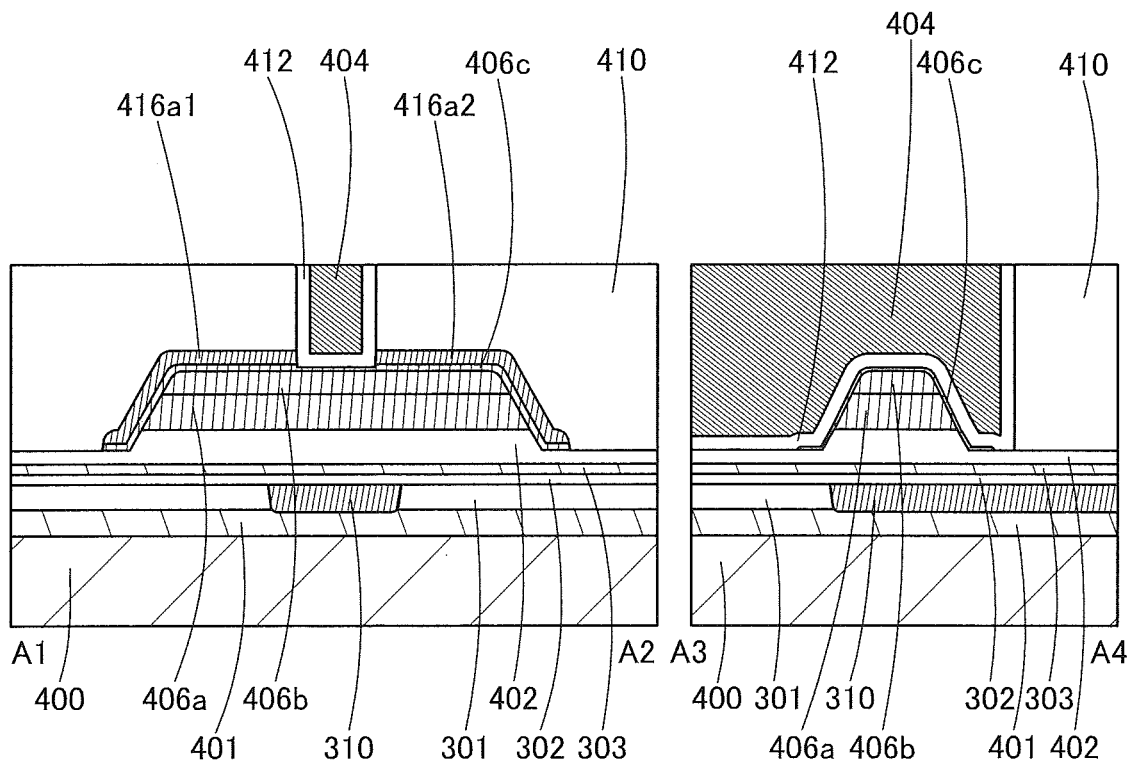
Figure 26A:
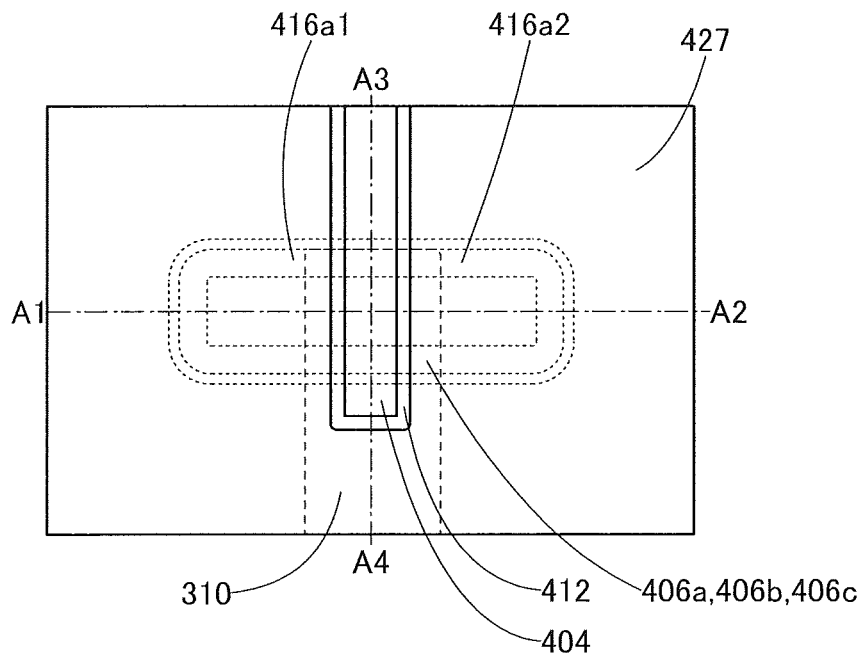
FIGS. 26A to 26C are a top view and cross-sectional views illustrating a method for manufacturing a transistor of one embodiment of the present invention.
Figure 26B:
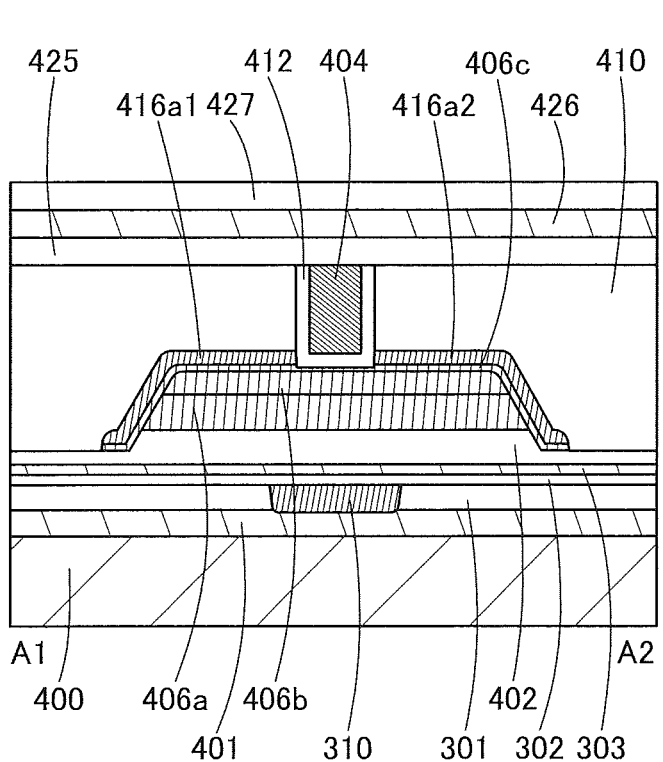
Figure 26C:
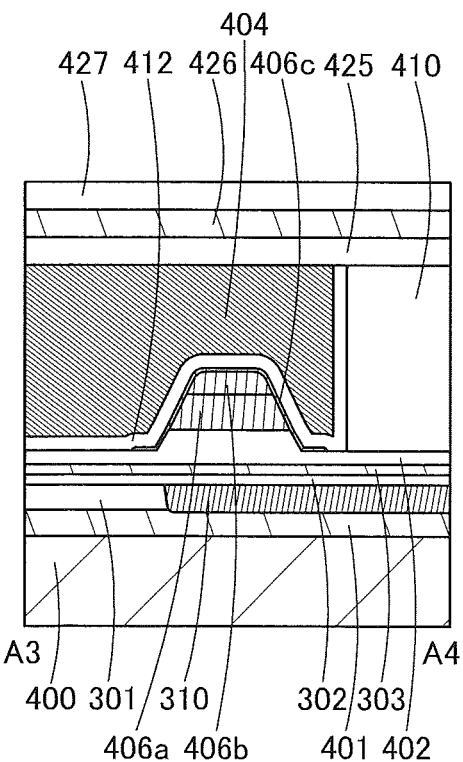

Although an example in which the insulator 406c and the conductor 416 are formed by one lithography step is described, the insulator 406c and the conductor 416 may be formed by their respective lithography steps (see FIG. 16A, 16B, or 16C).

Next, an insulator 407 is formed. The insulator 407 can be formed by a sputtering method, a CVD method, an MBE method, a PLD method, an ALD method, or the like. Alternatively, the insulator 407 can be formed by a spin coating method, a dipping method, a droplet discharging method (such as an ink-jet method), a printing method (such as screen printing or offset printing), a doctor knife method, a roll coater method, a curtain coater method, or the like.

The insulator 407 may be formed to have a flat top surface. For example, the top surface of the insulator 407 may have flatness immediately after the film formation. Alternatively, for example, the insulator 407 may have flatness by removing the insulator 407 from the top surface after the film formation so that the top surface becomes parallel to a reference surface such as a rear surface of the substrate. Such treatment is referred to as planarization treatment. As the planarization treatment, for example, chemical mechanical polishing (CMP) treatment, dry etching treatment, or the like can be performed. However, the top surface of the insulator 407 is not necessarily flat.

Then, a conductor 409 is formed over the insulator 407. The conductor 409 can be formed by a sputtering method, a CVD method, an MBE method, a PLD method, an ALD method, or the like. Next, an insulator 411 is formed over the conductor 409. The insulator 411 can be formed by a sputtering method, a CVD method, an MBE method, a PLD method, an ALD method, or the like (see FIG. 17A, 17B, or 17C).

Next, an organic coating film 421 is formed over the insulator 411. Next, a resist mask 420 is formed over the organic coating film 421 by a lithography method or the like. The organic coating film 421 is formed between the insulator 411 and the resist mask 420, so that adhesion between the insulator 411 and the resist mask 420 may be improved. Note that formation of the organic coating film 421 can be omitted (see FIG. 18A, 18B, or 18C).

Then, first processing is performed. In the first processing, the organic coating film 421 is etched by a dry etching method or the like using the resist mask 420 as a mask, so that an organic coating film 422 is formed. Examples of a gas to be used for the first processing include a $C_4F_6$ gas, a $C_2F_6$ gas, a $CF_4$ gas, a $SF_6$ gas, and a $CHF_3$ gas.

Next, second processing is performed. In the second processing, the insulator 411 is etched by a dry etching method until the top surface of the conductor 409 is exposed, so that an insulator 419 is fruited. As a gas for the second processing, for example, any of a $C_4F_6$ gas, a $C_2F_6$ gas, a $C_4F_8$ gas, a $CF_4$ gas, a $SF_6$ gas, a $CHF_3$ gas, and the like can be used alone or in combination. Alternatively, an oxygen gas, a helium gas, an argon gas, a hydrogen gas, or the like can be added to any of the above gases as appropriate. As a dry etching apparatus used for the first processing and the second processing, any of the above-described dry etching apparatuses can be used; however, a dry etching apparatus in which high-frequency power sources with different frequencies are connected to the parallel-plate electrodes is preferably used (see FIG. 19A, 19B, or 19C).

Next, third processing is performed. In the third processing, the conductor 409 is etched by a dry etching method until the top surface of the insulator 407 is exposed, so that a conductor 417 is formed. As a gas for the dry etching in the third processing, for example, any of a $C_4F_6$ gas, a $C_2F_6$ gas, a $C_4F_8$ gas, a $CF_4$ gas, a $SF_6$ gas, a $CHF_3$ gas, a $Cl_2$ gas, a $BCl_3$ gas, a $SiCl_4$ gas, and the like can be used alone or in combination. Alternatively, an oxygen gas, a helium gas, an argon gas, a hydrogen gas, or the like can be added to any of the above gases as appropriate. At this time, the resist mask 420 is also eliminated by the etching. As a dry etching apparatus for the third processing, the dry etching apparatus used for the first processing and the second processing can be used. Through the above steps, a hard mask including the conductor 417 and the insulator 419 is formed (see FIG. 20A, 20B, or 20C).

Note that the hard mask may be one layer formed only using the conductor 417. In that case, the third processing is performed after the formation of the resist mask 420 over the conductor 409 by a lithography method or the like. By the third processing, the resist mask 420 is also eliminated by the etching. Alternatively, without the hard mask, only the resist mask 420 or a two-layer mask including the organic coating film 422 and the resist mask 420 may be used.

Next, fourth processing is performed. In the fourth processing, an opening is formed in the insulator 407 by a dry etching method that uses the hard mask including the conductor 417 and the insulator 419 as masks and is performed until a top surface of the conductor 416 and a top surface of the insulator 402 are exposed, whereby the insulator 410 is formed. As a gas for the dry etching used in the fourth processing, a gas similar to that used in the second processing can be used. Furthermore, as a dry etching apparatus for the fourth processing, an apparatus similar to that used in the first processing, the second processing, and the third processing can be used.

In the fourth processing, the insulator 419 is the outermost surface of the hard mask including the conductor 417 and the insulator 419; thus, the insulator 407 and the insulator 419 are etched at the same time. In the case where the insulator 407 and the insulator 419 are insulators including the same element, reaction with etching species in plasma and a reaction product are uniform regardless of place. Accordingly, variation in etching rate and the like between different locations can be reduced, and thus processing variation can be minimized. That is, high-precision processing can be performed.

In the fourth processing, by making the ratio of the etching rate of the conductor 417 to the etching rate of the insulator 407 high, the etching of the conductor 417 as the hard mask is minimized and the change in the shape can be prevented. Thus, processing precision of the insulator 407 can be increased. The ratio of the etching rate of the conductor 417 to the etching rate of the insulator 407 is 1:5 or more, preferably 1:10 or more.

The side surface of the insulator 410 in the opening processed by the above steps is perpendicular to a bottom surface of the substrate 400; thus, variation in a width 403w, which is the width of the opening in the insulator 410, is unlikely to be affected by the variation in the thickness of the insulator 410.

Furthermore, it is desirable that the insulator 419 have the same thickness as the insulator 407 or be thinner than the insulator 407. The insulator 419 that is the outermost surface of the hard mask is etched and eliminated in the fourth processing, so that the conductor 417 becomes the outermost surface of the hard mask in fifth processing (see FIG. 21A, 21B, or 21C).

Next, fifth processing is performed by a dry etching method using the conductor 417 as a mask until the top surface of the insulator 406c is exposed, whereby the conductor 416 is divided into the conductors 416a1 and 416a2. As a gas for the dry etching used in the fifth processing, the gas used in the third processing may be used. As a dry etching apparatus for the fifth processing, the dry etching apparatus used for the first processing, the second processing, the third processing, and the fourth processing can be used.

In the fifth processing, the conductor 417 is the outermost surface of the hard mask; thus, the conductor 417 and the conductor 416 are etched at the same time. In the case where the conductor 417 and the conductor 416 are conductors including the same element, reaction with etching species in plasma and a reaction product are uniform regardless of place. Accordingly, variation in etching rate and the like between different locations can be reduced, and thus processing variation can be minimized. That is, high-precision processing can be performed. Side surfaces of the conductors 416a1 and 416a2 in the opening are perpendicular to the bottom surface of the substrate 400; thus, variation in the channel length 414w, which is a distance between the conductors 416a1 and 416a2, can be small, which is favorable.

The conductor 417 preferably has a greater thickness than the conductor 416. When the conductor 417 has a greater thickness than the conductor 416, the deformation of the conductor 417 serving as the hard mask during the fifth processing can be inhibited, and thus the deformation such as the extension of an upper portion of the opening in the insulator 410 can be inhibited in some cases. By the fifth processing, the conductor 417 is etched and thinned, so that a conductor 423 is formed.

By reducing variation in the channel length 414w, which is a distance between the conductors 416a1 and 416a2 serving as the source and drain electrodes of the transistor, variation in operation of the transistor can be reduced, which is preferable.

Next, plasma treatment using an oxygen gas may be performed. When the first processing, the second processing, the third processing, the fourth processing, and the fifth processing are performed, an impurity such as residual components of the etching gas is attached to an exposed region of the insulator 406c in some cases. For example, when a gas containing chlorine is used as an etching gas, chlorine and the like are attached in some cases. When a hydrocarbon-based gas is used as the etching gas, carbon, hydrogen, and the like might be attached. When the substrate is exposed to air after the fifth processing, the exposed region of the insulator 406c and the like corrode in some cases. Thus, plasma treatment using an oxygen gas is preferably performed successively after the fifth processing because the impurity can be removed and corrosion of the exposed region of the insulator 406c and the like can be prevented. Furthermore, the organic substance or the like attached to the side surfaces of the insulator 410 can be removed by the plasma treatment using an oxygen gas. The plasma treatment using an oxygen gas can be performed using a dry etching apparatus similar to that used in the first processing, the second processing, the third processing, the fourth processing, and the fifth processing.

Note that the impurity may be reduced by cleaning treatment using diluted hydrofluoric acid or the like or cleaning treatment using ozone or the like, for example. Note that different types of cleaning treatment may be used in combination.

Since the insulator 406a and the semiconductor 406b each have a tapered shape as described above, the area where the insulator 406c is in contact with the conductors 416a1 and 416a2 is increased, whereby contact resistance between the insulator 406c and the conductors 416a1 and 416a2 is decreased; thus, favorable transistor characteristics can be obtained.

The same dry etching apparatus is used in the first processing, the second processing, the third processing, the fourth processing, the fifth processing, and the plasma treatment using an oxygen gas; thus, the first to fifth processing and the plasma treatment can be successively performed without exposure to air. Therefore, contamination due to attachment of an atmospheric component, corrosion of the insulator, the semiconductor, and the conductor due to reaction between the remaining etching gas and the atmospheric component, and the like can be prevented. By successively performing the first to fifth processing and the plasma treatment using an oxygen gas, improvement in productivity can be expected.

The insulator 410 and the conductors 416a1 and 416a2 are processed by the manufacturing method described above, so that variation in the channel length can be reduced and processing precision can be increased (see FIG. 22A, 22B, or 22C)

Next, an insulator 413 is formed. The insulator 413 can be formed by a sputtering method, a CVD method, an MBE method, a PLD method, an ALD method, or the like. The insulator 413 is formed to have the uniform thickness along side and bottom surfaces of the opening formed by the insulator 410 and the conductors 416a1 and 416a2. Thus, an ALD method is preferably used (see FIG. 23A, 23B, or 23C).

Next, a conductor 424 is formed. The conductor 424 can be formed by a sputtering method, a CVD method, an MBE method, a PLD method, an ALD method, or the like. The conductor 424 is formed so as to fill the opening formed by the insulator 410 and the like. Therefore, a CVD method (an MCVD method, in particular) is preferred. When the conductor 424 is formed by an MCVD method, in order to increase adhesion between the insulator 413 and the conductor 424, another conductor is preferably formed by an ALD method or the like between the insulator 413 and the conductor 424. For example, a titanium nitride film may be formed by an ALD method, and subsequently a tungsten film may be formed by an MCVD method (see FIG. 24A, 24B, or 24C).

Then, the conductor 424, the insulator 413, and the conductor 423 are polished and planarized by CMP or the like from a top surface of the conductor 424 until a top surface of the insulator 410 is exposed, whereby the conductor 404 and the insulator 412 are formed. Accordingly, the conductor 404 serving as the gate electrode can be formed in a self-aligned manner without using a lithography method. The conductor 404 serving as the gate electrode can be formed without considering the alignment accuracy of the conductor 404 serving as the gate electrode and the conductors 416a1 and 416a2 serving as the source and drain electrodes; as a result, the area of the semiconductor device can be reduced. Furthermore, because the lithography process is not necessary, improvement in productivity due to simplification of the process is expected (see FIG. 25A, 25B, or 25C).

Next, an insulator 425 is formed over the insulator 410, the insulator 412, and the conductor 404. The insulator 425 can be formed by a sputtering method, a CVD method, an MBE method, a PLD method, an ALD method, or the like. Then, an insulator 426 is formed over the insulator 425. The insulator 426 can be formed by a sputtering method, a CVD method, an MBE method, a PLD method, an ALD method, or the like. Next, the insulator 427 is formed over the insulator 426. An insulator 427 can be formed by a sputtering method, a CVD method, an MBE method, a PLD method, an ALD method, or the like. An aluminum oxide is preferably deposited as the insulator 426 using plasma containing oxygen, so that oxygen in the plasma can be added to the top surface of the insulator 425 as excess oxygen.

Second heat treatment may be performed at any time after the formation of the insulator 426. By the second heat treatment, the excess oxygen contained in the insulator 425 moves to the semiconductor 406b through the insulators 410, 402, and 406a. Furthermore, the excess oxygen contained in the insulator 425 moves to the semiconductor 406b through the insulator 412 and the insulator 406c. Since excess oxygen moves to the semiconductor 406b by passing two paths as described above, defects (oxygen vacancies) in the semiconductor 406b can be reduced.

Note that the second heat treatment may be performed at a temperature such that excess oxygen (oxygen) in the insulator 425 is diffused to the semiconductor 406b. For example, the description of the first heat treatment may be referred to for the second heat treatment. The second heat treatment is preferably performed at a temperature lower than that of the first heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of excess oxygen (oxygen) from the insulator 402 can be inhibited. Note that the second heat treatment is not necessarily performed when heating during formation of the films can work as heat treatment comparable to the second heat treatment (see FIG. 26A, 26B, or 26C).

Next, openings reaching the conductors 416a1 and 416a2 through the insulators 427, 426, 425, and 410 and an opening reaching the conductor 404 through the insulators 427, 426, and 425 are formed, whereby the insulators 428, 408, and 418 are formed. In the corresponding openings, the conductors 431, 429, and 437 are embedded.

Next, a conductor is formed over the insulator 428 and the conductors 431, 429, and 437 and processed by a lithography method or the like, so that the conductors 432, 430, and 438 are formed. Through the above steps, the transistor in FIGS. 1A to 1C can be formed (see FIG. 1A, 1B, or 1C).

Embodiment 4

<Memory Device 1>

Figure 27A:
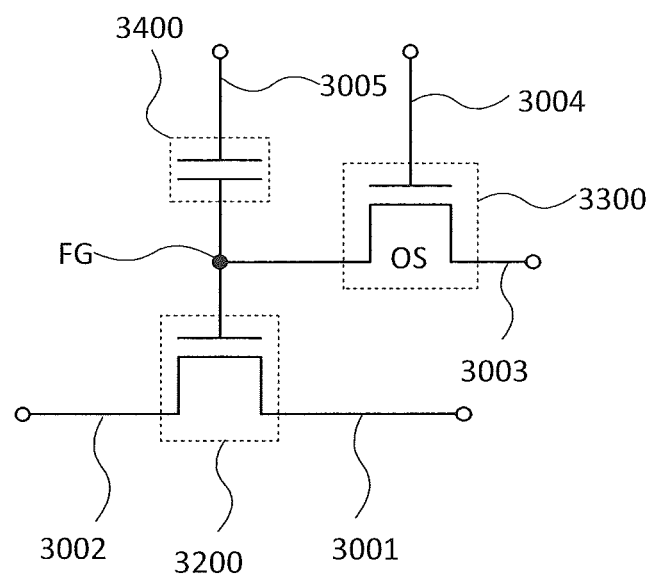
FIGS. 27A and 27B are each a circuit diagram of a memory device of one embodiment of the present invention.
Figure 27B:
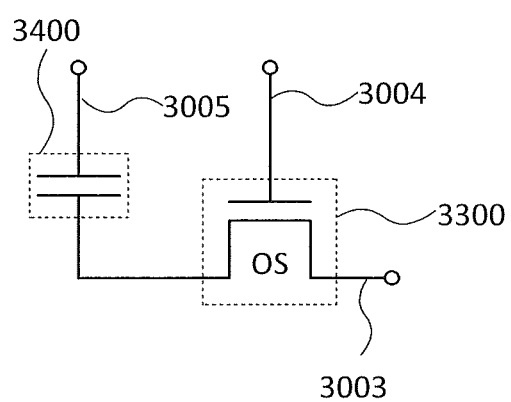

An example of a semiconductor device (memory device) that includes the transistor of one embodiment of the present invention, which can retain stored data even when not powered, and which has an unlimited number of write cycles is shown in FIGS. 27A and 27B.

The semiconductor device illustrated in FIG. 27A includes a transistor 3200 using a first semiconductor, a transistor 3300 using a second semiconductor, and a capacitor 3400. Note that any of the above-described transistors can be used as the transistor 3300.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 27A, a first wiring 3001 is electrically connected to a source of the transistor 3200. A second wiring 3002 is electrically connected to a drain of the transistor 3200. A third wiring 3003 is electrically connected to one of a source and a drain of the transistor 3300. A fourth wiring 3004 is electrically connected to a gate of the transistor 3300. A gate of the transistor 3200 and the other of the source and the drain of the transistor 3300 are electrically connected to one electrode of the capacitor 3400. A fifth wiring 3005 is electrically connected to the other electrode of the capacitor 3400.

The semiconductor device in FIG. 27A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined electric charge is supplied to the gate of the transistor 3200 (writing). Here, one of two kinds of electric charges providing different potential levels (hereinafter referred to as a low-level electric charge and a high-level electric charge) is supplied. After that, the potential of the fourth wiring 3004 is set to a potential at which the transistor 3300 is off, so that the transistor 3300 is turned off. Thus, the electric charge is held at the node FG (retaining).

Since the off-state current of the transistor 3300 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of electric charge retained in the node FG. This is because in the case of using an n-channel transistor as the transistor 3200, an apparent threshold voltage $V_{th\_H}$ at the time when the high-level electric charge is given to the gate of the transistor 3200 is lower than an apparent threshold voltage $V_{th\_L}$ at the time when the low-level electric charge is given to the gate of the transistor 3200. Here, an apparent threshold voltage refers to the potential of the fifth wiring 3005 that is needed to make the transistor 3200 be in "on state." Thus, the potential of the fifth wiring 3005 is set to a potential $V_0$ that is between $V_{th\_H}$ and $V_{th\_L}$, whereby electric charge supplied to the node FG can be determined. For example, in the case where the high-level electric charge is supplied to the node FG in writing and the potential of the fifth wiring 3005 is $V_0$ ($>V_{th\_H}$), the transistor 3200 is brought into "on state." In the case where the low-level electric charge is supplied to the node FG in writing, even when the potential of the fifth wiring 3005 is $V_0$ ($<V_{th\_L}$), the transistor 3200 still remains in "off state." Thus, the data retained in the node FG can be read by determining the potential of the second wiring 3002.

Note that in the case where memory cells are arrayed, it is necessary that data of a desired memory cell be read in read operation. For example, the fifth wiring 3005 of memory cells from which data is not read may be supplied with a potential at which the transistor 3200 is turned off regardless of the electric charge supplied to the node FG, that is, a potential lower than $V_{th\_H}$, whereby only data of a desired memory cell can be read. Alternatively, the fifth wiring 3005 of the memory cells from which data is not read may be supplied with a potential at which the transistor 3200 is turned on regardless of the electric charge supplied to the node FG, that is, a potential higher than $V_{th\_L}$, whereby only data of a desired memory cell can be read.

<Structure 1 of Semiconductor Device>

Figure 28:
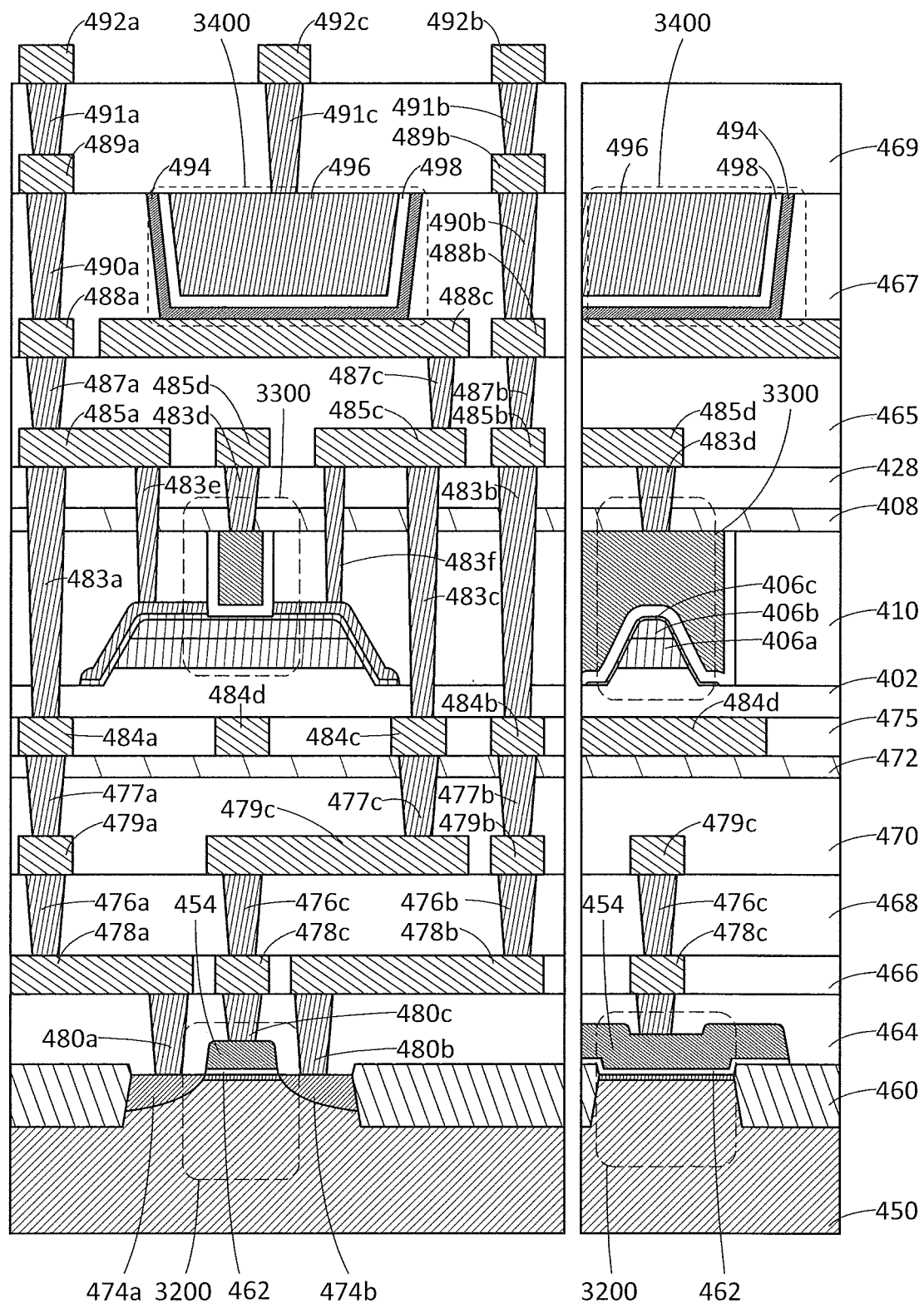
FIG. 28 is a cross-sectional view illustrating a semiconductor device of one embodiment of the present invention.

FIG. 28 is a cross-sectional view of the semiconductor device in FIG. 27A. The semiconductor device shown in FIG. 28 includes the transistor 3200, the transistor 3300, and the capacitor 3400. The transistor 3300 and the capacitor 3400 are provided over the transistor 3200. Although an example where the transistor illustrated in FIGS. 1A to 1C is used as the transistor 3300 is shown, a semiconductor device of one embodiment of the present invention is not limited thereto. The description of the above transistor is referred to.

The transistor 3200 illustrated in FIG. 28 is a transistor using a semiconductor substrate 450. The transistor 3200 includes a region 474a in the semiconductor substrate 450, a region 474b in the semiconductor substrate 450, an insulator 462, and a conductor 454.

In the transistor 3200, the regions 474a and 474b have a function as a source region and a drain region. The insulator 462 has a function as a gate insulator. The conductor 454 has a function as a gate electrode. Therefore, resistance of a channel formation region can be controlled by a potential applied to the conductor 454. In other words, conduction or non-conduction between the region 474a and the region 474b can be controlled by the potential applied to the conductor 454.

For the semiconductor substrate 450, a single-material semiconductor substrate of silicon, germanium, or the like or a compound semiconductor substrate of silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 3200 is formed. Alternatively, the semiconductor substrate 450 may be an i-type semiconductor substrate.

The top surface of the semiconductor substrate 450 preferably has a (110) plane. Thus, on-state characteristics of the transistor 3200 can be improved.

The regions 474a and 474b are regions including impurities imparting the p-type conductivity. Accordingly, the transistor 3200 has a structure of a p-channel transistor.

Note that although the transistor 3200 is illustrated as a p-channel transistor, the transistor 3200 may be an n-channel transistor.

Note that the transistor 3200 is separated from an adjacent transistor by a region 460 and the like. The region 460 is an insulating region.

The semiconductor illustrated in FIG. 28 includes an insulator 464, an insulator 466, an insulator 468, an insulator 470, an insulator 472, an insulator 475, the insulator 402, the insulator 410, the insulator 408, the insulator 428, an insulator 465, an insulator 467, an insulator 469, an insulator 498, a conductor 480a, a conductor 480b, a conductor 480c, a conductor 478a, a conductor 478b, a conductor 478c, a conductor 476a, a conductor 476b, a conductor 476c, a conductor 479a, a conductor 479b, a conductor 479c, a conductor 477a, a conductor 477b, a conductor 477c, a conductor 484a, a conductor 484b, a conductor 484c, a conductor 484d, a conductor 483a, a conductor 483b, a conductor 483c, a conductor 483d, a conductor 483e, a conductor 483f, a conductor 485a, a conductor 485b, a conductor 485c, a conductor 485d, a conductor 487a, a conductor 487b, a conductor 487c, a conductor 488a, a conductor 488b, a conductor 488c, a conductor 490a, a conductor 490b, a conductor 489a, a conductor 489b, a conductor 491a, a conductor 491b, a conductor 491c, a conductor 492a, a conductor 492b, a conductor 492c, a conductor 494, a conductor 496, the insulator 406a, the semiconductor 406b, and the insulator 406c.

The insulator 464 is provided over the transistor 3200. The insulator 466 is over the insulator 464. The insulator 468 is over the insulator 466. The insulator 470 is placed over the insulator 468. The insulator 472 is placed over the insulator 470. The insulator 475 is placed over the insulator 472. The transistor 3300 is provided over the insulator 475. The insulator 408 is provided over the transistor 3300. The insulator 428 is provided over the insulator 408. The insulator 465 is over the insulator 428. The capacitor 3400 is provided over the insulator 465. The insulator 469 is provided over the capacitor 3400.

The insulator 464 includes an opening reaching the region 474a, an opening reaching the region 474b, and an opening reaching the conductor 454, in which the conductor 480a, the conductor 480b, and the conductor 480c are embedded, respectively.

In addition, the insulator 466 includes an opening reaching the conductor 480a, an opening reaching the conductor 480b, and an opening reaching the conductor 480c, in which the conductor 478a, the conductor 478b, and the conductor 478c are embedded, respectively.

In addition, the insulator 468 includes an opening reaching the conductor 478a, an opening reaching the conductor 478b, and an opening reaching the conductor 478c, in which the conductor 476a, the conductor 476b, and the conductor 476c are embedded, respectively.

The conductor 479a in contact with the conductor 476a, the conductor 479b in contact with the conductor 476b, and the conductor 479c in contact with the conductor 476c are over the insulator 468. The insulator 472 includes an opening reaching the conductor 479a through the insulator 470, an opening reaching the conductor 479b through the insulator 470, and an opening reaching the conductor 479c through the insulator 470. In the corresponding openings, the conductor 477a, the conductor 477b, and the conductor 477c are embedded.

The insulator 475 includes an opening overlapping with the channel formation region of the transistor 3300, an opening reaching the conductor 477a, an opening reaching the conductor 477b, and an opening reaching the conductor 477c. In the corresponding openings, the conductor 484d, the conductor 484a, the conductor 484b, and the conductor 484c are embedded.

The conductor 484d may have a function as a bottom gate electrode of the transistor 3300. Alternatively, for example, electrical characteristics such as the threshold voltage of the transistor 3300 may be controlled by the application of a constant potential to the conductor 484d. Further alternatively, for example, the conductor 484d and the top gate electrode of the transistor 3300 may be electrically connected to each other. Thus, the on-state current of the transistor 3300 can be increased. A punch-through phenomenon can be suppressed; thus, stable electrical characteristics in the saturation region of the transistor 3300 can be obtained.

In addition, the insulator 402 includes an opening reaching the conductor 484a, an opening reaching the conductor 484c, and an opening reaching the conductor 484b.

The insulator 428 includes three openings reaching the conductor 484a, the conductor 484b, and the conductor 484c through the insulator 408, the insulator 410, and the insulator 402, two openings reaching a conductor of one of the source and drain electrodes of the transistor 3300 through the insulator 408 and the insulator 410, and an opening reaching a conductor of the gate electrode of the transistor 3300 through the insulator 408. In the corresponding openings, the conductor 483a, the conductor 483b, the conductor 483c, the conductor 483e, the conductor 483f, and the conductor 483d are embedded.

The conductor 485a in contact with the conductors 483a and 483e, the conductor 485b in contact with the conductor 483b, the conductor 485c in contact with the conductor 483c and the conductor 483f, and the conductor 485d in contact with the conductor 483d are over the insulator 428. The insulator 465 has an opening reaching the conductor 485a, an opening reaching the conductor 485b, and an opening reaching the conductor 485c. In the corresponding openings, the conductor 487a, the conductor 487b, and the conductor 487c are embedded.

The conductor 488a in contact with the conductor 487a, the conductor 488b in contact with the conductor 487b, and the conductor 488c in contact with the conductor 487c are over the insulator 465. In addition, the insulator 467 includes an opening reaching the conductor 488a and an opening reaching the conductor 488b. In the corresponding openings, the conductor 490a and the conductor 490b are embedded. The conductor 488c is in contact with the conductor 494 that is one of the electrodes of the capacitor 3400.

The conductor 489a in contact with the conductor 490a and the conductor 489b in contact with the conductor 490b are over the insulator 467. The insulator 469 includes an opening reaching the conductor 489a, an opening reaching the conductor 489b, an opening reaching the conductor 496 that is the other of electrodes of the capacitor 3400. In the corresponding openings, the conductor 491a, the conductor 491b, and the conductor 491c are embedded.

The conductor 492a in contact with the conductor 491a, the conductor 492b in contact with the conductor 491b, and the conductor 492c in contact with the conductor 491c are over the insulator 469.

The insulators 464, 466, 468, 470, 472, 475, 402, 410, 408, 428, 465, 467, 469, and 498 may each be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 401 may be formed of, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator that has a function of blocking oxygen and impurities such as hydrogen is preferably included in at least one of the insulators 464, 466, 468, 470, 472, 475, 402, 410, 408, 428, 465, 467, 469, and 498. When an insulator that has a function of blocking oxygen and impurities such as hydrogen is placed near the transistor 3300, the electrical characteristics of the transistor 3300 can be stable.

An insulator with a function of blocking oxygen and impurities such as hydrogen may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used.

Each of the conductors 480a, 480b, 480c, 478a, 478b, 478c, 476a, 476b, 476c, 479a, 479b, 479c, 477a, 477b, 477c, 484a, 484b, 484c, 484d, 483a, 483b, 483c, 483d, 483e, 483f, 485a, 485b, 485c, 485d, 487a, 487b, 487c, 488a, 488b, 488c, 490a, 490b, 489a, 489b, 491a, 491b, 491c, 492a, 492b, 492c, 494, and 496 may have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may be used, for example, and a conductor containing aluminum, a conductor containing copper and titanium, a conductor containing copper and manganese, a conductor containing indium, tin, and oxygen, a conductor containing titanium and nitrogen, or the like may be used.

An oxide semiconductor is preferably used as the semiconductor 406b. However, silicon (including strained silicon), germanium, silicon germanium, silicon carbide, gallium arsenide, aluminum gallium arsenide, indium phosphide, gallium nitride, an organic semiconductor, or the like can be used in some cases.

As the insulators 406a and 406c, oxides containing one or more, or two or more elements other than oxygen included in the semiconductor 406b are preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

The source or drain of the transistor 3200 is electrically connected to the conductor that is one of the source and drain electrodes of the transistor 3300 through the conductor 480a, the conductor 478a, the conductor 476a, the conductor 479a, the conductor 477a, the conductor 484a, the conductor 483a, the conductor 485a, and the conductor 483e. The conductor 454 that is the gate electrode of the transistor 3200 is electrically connected to the conductor that is the other of the source and drain electrodes of the transistor 3300 through the conductor 480c, the conductor 478c, the conductor 476c, the conductor 479c, the conductor 477c, the conductor 484c, the conductor 483c, the conductor 485c, and the conductor 483f.

The capacitor 3400 includes the conductor 494 that is the one of the electrodes of the capacitor 3400 and electrically connected to one of the source and drain electrodes of the transistor 3300 through the conductor 483f, the conductor 485c, the conductor 487c, and the conductor 488c; the insulator 498; and the conductor 496 that is the other electrode of the capacitor 3400. The capacitor 3400 is preferably formed above or below the transistor 3300 because the semiconductor can be reduced in size.

For the structures of other components, the description of FIGS. 1A to 1C and the like can be referred to as appropriate.

Figure 29:
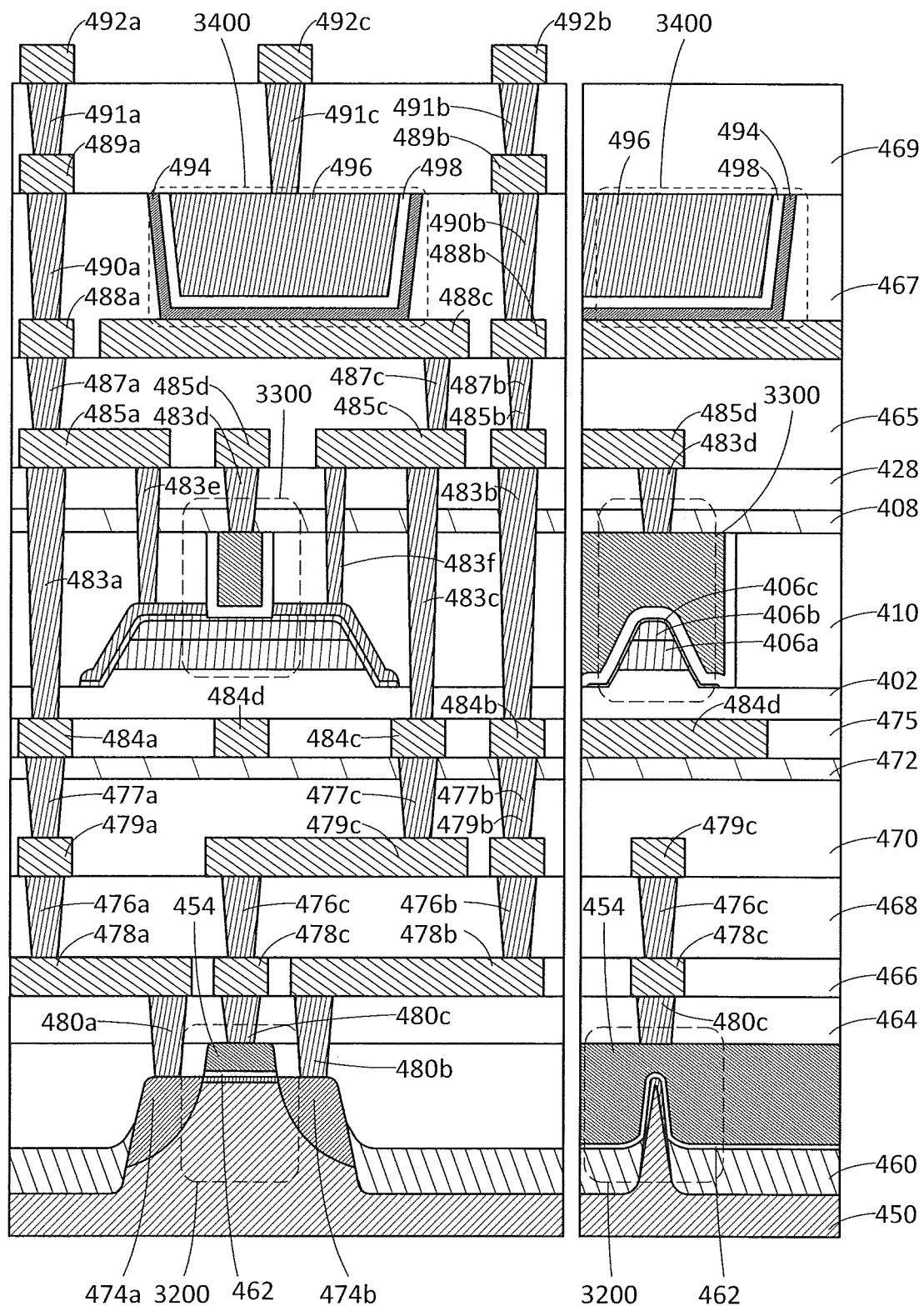
FIG. 29 is a cross-sectional view illustrating a semiconductor device of one embodiment of the present invention.

A semiconductor device in FIG. 29 is the same as the semiconductor device in FIG. 28 except the structure of the transistor 3200. Therefore, the description of the semiconductor device in FIG. 28 is referred to for the semiconductor device in FIG. 29. Specifically, in the semiconductor device in FIG. 29, the transistor 3200 is a FIN-type transistor. The effective channel width is increased in the FIN-type transistor 3200, whereby the on-state characteristics of the transistor 3200 can be improved. In addition, since contribution of the electric field of the gate electrode can be increased, the off-state characteristics of the transistor 3200 can be improved. Note that the transistor 3200 may be a p-channel transistor or an n-channel transistor.

Although an example in which the transistor 3300 is over the transistor 3200 and the capacitor 3400 is over the transistor 3300 is illustrated in this embodiment, one or more transistors including a semiconductor similar to the transistor 3300 may be provided over the transistor 3200. With such a structure, the degree of integration of the semiconductor device can be further increased.

<Memory Device 2>

The semiconductor device in FIG. 27B is different from the semiconductor device in FIG. 27A in that the transistor 3200 is not provided. Also in this case, data can be written and retained in a manner similar to that of the semiconductor device in FIG. 27A.

Reading of data in the semiconductor device in FIG. 27B is described. When the transistor 3300 is turned on, the third wiring 3003 that is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one of the electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved. At least part of this embodiment can be implemented in combination with any of the embodiments described in this specification as appropriate.

Embodiment 5

<Structure 2 of Semiconductor Device>

In this embodiment, an example of a circuit including the transistor of one embodiment of the present invention is described with reference to drawings.

<Cross-Sectional Structure>

Figure 30A:
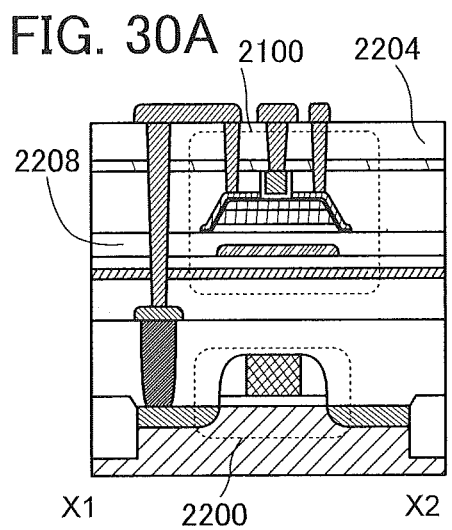
FIGS. 30A to 30F are cross sectional views and circuit diagrams of a semiconductor device of one embodiment of the present invention.
Figure 30B:
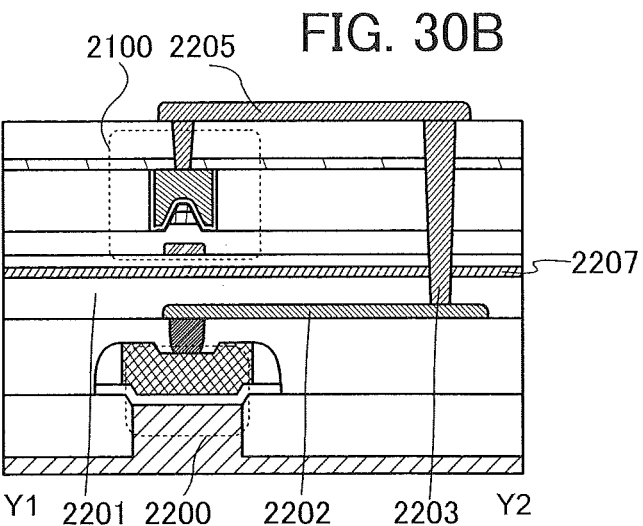

FIGS. 30A and 30B are cross-sectional views of a semiconductor device of one embodiment of the present invention. In FIG. 30A, X1-X2 direction represents a channel length direction, and in FIG. 30B, Y1-Y2 direction represents a channel width direction. The semiconductor device illustrated in FIGS. 30A and 30B includes a transistor 2200 containing a first semiconductor material in a lower portion and a transistor 2100 containing a second semiconductor material in an upper portion. In FIGS. 30A and 30B, an example is illustrated in which the transistor illustrated in FIGS. 1A to 1C is used as the transistor 2100 containing the second semiconductor material.

Here, the first semiconductor material and the second semiconductor material are preferably materials having different band gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. In contrast, a transistor using an oxide semiconductor and described in the above embodiment as an example has excellent sub-threshold characteristics and a minute structure. Furthermore, the transistor can operate at a high speed because of its high switching speed and has low leakage current because of its low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention that uses an oxide semiconductor.

FIGS. 30A and 30B illustrate a structure in which the transistor 2100 is provided over the transistor 2200 with an insulator 2201, an insulator 2207, and an insulator 2208 provided therebetween. A plurality of wirings 2202 are provided between the transistor 2200 and the transistor 2100. Furthermore, wirings and electrodes provided over and under the insulators are electrically connected to each other through a plurality of plugs 2203 embedded in the insulators. An insulator 2204 covering the transistor 2100 and a wiring 2205 over the insulator 2204 are provided. The stack of the two kinds of transistors reduces the area occupied by the circuit, allowing a plurality of circuits to be highly integrated.

Here, in the case where a silicon-based semiconductor material is used for the transistor 2200 provided in a lower portion, hydrogen in an insulator provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulator provided in the vicinity of the semiconductor film of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulator 2207 having a function of preventing diffusion of hydrogen is provided between the transistors 2100 and 2200. The insulator 2207 makes hydrogen remain in the lower portion, thereby improving the reliability of the transistor 2200. In addition, since the insulator 2207 suppresses diffusion of hydrogen from the lower portion to the upper portion, the reliability of the transistor 2100 also can be improved.

The insulator 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film having a function of preventing diffusion of hydrogen is preferably formed over the transistor 2100 to cover the transistor 2100 including an oxide semiconductor film. For the blocking film, a material that is similar to that of the insulator 2207 can be used, and in particular, an aluminum oxide film is preferably used. Using the aluminum oxide film, excess oxygen can be added to the insulator under the aluminum oxide film in the deposition, and the excess oxygen moves to the oxide semiconductor layer of the transistor 2100 by heat treatment, which has an effect of repairing a defect in the oxide semiconductor layer. The aluminum oxide film has a high shielding (blocking) effect of preventing penetration of both oxygen and impurities such as hydrogen and moisture. Thus, by using the aluminum oxide film as the blocking film covering the transistor 2100, release of oxygen from the oxide semiconductor film included in the transistor 2100 and entry of water and hydrogen into the oxide semiconductor film can be prevented. Note that as the block film, the insulator 2204 having a stacked-layer structure may be used, or the block film may be provided under the insulator 2204.

Note that the transistor 2200 can be a transistor of various types without being limited to a planar type transistor. For example, the transistor 2200 can be a fin-type transistor, a tri-gate transistor, or the like. An example of a cross-sectional view in this case is shown in FIGS. 30E and 30F. An insulator 2212 is provided over a semiconductor substrate 2211. The semiconductor substrate 2211 includes a projecting portion with a thin tip (also referred to a fin). Note that an insulator may be provided over the projecting portion. The insulator functions as a mask for preventing the semiconductor substrate 2211 from being etched when the projecting portion is formed. The projecting portion does not necessarily have the thin tip; a projecting portion with a cuboid-like projecting portion and a projecting portion with a thick tip are permitted, for example. A gate insulator 2214 is provided over the projecting portion of the semiconductor substrate 2211, and a gate electrode 2213 is provided over the gate insulator 2214. Source and drain regions 2215 are formed in the semiconductor substrate 2211. Note that here is shown an example in which the semiconductor substrate 2211 includes the projecting portion; however, a semiconductor device of one embodiment of the present invention is not limited thereto. For example, a semiconductor region having a projecting portion may be formed by processing an SOI substrate.

At least part of this embodiment can be implemented in combination with any of the embodiments described in this specification as appropriate.

Embodiment 6

[CMOS Circuit]

Figure 30C:
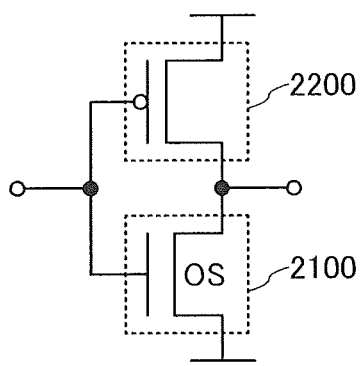

A circuit diagram in FIG. 30C shows a configuration of a so-called CMOS circuit in which a p-channel transistor 2200 and an n-channel transistor 2100 are connected to each other in series and in which gates of them are connected to each other.

[Analog Switch]

Figure 30D:
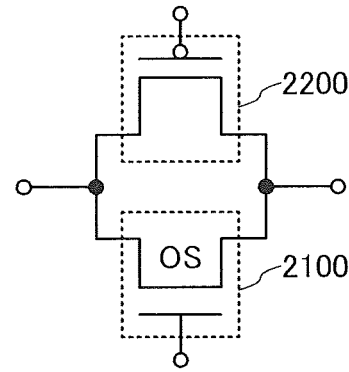
Figure 30E:
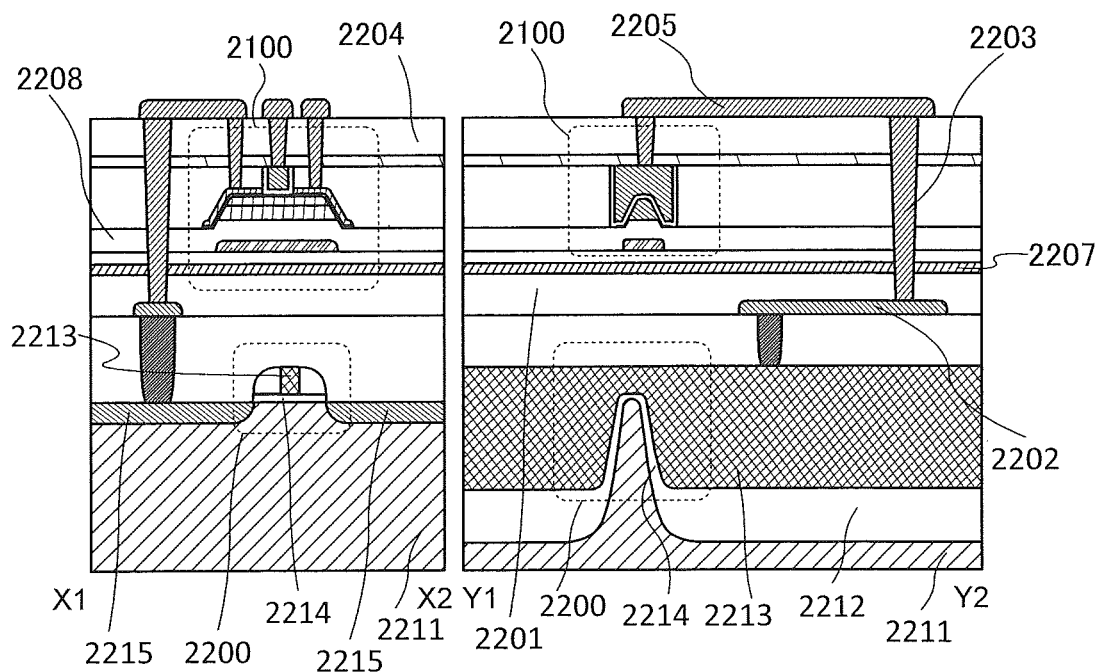
Figure 30F:
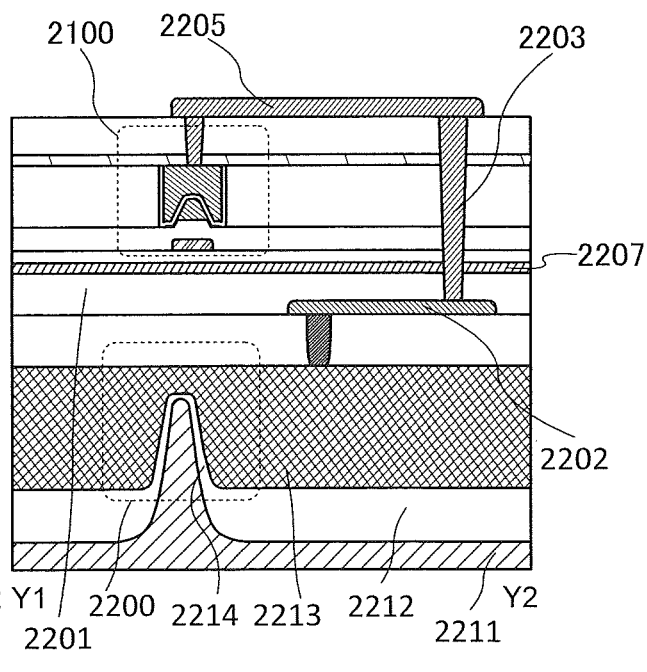

A circuit diagram in FIG. 30D shows a configuration in which sources of the transistors 2100 and 2200 are connected to each other and drains of the transistors 2100 and 2200 are connected to each other. With such a configuration, the transistors can function as a so-called analog switch. At least part of this embodiment can be implemented in combination with any of the embodiments described in this specification as appropriate.

Embodiment 7

<CPU>

A CPU including a semiconductor device such as any of the above-described transistors or the above-described memory device is described below.

Figure 31:
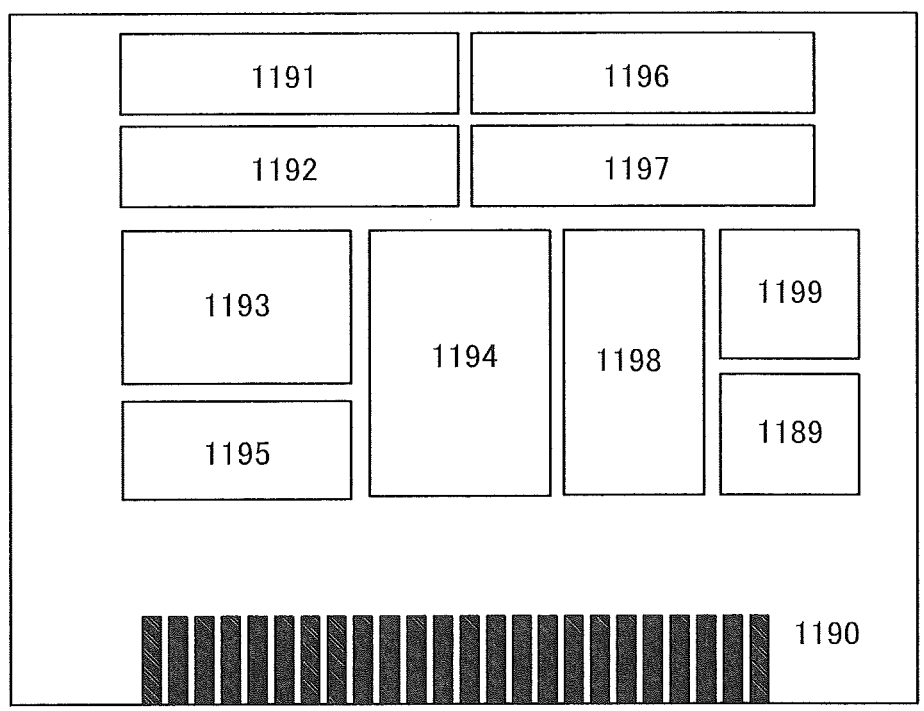
FIG. 31 is a block diagram illustrating a CPU of one embodiment of the present invention.

FIG. 31 is a block diagram illustrating a configuration example of a CPU including any of the above-described transistors as a component.

The CPU illustrated in FIG. 31 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189. A semiconductor substrate, an SOI substrate, a glass substrate, or the like is used as the substrate 1190. The rewritable ROM 1199 and the ROM interface 1189 may be provided over a separate chip. Needless to say, the CPU in FIG. 31 is just an example of a simplified structure, and an actual CPU may have a variety of structures depending on the application. For example, the CPU may have the following configuration: a structure including the CPU illustrated in FIG. 31 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

In the CPU illustrated in FIG. 31, a memory cell is provided in the register 1196. For the memory cell of the register 1196, any of the above-described transistors, the above-described memory device, or the like can be used.

In the CPU illustrated in FIG. 31, the register controller 1197 selects operation of retaining data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of the power supply voltage to the memory cell in the register 1196 can be stopped.

Figure 32:
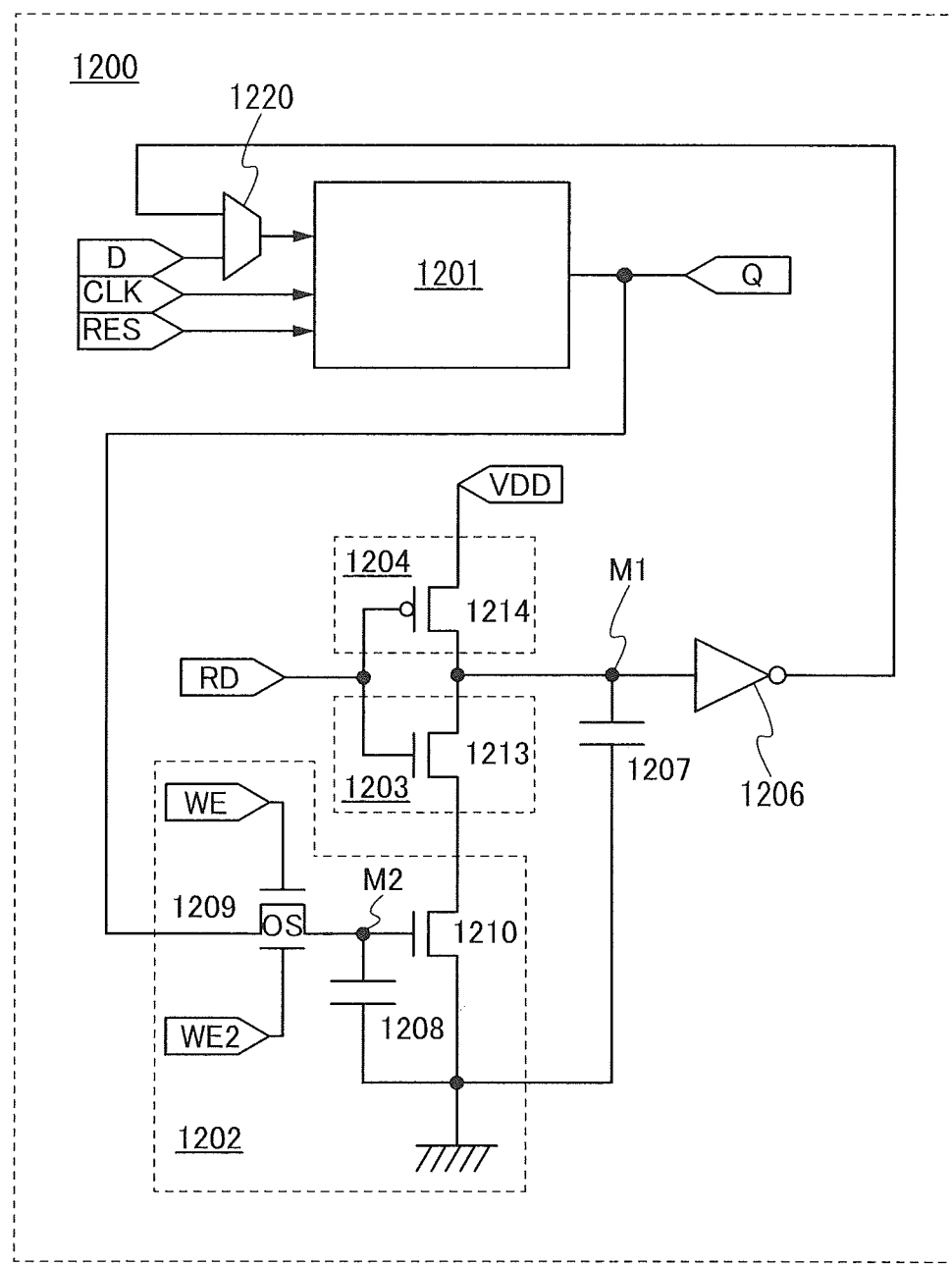
FIG. 32 is a circuit diagram of a memory element of one embodiment of the present invention.

FIG. 32 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line that can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line that can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line that can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the line that can supply a low power supply potential (e.g., a GND line).

The capacitor 1207 and the capacitor 1208 are not necessarily provided as long as the parasitic capacitance of the transistor, the line, or the like is actively utilized.

A control signal WE is input to a first gate (first gate electrode) of the transistor 1209. As for each of the switch 1203 and the switch 1204, a conduction state or a non-conduction state between the first terminal and the second terminal is selected by the control signal RD that is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 32 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 32, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 32, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor can be included besides the transistor 1209, and a transistor in which a channel is formed in a layer including a semiconductor other than an oxide semiconductor or the substrate 1190 can be used for the rest of the transistors.

As the circuit 1201 in FIG. 32, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 that is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the state of the transistor 1210 (the on state or the off state) is determined in accordance with the signal retained by the capacitor 1208, and the signal can be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although the memory element 1200 is used in a CPU in this embodiment, the memory element 1200 can also be used in an LSI such as a digital signal processor (DSP), a custom LSI, or a programmable logic device (PLD), and a radio frequency (RF) tag.

At least part of this embodiment can be implemented in combination with any of the embodiments described in this specification as appropriate.

Embodiment 8

<Imaging Device>

Figure 33A:
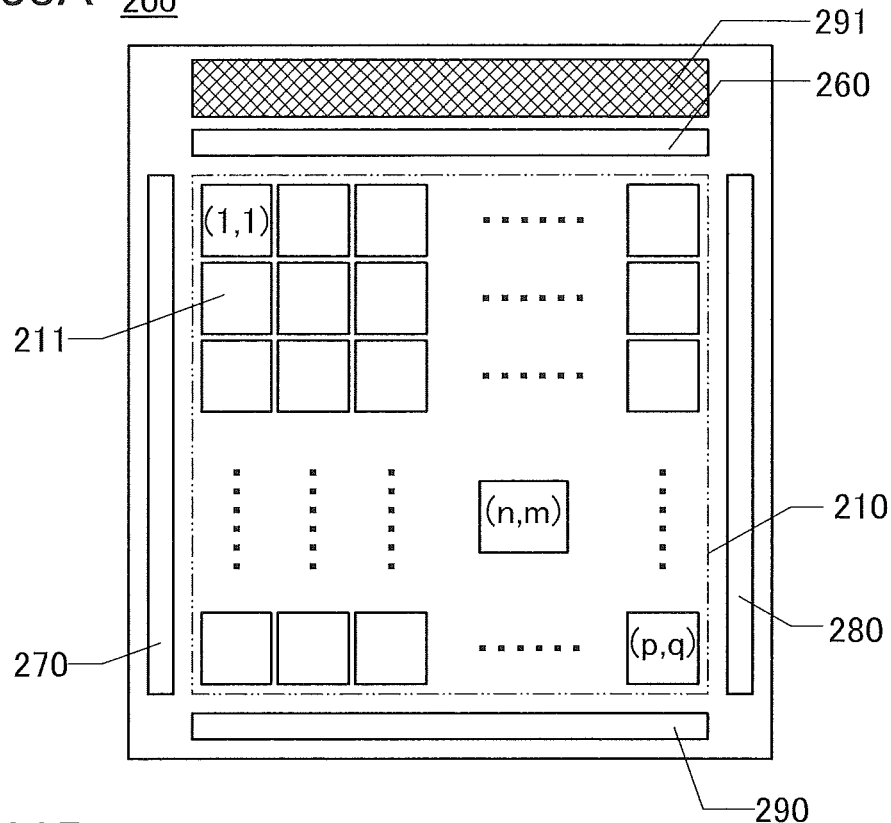
FIGS. 33A and 33B are plan views of an imaging device.

FIG. 33A is a top view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each a natural number greater than or equal to 2). The peripheral circuit 260, the peripheral circuit 270, the peripheral circuit 280, and the peripheral circuit 290 are each connected to a plurality of pixels 211, and a signal for driving the plurality of pixels 211 is supplied. In this specification and the like, in some cases, "a peripheral circuit" or "a driver circuit" indicates all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be provided over a substrate where the pixel portion 210 is formed. Alternatively, a semiconductor device such as an IC chip may be used as part or the whole of the peripheral circuit. Note that as the peripheral circuit, one or more of the peripheral circuits 260, 270, 280, and 290 may be omitted.

Figure 33B:
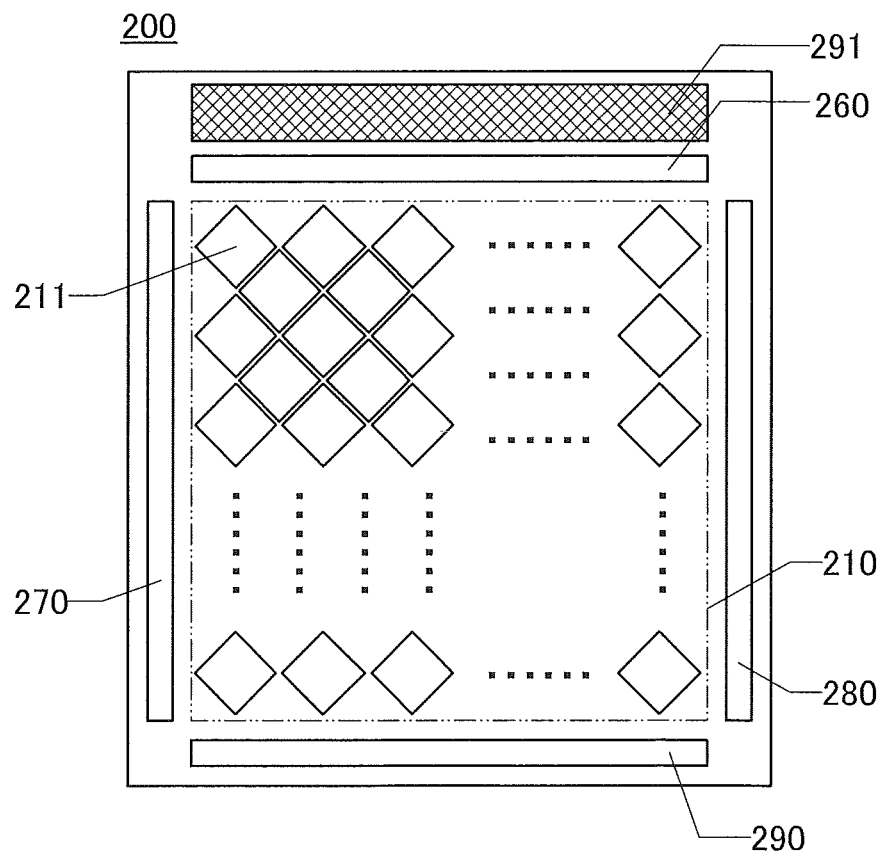

As illustrated in FIG. 33B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

Configuration Example 1 of Pixel

The pixel 211 included in the imaging device 200 is formed with a plurality of subpixels 212, and each subpixel 212 is combined with a filter that transmits light with a specific wavelength band (color filter), whereby data for achieving color image display can be obtained.

Figure 34A:
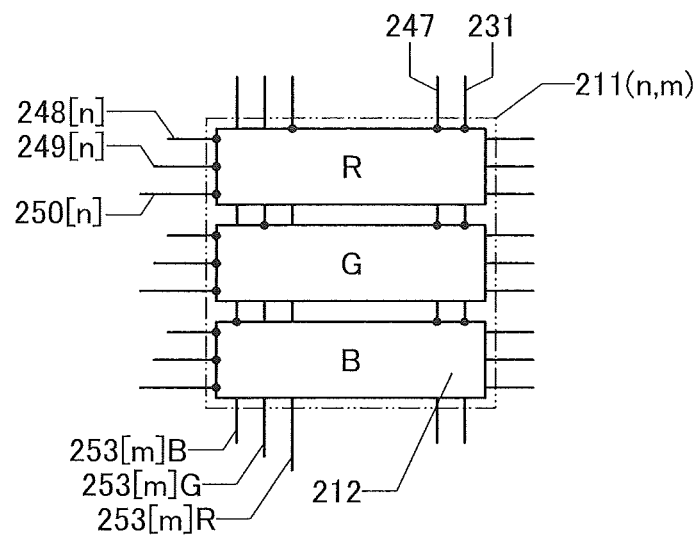
FIGS. 34A and 34B are plan views of pixels of an imaging device.

FIG. 34A is a top view showing an example of the pixel 211 with which a color image is obtained. The pixel 211 illustrated in FIG. 34A includes the subpixel 212 provided with a color filter that transmits light with a red (R) wavelength band (also referred to as a subpixel 212R), a subpixel 212 provided with a color filter that transmits light with a green (G) wavelength band (also referred to as a subpixel 212G), and a subpixel 212 provided with a color filter that transmits light with a blue (B) wavelength band (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 that are independent from one another. In this specification and the like, for example, the wiring 248, the wiring 249, and the wiring 250 that are connected to the pixel 211 in the n-th row are referred to as a wiring 248[n], a wiring 249[n], and a wiring 250[n], respectively. For example, the wiring 253 connected to the pixel 211 in the m-th column is referred to as a wiring 253[m]. Note that in FIG. 34A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B. The subpixels 212 are electrically connected to the peripheral circuit through the above wirings.

Figure 34B:
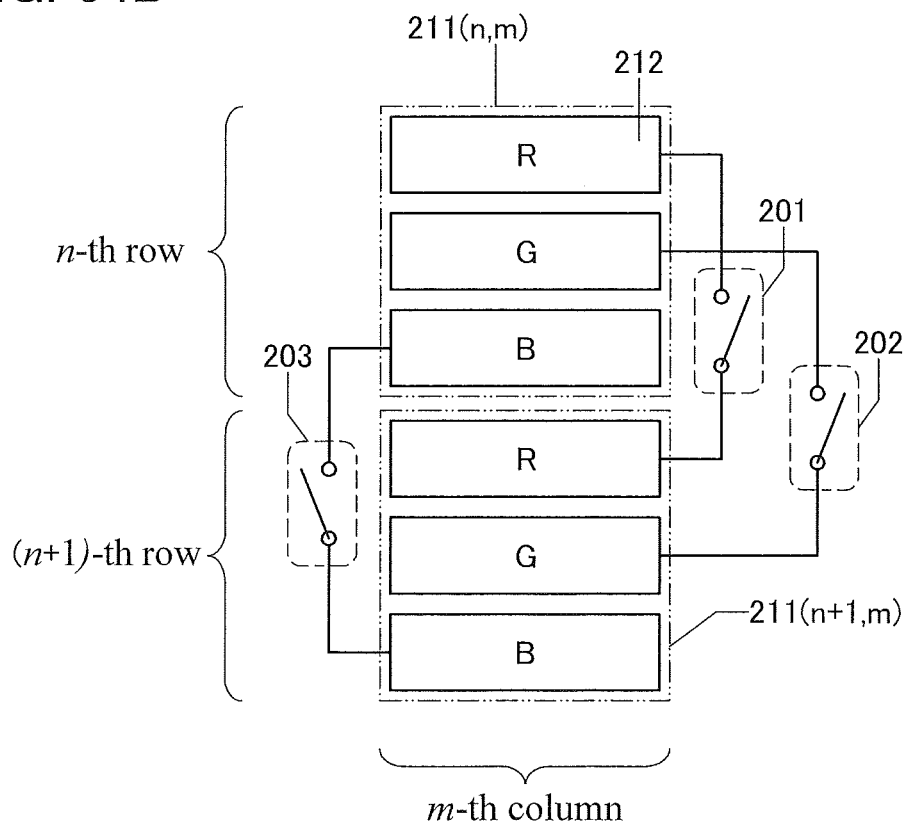

The imaging device 200 has a structure in which the subpixel 212 is electrically connected to the subpixel 212 in an adjacent pixel 211 that is provided with a color filter transmitting light with the same wavelength band as the subpixel 212, via a switch. FIG. 34B shows a connection example of the subpixels 212: the subpixel 212 in the pixel 211 arranged in an n-th (n is an integer greater than or equal to 1 and less than or equal to p) row and an in-th (in is an integer greater than or equal to 1 and less than or equal to q) column and the subpixel 212 in the adjacent pixel 211 arranged in an (n+1)-th row and the in-th column. In FIG. 34B, the subpixel 212R arranged in the n-th row and the in-th column and the subpixel 212R arranged in the (n+1)-th row and the nm-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light with three different wavelength bands in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light with four different wavelength bands are provided in one pixel 211, the reproducibility of colors of an obtained image can be increased.

For example, in FIG. 34A, in regard to the subpixel 212 sensing light in a red wavelength range, the subpixel 212 sensing light in a green wavelength range, and the subpixel 212 sensing light in a blue wavelength range, the pixel number ratio (or the light receiving area ratio) thereof is not necessarily 1:1:1. For example, it is possible to employ the Bayer arrangement, in which the ratio of the number of pixels (the ratio of light-receiving areas) is set to red:green:blue=1:2:1. Alternatively, the pixel number ratio (the ratio of light receiving area) of red and green to blue may be 1:6:1.

Although the number of subpixels 212 provided in the pixel 211 may be one, two or more subpixels are preferably provided. For example, when two or more subpixels 212 sensing light in the same wavelength range are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation that occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 35A and 35B. With the lens 255, the photoelectric conversion element provided in the subpixels 212 can receive incident light efficiently. Specifically, as illustrated in FIG. 35A, light 256 enters a photoelectric conversion element 220 through the lens 255, the filter 254 (a filter 254R, a filter 254G, and a filter 254B), a pixel circuit 230, and the like that are provided in the pixel 211.

However, part of the light 256 indicated by arrows might be blocked by some wirings 257 as indicated by a region surrounded with dashed-dotted lines. Thus, a preferable structure is such that the lens 255 and the filter 254 are provided on the photoelectric conversion element 220 side as illustrated in FIG. 35B, whereby the photoelectric conversion element 220 can efficiently receive the light 256. When the light 256 enters the photoelectric conversion element 220 from the photoelectric conversion element 220 side, the imaging device 200 with high sensitivity can be provided.

Figure 35A:
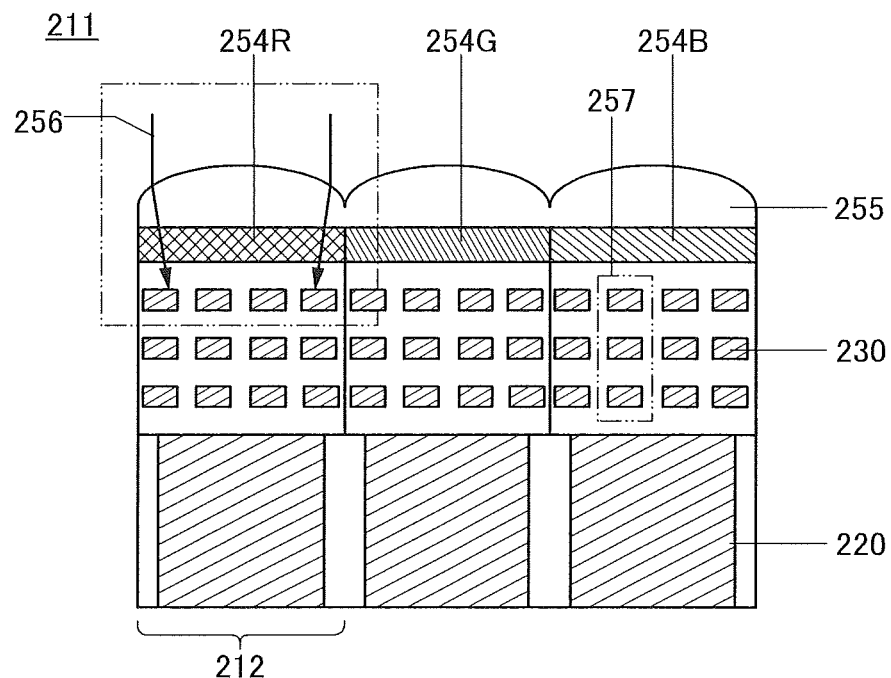
FIGS. 35A and 35B are cross-sectional views of an imaging device.
Figure 35B:
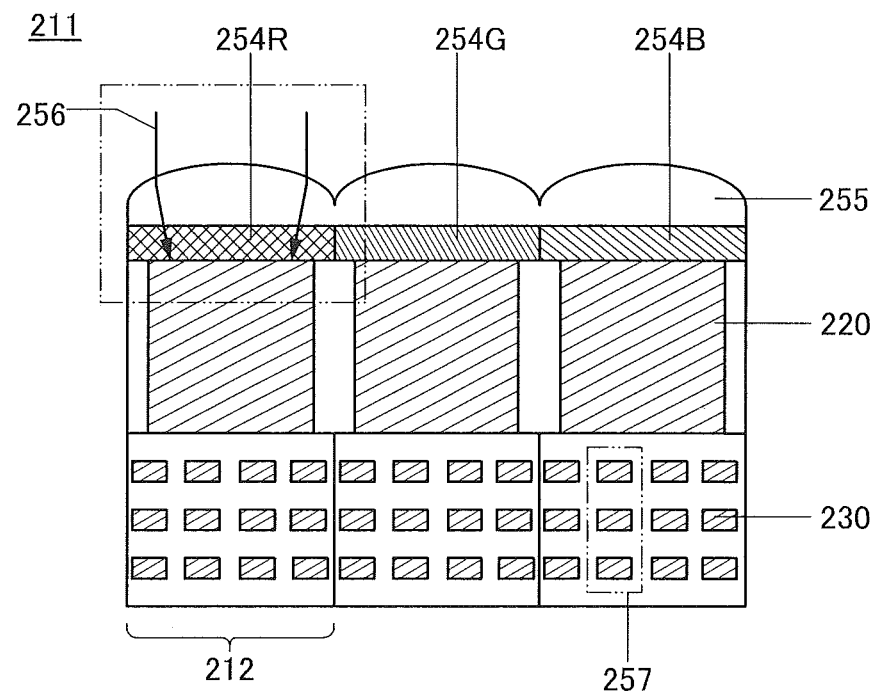

As the photoelectric conversion element 220 illustrated in FIGS. 35A and 35B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 220, the photoelectric conversion element 220 can have a light absorption coefficient in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 35A and 35B.

Configuration Example 2 of Pixel

An example of a pixel including a transistor using silicon and a transistor using an oxide semiconductor according to one embodiment of the present invention is described below.

Figure 36A:
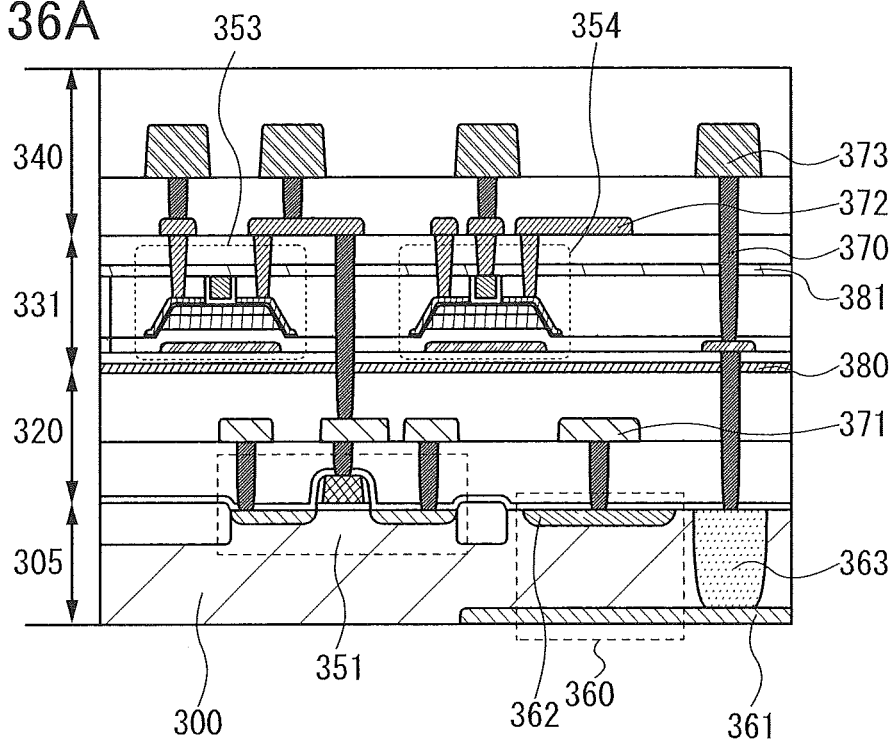
FIGS. 36A and 36B are cross-sectional views of an imaging device.
Figure 36B:
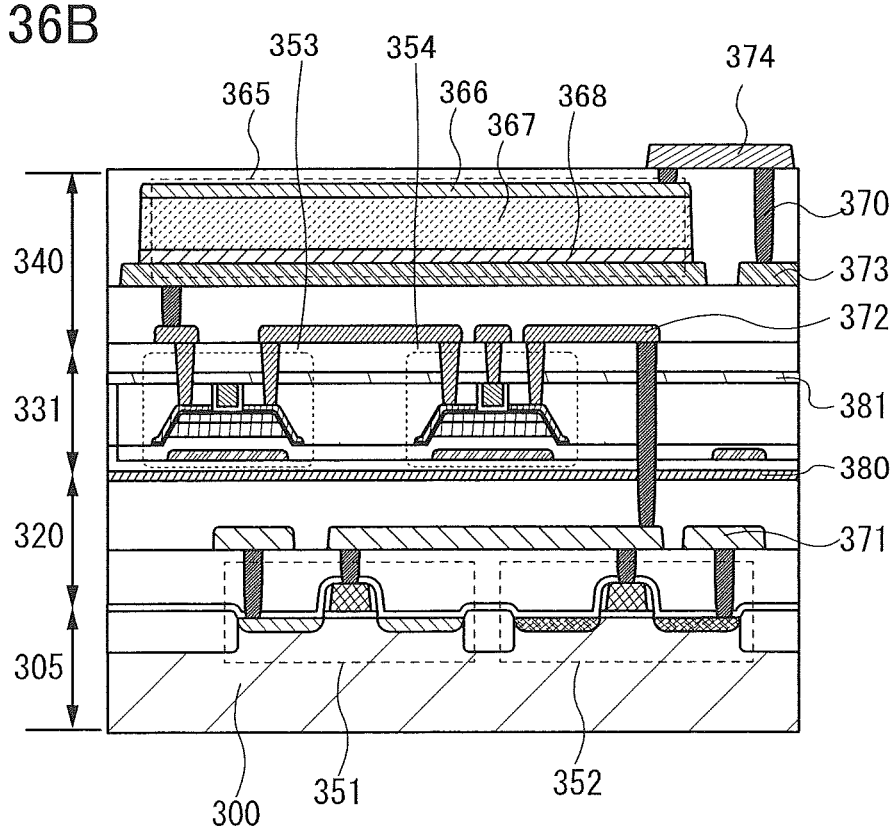

FIGS. 36A and 36B are each a cross-sectional view of an element included in an imaging device.

The imaging device illustrated in FIG. 36A includes a transistor 351 including silicon over a silicon substrate 300, transistors 353 and 354 that include an oxide semiconductor and are stacked over the transistor 351, and a photodiode 360 provided in the silicon substrate 300 and including an anode 361 and a cathode 362. The transistors and the photodiode 360 are electrically connected to various plugs 370 and wirings 371. In addition, an anode 361 of the photodiode 360 is electrically connected to the plug 370 through a low-resistance region 363.

The imaging device includes a layer 305 including the transistor 351 provided on the silicon substrate 300 and the photodiode 360 provided in the silicon substrate 300, a layer 320 that is in contact with the layer 305 and includes the wirings 371, a layer 331 that is in contact with the layer 320 and includes the transistors 353 and 354, and a layer 340 that is in contact with the layer 331 and includes a wiring 372 and a wiring 373.

Note that in the example of cross-sectional view in FIG. 36A, a light-receiving surface of the photodiode 360 is provided on the side opposite to a surface of the silicon substrate 300 where the transistor 351 is formed. With the structure, an optical path can be obtained without the influence by the transistors or wirings, and therefore, a pixel with a high aperture ratio can be formed. Note that the light-receiving surface of the photodiode 360 can be the same as the surface where the transistor 351 is formed.

In the case where a pixel is formed with use of only transistors using an oxide semiconductor, the layer 305 may include the transistor using an oxide semiconductor. Alternatively, the layer 305 may be omitted, and the pixel may include only transistors using an oxide semiconductor.

In addition, in the cross-sectional view in FIG. 36A, the photodiode 360 in the layer 305 and the transistor in the layer 331 can be formed so as to overlap with each other. Thus, the degree of integration of pixels can be increased. In other words, the resolution of the imaging device can be increased.

An imaging device shown in FIG. 36B includes a photodiode 365 in the layer 340 and over the transistor. In FIG. 36B, the layer 305 includes the transistor 351 and a transistor 352 using silicon, the layer 320 includes the wiring 371, the layer 331 includes the transistors 353 and 354 using an oxide semiconductor layer, the layer 340 includes the photodiode 365. The photodiode 365 includes a semiconductor layer 366, a semiconductor layer 367, and a semiconductor layer 368, and is electrically connected to the wiring 373 and a wiring 374 through the plug 370.

The element structure illustrated in FIG. 36B can increase the aperture ratio.

Alternatively, a PIN diode element formed using an amorphous silicon film, a microcrystalline silicon film, or the like may be used as the photodiode 365. In the photodiode 365, an n-type semiconductor layer 368, an i-type semiconductor layer 367, and a p-type semiconductor layer 366 are stacked in this order. The i-type semiconductor layer 367 is preferably formed using amorphous silicon. The p-type semiconductor layer 366 and the n-type semiconductor layer 368 can each be formed using amorphous silicon, microcrystalline silicon, or the like which includes a dopant imparting the corresponding conductivity type. A photodiode in which the photodiode 365 is formed using amorphous silicon has high sensitivity in a visible light wavelength region, and therefore can easily sense weak visible light.

Here, an insulator 380 is provided between the layer 305 including the transistor 351 and the photodiode 360 and the layer 331 including the transistors 353 and 354. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 353, the transistor 354, and the like becomes one of factors generating a carrier in the oxide semiconductor. Thus, the hydrogen may cause a reduction of the reliability of the transistor 353, the transistor 354, and the like. Therefore, in the case where the transistor using an oxide semiconductor is provided over the transistor using a silicon-based semiconductor, it is preferable that the insulator 380 having a function of blocking hydrogen be provided between the transistors. When the hydrogen is confined below the insulator 380, the reliability of the transistor 351 can be improved. In addition, the hydrogen can be prevented from being diffused from a part below the insulator 380 to a part above the insulator 380; thus, the reliability of the transistor 353, the transistor 354, and the like can be increased. It is preferable to form an insulator 381 over the transistors 353 and 354 because oxygen diffusion can be prevented in the oxide semiconductor.

At least part of this embodiment can be implemented in combination with any of the embodiments described in this specification as appropriate.

Embodiment 9

<RF Tag>

In this embodiment, an RF tag that includes the transistor described in the above embodiments or the memory device described in the above embodiment is described with reference to FIG. 37.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have extremely high reliability in order to be used for this purpose.

A configuration of the RF tag is described with reference to FIG. 37. FIG. 37 is a block diagram illustrating a configuration example of an RF tag.

Figure 37:
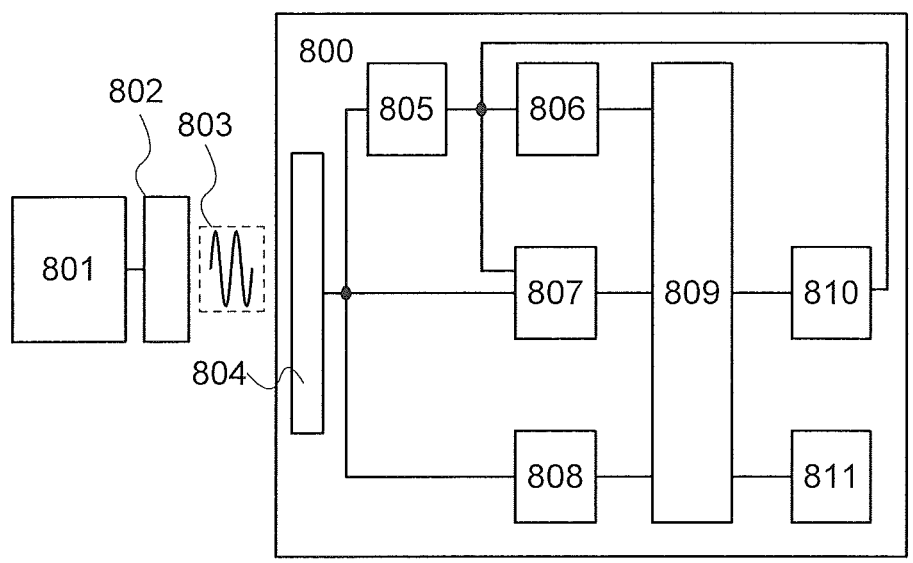
FIG. 37 illustrates a configuration example of an RF tag.

As shown in FIG. 37, an RF tag 800 includes an antenna 804 that receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material that enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, a structure of each circuit is described. The antenna 804 exchanges the radio signal 803 with the antenna 802 that is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power that is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit that generates a reset signal of the logic circuit 809 by utilizing rise of the stable power supply voltage.

The demodulation circuit 807 demodulates the input alternating signal by envelope detection and generates the demodulated signal. Furthermore, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Furthermore, the ROM 811 stores an identification number (ID) or the like and outputs it in accordance with processing.

Note that decision whether each circuit described above is provided or not can be made as appropriate as needed.

Here, the memory circuit described in the above embodiment can be used as the memory circuit 810. Since the memory circuit of one embodiment of the present invention can retain data even when not powered, the memory circuit can be favorably used for an RF tag. Furthermore, the memory circuit of one embodiment of the present invention needs power (voltage) needed for data writing significantly lower than that needed in a conventional nonvolatile memory; thus, it is possible to prevent a difference between the maximum communication range in data reading and that in data writing. Furthermore, it is possible to suppress malfunction or incorrect writing that is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

This embodiment can be combined as appropriate with any of the other embodiments in this specification.

Embodiment 10

<Display Device>

A display device of one embodiment of the present invention is described below with reference to FIGS. 38A to 38C and FIGS. 39A and 39B.

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as a flexible printed circuit (FPC) or a tape carrier package (TCP); a module in which a printed wiring board is provided at the end of TCP; and a module in which an integrated circuit (IC) is mounted directly on a display element by a chip on glass (COG) method.

Figure 38A:
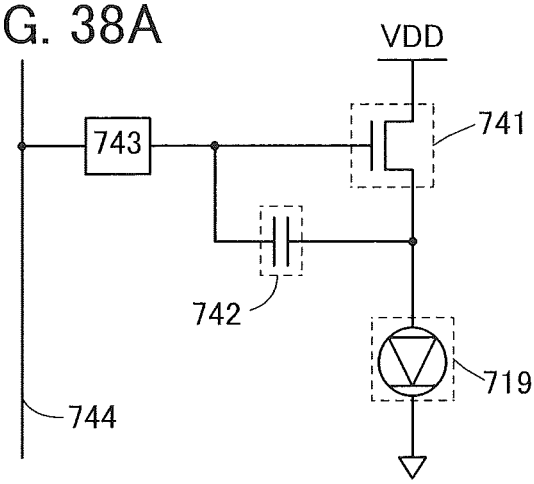
FIGS. 38A to 38C are a circuit diagram, a top view, and a cross-sectional view illustrating a semiconductor device of one embodiment of the present invention.
Figure 38B:
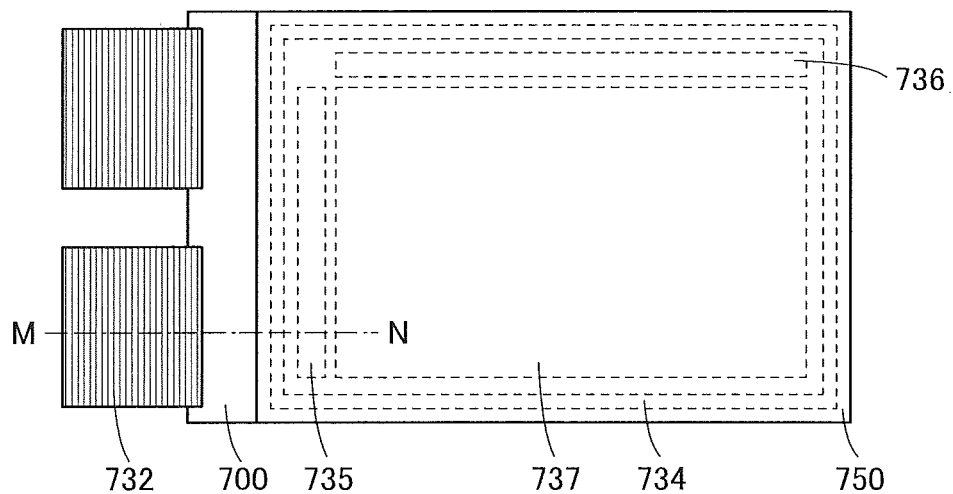
Figure 38C:
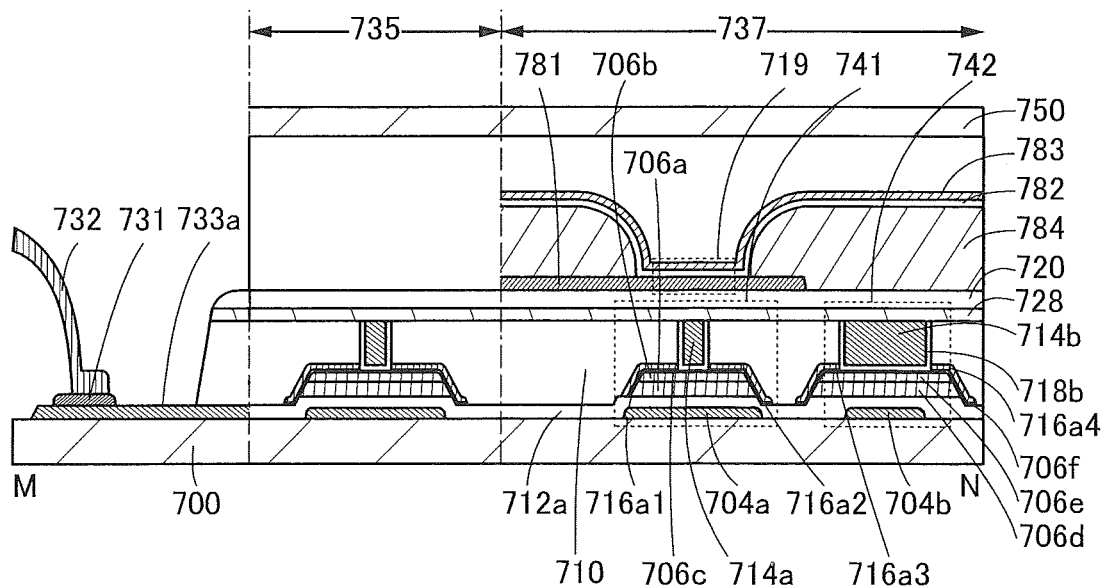

FIGS. 38A to 38C illustrate an example of an EL display device of one embodiment of the present invention. FIG. 38A is a circuit diagram of a pixel in an EL display device. FIG. 38B is a top view showing the whole of the EL display device. FIG. 38C is a cross-sectional view taken along part of dashed-dotted line M-N in FIG. 38B.

FIG. 38A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 38A includes a switching element 743, a transistor 741, a capacitor 742, and a light-emitting element 719.

Note that FIG. 38A and the like each illustrate an example of a circuit structure; therefore, a transistor can be provided additionally. In contrast, for each node in FIG. 38A and the like, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A power supply potential VDD is supplied to a drain of the transistor 741. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, the transistor illustrated in FIGS. 1A to 1C can be used, for example.

FIG. 38B is a top view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 38C is a cross-sectional view of the EL display device taken along part of dashed-dotted line M-N in FIG. 38B.

FIG. 38C illustrates a structure of the transistor 741 including an insulator 712a over the substrate 700; a conductor 704a; an insulator 706a that is over the insulator 712a and the conductor 704a and partly overlaps with the conductor 704a; a semiconductor 706b over the insulator 706a; an insulator 706c over the semiconductor 706b; conductors 716a1 and 716a2 in contact with a top surface of the insulator 706c; an insulator 710 over the conductors 716a1 and 716a2; an insulator 718b over the insulator 706c; and a conductor 714a that is over the insulator 718b and overlaps with the semiconductor 706b. Note that the structure of the transistor 741 is just an example; the transistor 741 may have a structure different from that illustrated in FIG. 38C.

In the transistor 741 illustrated in FIG. 38C, the conductor 704a serves as a gate electrode, the insulator 712a serves as a gate insulator, the conductor 716a1 serves as a source electrode, the conductor 716a2 serves as a drain electrode, the insulator 718b serves as a gate insulator, and the conductor 714a serves as a gate electrode. Note that in some cases, electrical characteristics of the insulator 706a, the semiconductor 706b, and the insulator 706c change if light enters the insulator 706a, the semiconductor 706b, and the insulator 706c. To prevent this, it is preferable that one or more of the conductor 704a, the conductor 716a1, the conductor 716a2, and the conductor 714a have a light-blocking property.

FIG. 38C illustrates a structure of the capacitor 742 including an insulator 706d that is over a conductor 704b over the substrate 700 and partly overlaps with the conductor 704b; a semiconductor 706e over the insulator 706d; an insulator 706f over the semiconductor 706e; conductors 716a3 and 716a4 in contact with a top surface of the insulator 706f; the insulator 710 over the conductors 716a3 and 716a4; the insulator 718b over the insulator 706f; and a conductor 714b that is over the insulator 718b and overlaps with the semiconductor 706e.

In the capacitor 742, the conductor 704b serves as one electrode and the conductor 714b serves as the other electrode.

The capacitor 742 can be formed using a film of the transistor 741. The conductor 704a and the conductor 704b are preferably conductors of the same kind, in which case the conductor 704a and the conductor 704b can be formed through the same step. Furthermore, the conductor 714a and the conductor 714b are preferably conductors of the same kind, in which case the conductor 714a and the conductor 714b can be formed through the same step.

The capacitor 742 illustrated in FIG. 38C has a large capacitance per area occupied by the capacitor. Therefore, the EL display device illustrated in FIG. 38C has high display quality. Note that the structure of the capacitor 742 is just an example and may be different from that illustrated in FIG. 38C.

An insulator 728 is provided over the transistor 741 and the capacitor 742, and an insulator 720 is provided over the insulator 728. Here, the insulator 728 and the insulator 720 may have an opening reaching the conductor 716a1 that serves as the source electrode of the transistor 741. A conductor 781 is provided over the insulator 720. The conductor 781 may be electrically connected to the transistor 741 through the opening in the insulator 728 and the insulator 720.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another serves as the light-emitting element 719. In FIG. 38C, the FPC 732 is connected to a wiring 733a via the terminal 731. Note that the wiring 733a may be formed using the same kind of conductor or semiconductor as the conductor or semiconductor included in the transistor 741.

So far, examples of the EL display device are described. Next, an example of a liquid crystal display device is described.

Figure 39A:
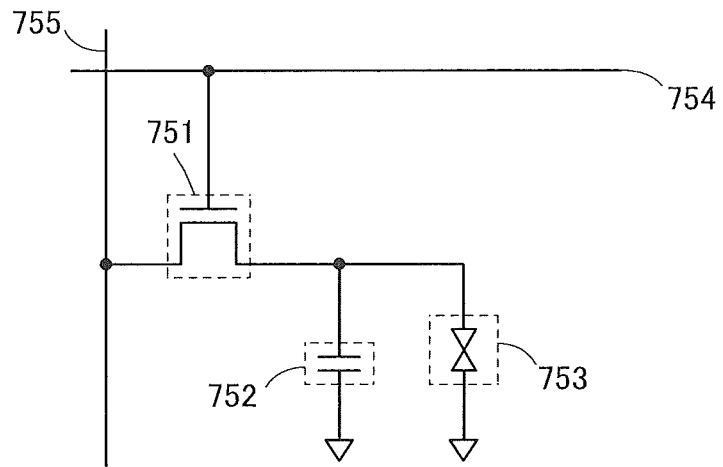
FIGS. 39A and 39B are a circuit diagram and a cross-sectional view illustrating a semiconductor device of one embodiment of the present invention.

FIG. 39A is a circuit diagram showing a structural example of a pixel of the liquid crystal display device. A pixel illustrated in FIG. 39A includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring for supplying a common potential.

One electrode of the liquid crystal element 753 is electrically connected to the other of the source and the drain of the transistor 751, and the other electrode of the liquid crystal element 753 is electrically connected to a wiring for supplying a common potential. The common potential supplied to the wiring electrically connected to the other electrode of the capacitor 752 may be different from that supplied to the other electrode of the liquid crystal element 753.

Figure 39B:
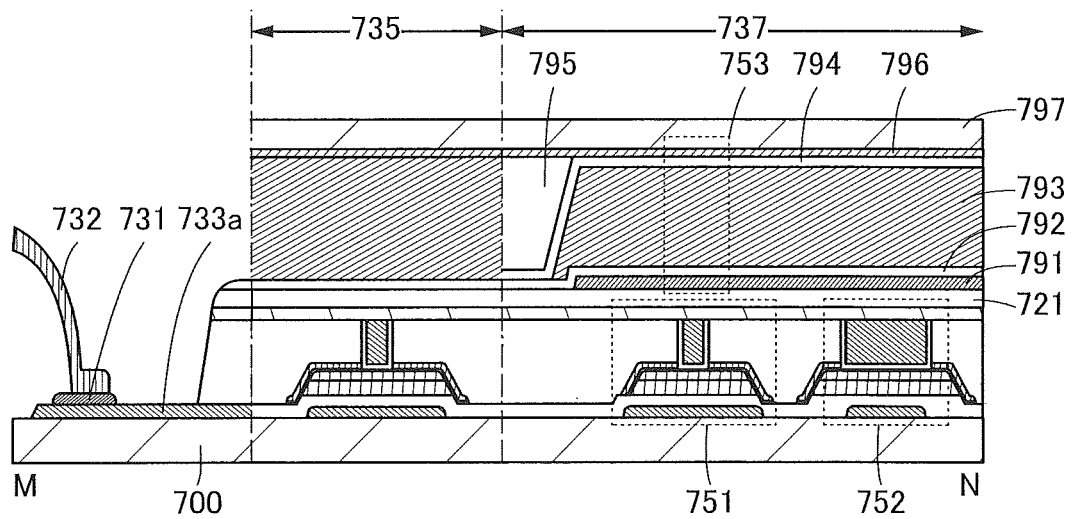

Note that the description of the liquid crystal display device is made on the assumption that the top view of the liquid crystal display device is similar to that of the EL display device. FIG. 39B is a cross-sectional view of the liquid crystal display device taken along dashed-dotted line M-N in FIG. 38B. In FIG. 39B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 39B corresponds to, but is not limited to, the structure of the capacitor 742 in FIG. 38C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

Owing to the above-described structure, a display device including a capacitor occupying a small area, a display device with high display quality, or a high-resolution display device can be provided.

For example, in this specification and the like, a display element, a display device that is a device including a display element, a light-emitting element, and a light-emitting device that is a device including a light-emitting element can employ various modes or can include various elements. The display element, the display device, the light-emitting element, or the light-emitting device includes at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, a display element including a carbon nanotube, and the like. Other than the above, display media whose contrast, luminance, reflectivity, transmittance, or the like is changed by electrical or magnetic effect may be included.

Note that examples of display devices having EL elements include an EL display Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display devices having electronic ink or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

This embodiment can be combined as appropriate with any of the other embodiments in this specification.

Embodiment 11

<Single Power Supply Circuit>

In this embodiment, examples of semiconductor devices including a plurality of circuits including the transistors including oxide semiconductor (OS transistors) described in the above embodiment are described with reference to FIGS. 40A to 40E, FIGS. 41A and 41B, FIGS. 42A and 42B, FIGS. 43A to 43C, FIGS. 44A and 44B, FIGS. 45A to 45C, and FIGS. 46A and 46B.

Figure 40A:
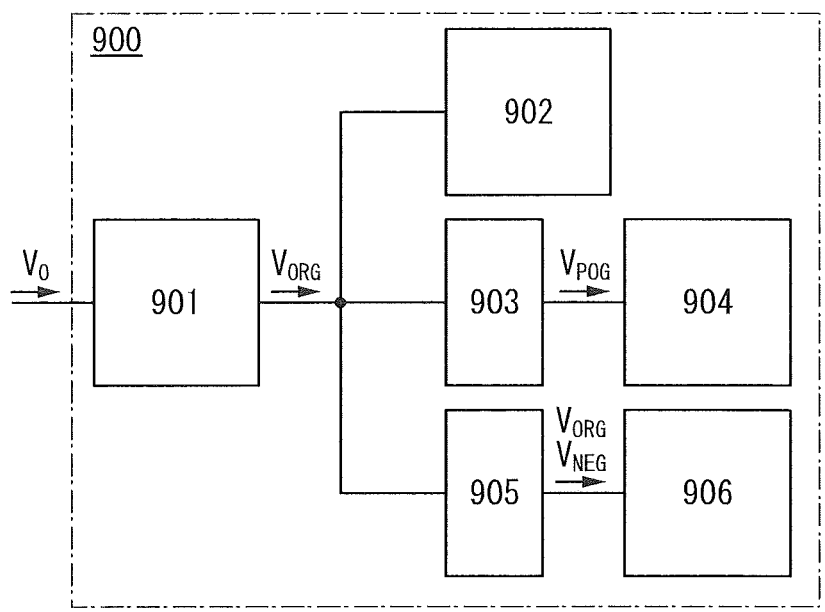
FIGS. 40A to 40E are a block diagram, circuit diagrams, and waveform diagrams illustrating one embodiment of the present invention.

FIG. 40A is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 900. The semiconductor device 900 can generate the voltage $V_{ORG}$ on the basis of one power supply voltage supplied from the outside. Therefore, the semiconductor device 900 can operate without supply of a plurality of power supply voltages from the outside.

The circuits 902, 904, and 906 operate with different power supply voltages. For example, the power supply voltage of the circuit 902 is a voltage applied on the basis of the voltage $V_{ORG}$ and the voltage $V_{SS}$ ($V_{ORG}$>$V_{SS}$). For example, the power supply voltage of the circuit 904 is a voltage applied on the basis of a voltage $V_{POG}$ and the voltage $V_{SS}$ ($V_{POG}$>$V_{ORG}$). For example, the power supply voltages of the circuit 906 are voltages applied on the basis of the voltage $V_{ORG}$, the voltage $V_{SS}$, and a voltage $V_{NEG}$ ($V_{ORG}$>$V_{SS}$>$V_{NEG}$). When the voltage $V_{SS}$ is equal to a ground potential (GND), the kinds of voltages generated in the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ supplied from the power supply circuit 901. Therefore, the semiconductor device 900 including the circuit 904 can operate with one power supply voltage supplied from the outside.

The voltage generation circuit 905 is a circuit that generates the voltage $V_{NEG}$. The voltage generation circuit 905 can generate the voltage $V_{NEG}$ on the basis of the voltage $V_{ORG}$ supplied from the power supply circuit 901. Therefore, the semiconductor device 900 including the circuit 906 can operate with one power supply voltage supplied from the outside.

Figure 40B:
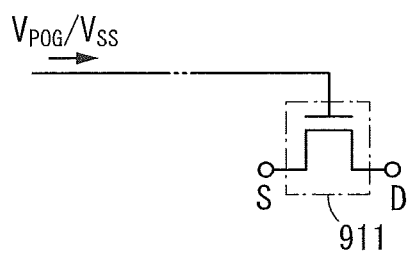
Figure 40C:
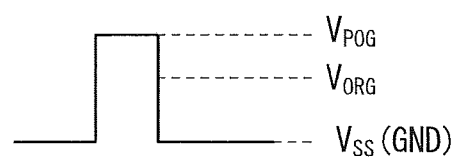

FIG. 40B illustrates an example of the circuit 904 that operates with the voltage $V_{POG}$ and FIG. 40C illustrates an example of a waveform of a signal for operating the circuit 904.

FIG. 40B illustrates a transistor 911. A signal supplied to a gate of the transistor 911 is generated on the basis of, for example, the voltage $V_{POG}$ and the voltage $V_{SS}$. The signal is generated on the basis of the voltage $V_{POG}$ at a time when the transistor 911 is turned on and on the basis of the voltage $V_{SS}$ at a time when the transistor 911 is turned off. As shown in FIG. 40C, the voltage $V_{POG}$ is higher than the voltage $V_{ORG}$. Therefore, a conduction state between a source (S) and a drain (D) of the transistor 911 can be obtained more surely. As a result, the frequency of malfunction of the circuit 904 can be reduced.

Figure 40D:
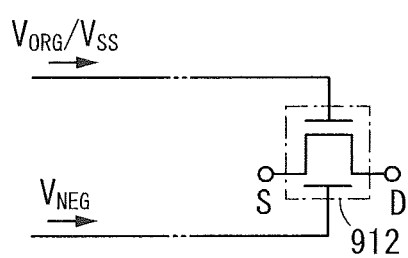
Figure 40E:
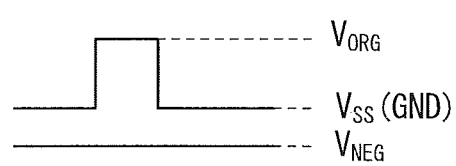

FIG. 40D illustrates an example of the circuit 906 that operates with the voltage $V_{NEG}$ and FIG. 40E illustrates an example of a waveform of a signal for operating the circuit 906.

FIG. 40D illustrates a transistor 912 having a back gate. A signal supplied to a gate of the transistor 912 is generated on the basis of, for example, the voltage $V_{ORG}$ and the voltage $V_{SS}$. The signal is generated on the basis of the voltage $V_{ORG}$ at a time when the transistor 912 is turned on and on the basis of the voltage $V_{SS}$ at a time when the transistor 912 is turned off. A signal supplied to the back gate of the transistor 912 is generated on the basis of the voltage $V_{NEG}$. As shown in FIG. 40E, the voltage $V_{NEG}$ is lower than the voltage $V_{SS}$ (GND). Therefore, the threshold voltage of the transistor 912 can be controlled to shift in the positive direction. Thus, the transistor 912 can be surely turned off and a current flowing between a source (S) and a drain (D) can be reduced. As a result, the frequency of malfunction of the circuit 906 can be reduced and power consumption thereof can be reduced.

The voltage $V_{NEG}$ may be directly supplied to the back gate of the transistor 912. Alternatively, a signal supplied to the gate of the transistor 912 may be generated on the basis of the voltage $V_{ORG}$ and the voltage $V_{NEG}$ and the generated signal may be supplied to the back gate of the transistor 912.

Figure 41A:
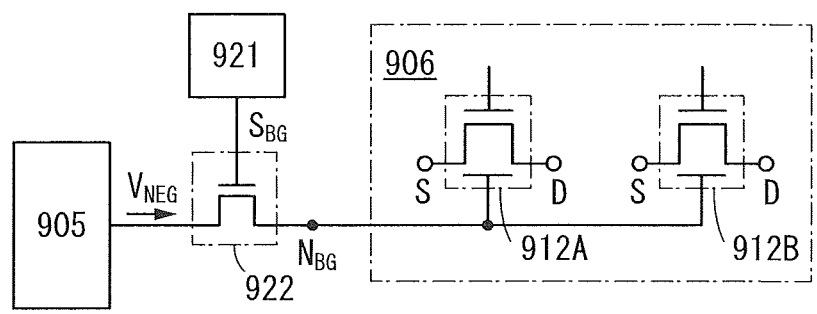
FIGS. 41A and 41B are a circuit diagram and a timing chart illustrating one embodiment of the present invention.
Figure 41B:
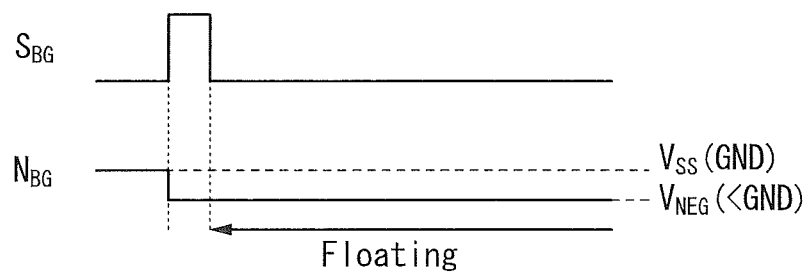

FIGS. 41A and 41B illustrate a modification example of FIGS. 40D and 40E.

In a circuit diagram illustrated in FIG. 41A, a transistor 922 whose conduction state can be controlled by a control circuit 921 is provided between the voltage generation circuit 905 and the circuit 906. The transistor 922 is an n-channel OS transistor. The control signal $S_{BG}$ output from the control circuit 921 is a signal for controlling conduction state of the transistor 922. Transistors 912A and 912B included in the circuit 906 are OS transistors like the transistor 922.

A timing chart in FIG. 41B shows changes in a potential of the control signal $S_{BG}$ and a potential of a node $N_{BG}$. The potential of the node $N_{BG}$ indicates the states of potentials of back gates of the transistors 912A and 912B. When the control signal $S_{BG}$ is at a high level, the transistor 922 is turned on and the voltage of the node $N_{BG}$ becomes the voltage $V_{NEG}$. Then, when the control signal $S_{BG}$ is at a low level, the node $N_{BG}$ is brought into an electrically floating state. Since the transistor 922 is an OS transistor, its off-state current is low. Accordingly, even when the node $N_{BG}$ is in an electrically floating state, the voltage $V_{NEG}$ which has been supplied can be held.

Figure 42A:
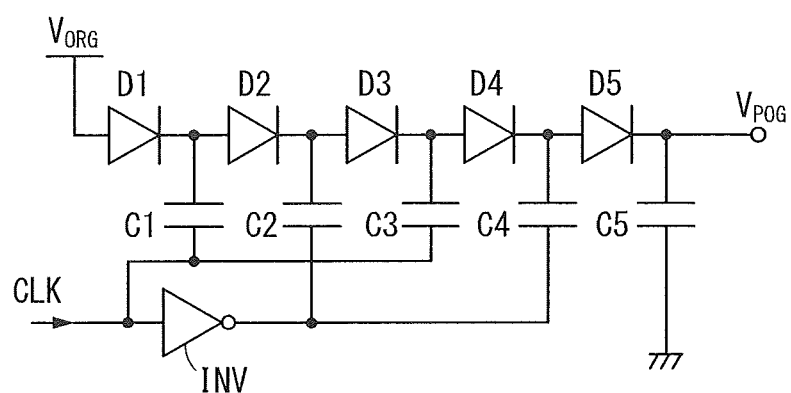
FIGS. 42A and 42B are circuit diagrams illustrating one embodiment of the present invention.

FIG. 42A illustrates an example of a circuit structure applicable to the above-described voltage generation circuit 903. The voltage generation circuit 903 illustrated in FIG. 42A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{POG}$ can be obtained by increasing the voltage $V_{ORG}$ by a voltage five times a potential difference between the voltage $V_{ORG}$ and the voltage $V_{SS}$ with the application of the clock signal CLK. Note that a forward voltage of the diodes D1 to D5 is 0 V. A desired voltage $V_{POG}$ can be obtained when the number of stages of the charge pump is changed.

Figure 42B:
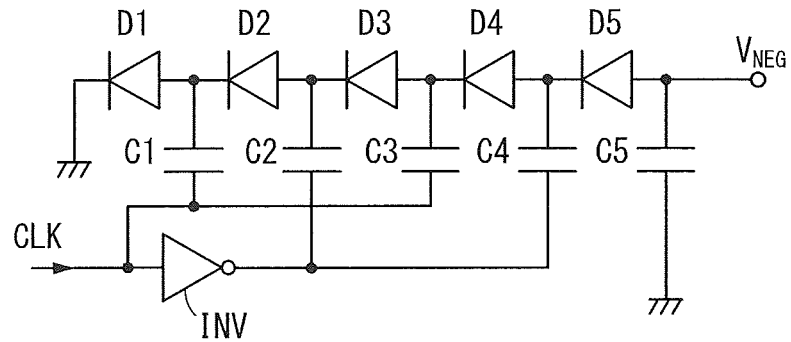

FIG. 42B illustrates an example of a circuit structure applicable to the above-described voltage generation circuit 905. The voltage generation circuit 905 illustrated in FIG. 42B is a four-stage charge pump including the diodes D1 to D5, the capacitors C1 to C5, and the inverter INV. The clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{NEG}$ can be obtained by decreasing the ground voltage, i.e., the voltage $V_{SS}$ by a voltage four times the potential difference between the voltage $V_{ORG}$ and the voltage $V_{SS}$ with the application of the clock signal CLK. Note that a forward voltage of the diodes D1 to D5 is 0 V. A desired voltage $V_{NEG}$ can be obtained when the number of stages of the charge pump is changed.

The circuit structure of the voltage generation circuit 903 is not limited to the structure of the circuit diagram illustrated in FIG. 42A. Modification examples of the voltage generation circuit 903 are shown in FIGS. 43A to 43C and FIGS. 44A and 44B.

Figure 43A:
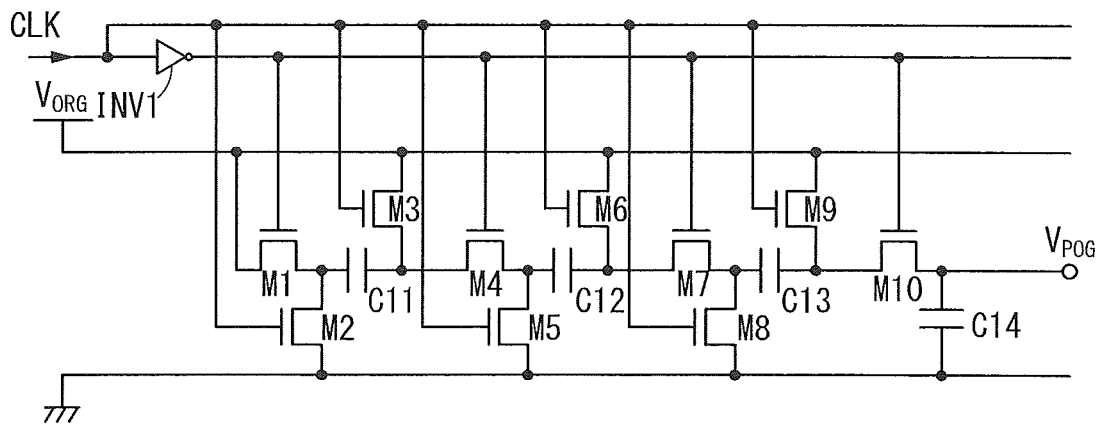
FIGS. 43A to 43C are circuit diagrams illustrating one embodiment of the present invention.

The voltage generation circuit 903A illustrated in FIG. 43A includes transistors M1 to M10, capacitors C11 to C14, and an inverter INV1. The clock signal CLK is supplied to gates of the transistors M1 to M10 directly or through the inverter INV1. The voltage $V_{POG}$ can be obtained by increasing the voltage $V_{ORG}$ by a voltage four times the potential difference between the voltage $V_{ORG}$ and the voltage $V_{SS}$ with the application of the clock signal CLK. A desired voltage $V_{POG}$ can be obtained when the number of stages is changed. In the voltage generation circuit 903A in FIG. 43A, off-state current of each of the transistors M1 to M10 can be low when the transistors M1 to M10 are OS transistors, and leakage of charge held in the capacitors C11 to C14 can be suppressed. Accordingly, raising from the voltage $V_{ORG}$ to the voltage $V_{POG}$ can be efficiently performed.

Figure 43B:
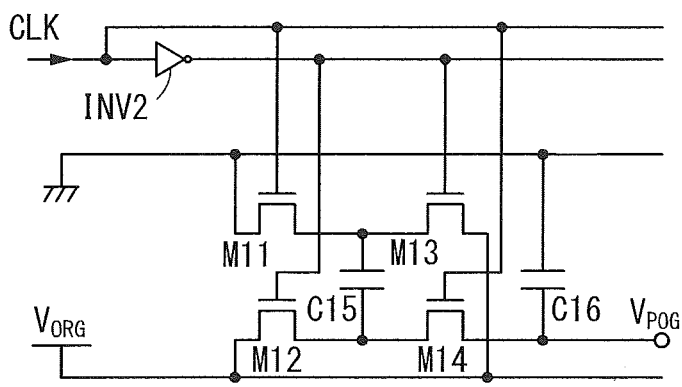

The voltage generation circuit 903B illustrated in FIG. 43B includes transistors M11 to M14, capacitors C15 and C16, and an inverter INV2. The clock signal CLK is supplied to gates of the transistors M11 to M14 directly or through the inverter INV2. The voltage $V_{POG}$ can be obtained by increasing the voltage $V_{ORG}$ by a voltage twice the potential difference between the voltage $V_{ORG}$ and the voltage $V_{SS}$ with the application of the clock signal CLK. In the voltage generation circuit 903B in FIG. 43B, off-state current of each of the transistors M11 to M14 can be low when the transistors M11 to M14 are OS transistors, and leakage of charge held in the capacitors C15 and C16 can be suppressed. Accordingly, raising from the voltage $V_{ORG}$ to the voltage $V_{POG}$ can be efficiently performed.

Figure 43C:
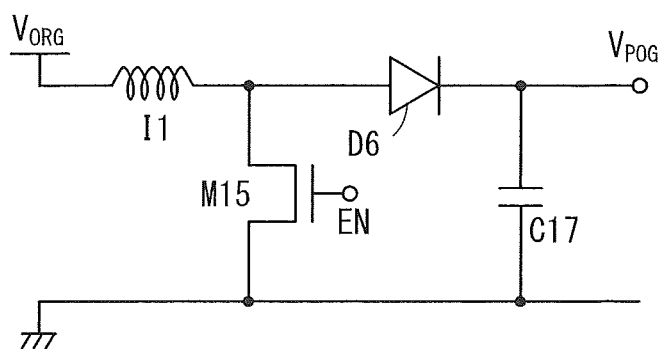

The voltage generation circuit 903C in FIG. 43C includes an inductor I1, a transistor M15, a diode D6, and a capacitor C17. The conduction state of the transistor M15 is controlled by a control signal EN. Owing to the control signal EN, the voltage $V_{POG}$ which is obtained by increasing the voltage $V_{ORG}$ can be obtained. Since the voltage generation circuit 903C in FIG. 43C increases the voltage using the inductor I1, the voltage can be increased efficiently.

Figure 44A:
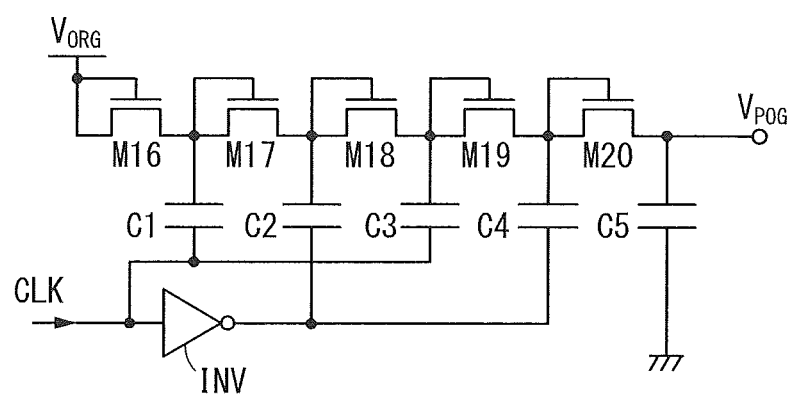
FIGS. 44A and 44B are circuit diagrams illustrating one embodiment of the present invention.

A voltage generation circuit 903D in FIG. 44A has a configuration in which the diodes D1 to D5 of the voltage generation circuit 903 in FIG. 42A are replaced with diode-connected transistors M16 to M20. In the voltage generation circuit 903D in FIG. 44A, when OS transistors are used as the transistors M16 to M20, the off-state current can be reduced, so that leakage of charge held in the capacitors C1 to C5 can be inhibited. Thus, efficient voltage increase from the voltage $V_{ORG}$ to the voltage $V_{POG}$ is possible.

Figure 44B:
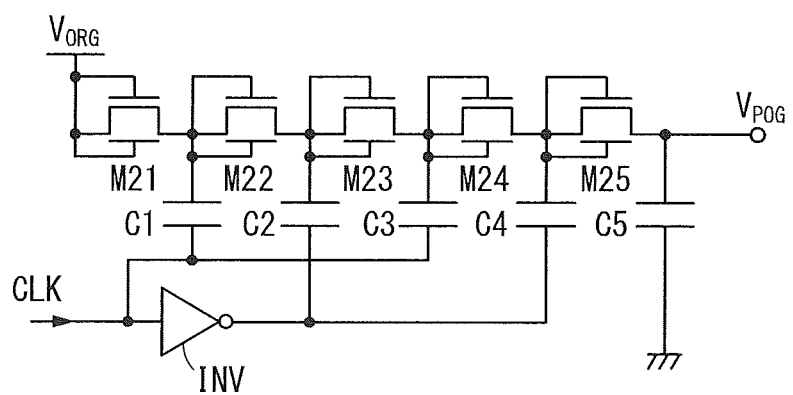

A voltage generation circuit 903E in FIG. 44B has a configuration in which the transistors M16 to M20 of the voltage generation circuit 903D in FIG. 44A are replaced with transistor M21 to M25 having back gates. In the voltage generation circuit 903E in FIG. 44B, the back gates can be supplied with voltages that are the same as those of the gates, so that the amount of current flowing through the transistors can be increased. Thus, efficient voltage increase from the voltage $V_{ORG}$ to the voltage $V_{POG}$ is possible.

Figure 45A:
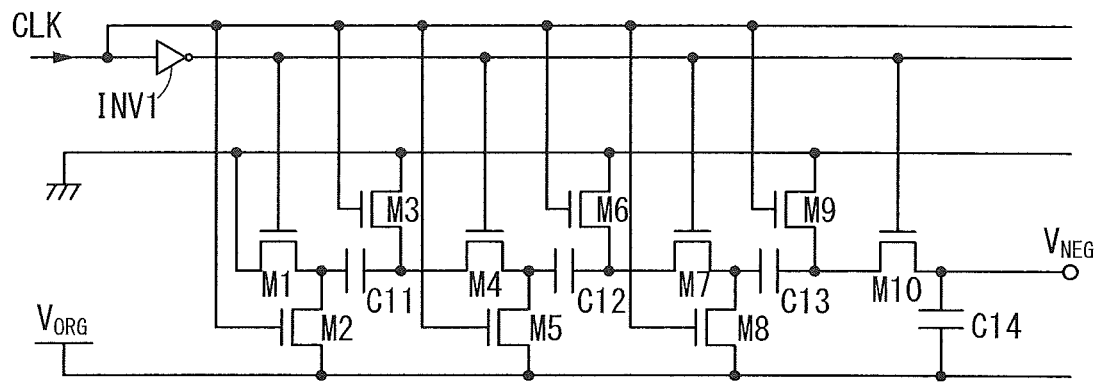
FIGS. 45A to 45C are circuit diagrams illustrating one embodiment of the present invention.
Figure 45B:
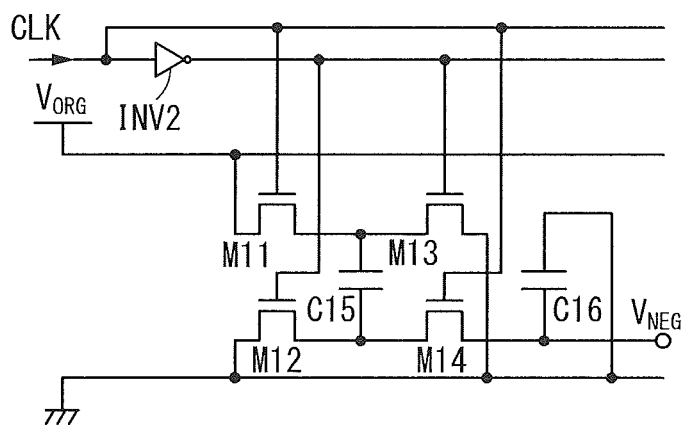
Figure 45C:
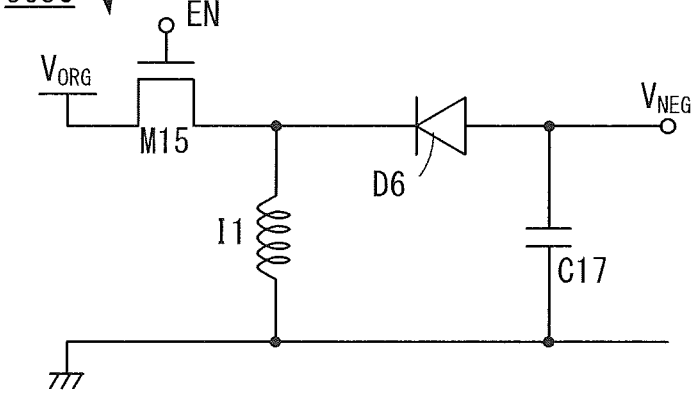
Figure 46A:
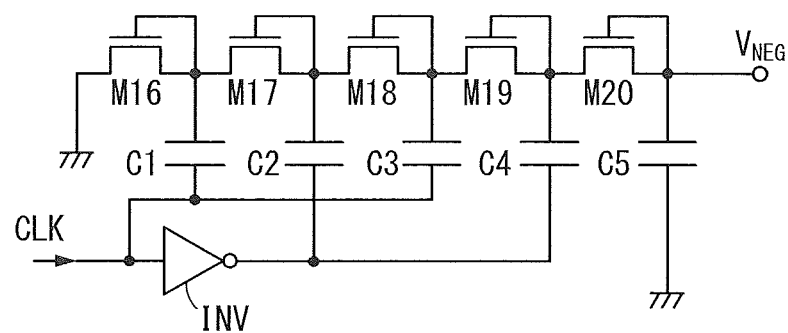
FIGS. 46A and 46B are circuit diagrams illustrating one embodiment of the present invention.
Figure 46B:
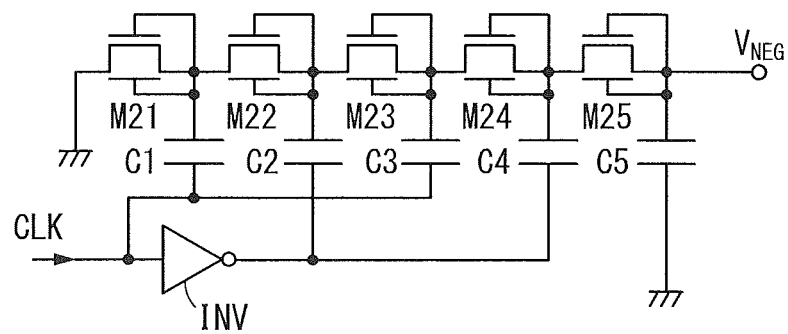

Note that the modification examples of the voltage generation circuit 903 can also be applied to the voltage generation circuit 905 in FIG. 42B. The configurations of a circuit diagram in this case are illustrated in FIGS. 45A to 45C and FIGS. 46A and 46B. When a voltage generation circuit 905A illustrated in FIG. 45A is supplied with the clock signal CLK, the voltage $V_{NEG}$ can be obtained by decreasing the voltage $V_{SS}$ by a voltage three times the potential difference between the voltage $V_{ORG}$ and the voltage $V_{SS}$. When a voltage generation circuit 905B illustrated in FIG. 45B is supplied with the clock signal CLK, the voltage $V_{NEG}$ can be obtained by decreasing the voltage $V_{SS}$ by a voltage twice the potential difference between the voltage $V_{ORG}$ and the voltage $V_{SS}$.

The voltage generation circuits 905A to 905E in FIGS. 45A to 45C and FIGS. 46A and 46B have configurations in which the voltage applied to each wiring or the arrangement of the elements are changed in the voltage generation circuits 903A to 903E in FIGS. 43A to 43C and FIGS. 44A and 44B. In the voltage generation circuits 905A to 905E in FIGS. 45A to 45C and FIGS. 46A and 46B, as in the voltage generation circuits 903A to 903E, efficient voltage decrease from the voltage $V_{SS}$ to the voltage $V_{NEG}$ is possible.

As described above, in any of the structures of this embodiment, a voltage required for circuits included in a semiconductor device can be internally generated. Thus, in the semiconductor device, the kinds of power supply voltages supplied from the outside can be reduced.

This embodiment can be combined as appropriate with any of the other embodiments in this specification.

Embodiment 12

In this embodiment, a display module using a semiconductor device of one embodiment of the present invention is described with reference to FIG. 47.

<Display Module>

Figure 47:
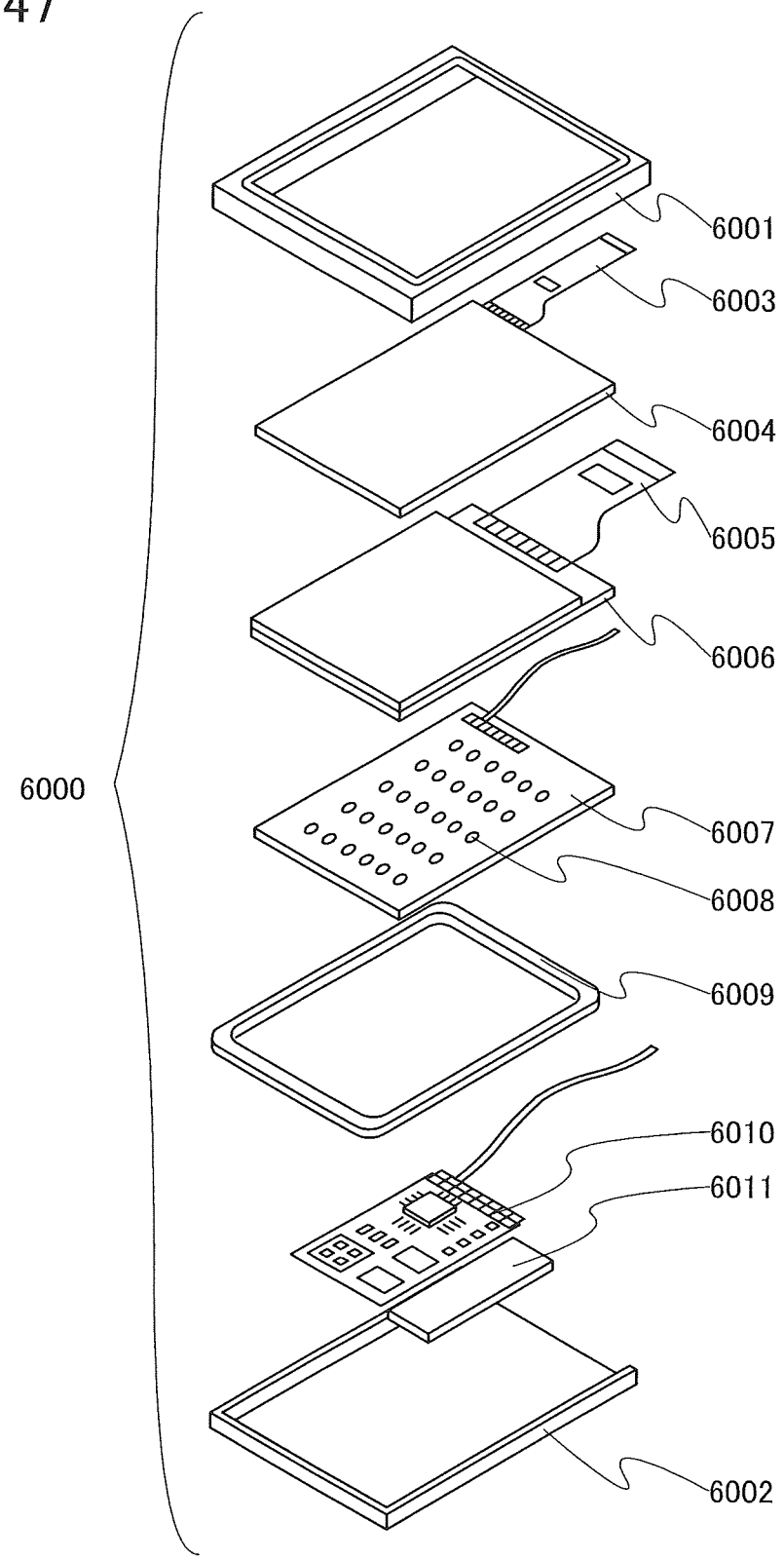
FIG. 47 illustrates a display module.

In a display module 6000 in FIG. 47, a touch panel 6004 connected to an FPC 6003, a display panel 6006 connected to an FPC 6005, a backlight unit 6007, a frame 6009, a printed board 6010, and a battery 6011 are provided between an upper cover 6001 and a lower cover 6002. Note that the backlight unit 6007, the battery 6011, the touch panel 6004, and the like are not provided in some cases.

The semiconductor device of one embodiment of the present invention can be used for the display panel 6006, an integrated circuit mounted on a printed circuit board, or the like.

The shapes and sizes of the upper cover 6001 and the lower cover 6002 can be changed as appropriate in accordance with the sizes of the touch panel 6004 and the display panel 6006.

The touch panel 6004 can be a resistive touch panel or a capacitive touch panel and may be formed to overlap with the display panel 6006. A counter substrate (sealing substrate) of the display panel 6006 can have a touch panel function. A photosensor may be provided in each pixel of the display panel 6006 so that an optical touch panel function is added. An electrode for a touch sensor may be provided in each pixel of the display panel 6006 so that a capacitive touch panel function is added.

The backlight unit 6007 includes a light source 6008. The light source 6008 may be provided at an end portion of the backlight unit 6007 and a light diffusing plate may be used.

The frame 6009 protects the display panel 6006 and also functions as an electromagnetic shield for blocking electromagnetic waves generated from the printed board 6010. The frame 6009 may function as a radiator plate.

The printed board 6010 has a power supply circuit and a signal processing circuit for outputting a video signal and a clock signal. As a power source for supplying power to the power supply circuit, an external commercial power source or the battery 6011 provided separately may be used. Note that the battery 6011 is not necessary in the case where a commercial power source is used.

The display module 6000 can be additionally provided with a member such as a polarizing plate, a retardation plate, or a prism sheet.

This embodiment can be combined as appropriate with any of the other embodiments in this specification.

Embodiment 13

<Package Using a Lead Frame Interposer>

Figure 48A:
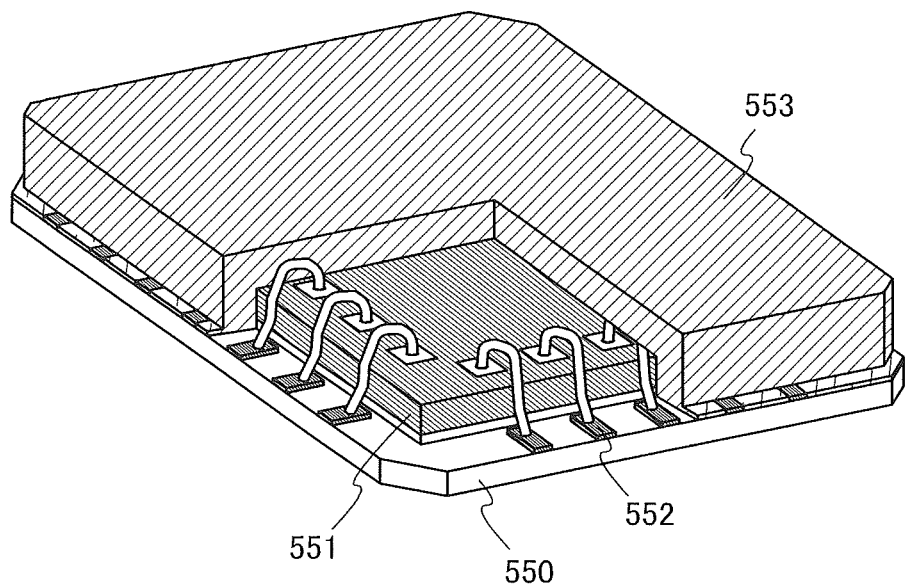
FIGS. 48A and 48B are a perspective view illustrating a cross-sectional structure of a package using a lead frame interposer and a plan view illustrating a structure of a module of a mobile phone.

FIG. 48A is a perspective view illustrating a cross-sectional structure of a package using a lead frame interposer. In the package illustrated in FIG. 48A, a chip 551 corresponding to the semiconductor device of one embodiment of the present invention is connected to a terminal 552 over an interposer 550 by wire bonding. The terminal 552 is placed on a surface of the interposer 550 on which the chip 551 is mounted. The chip 551 may be sealed by a mold resin 553, in which case the chip 551 is sealed such that part of each of the terminals 552 is exposed.

Figure 48B:
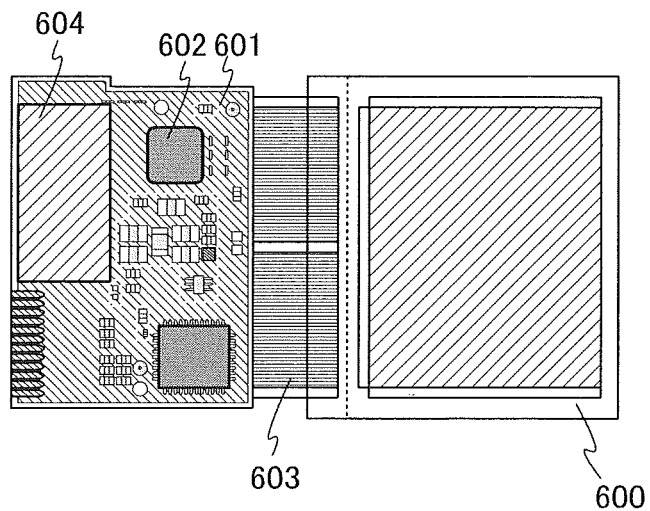

FIG. 48B illustrates the structure of a module of an electronic device (mobile phone) in which a package is mounted on a circuit board. In the module of the mobile phone in FIG. 48B, a package 602 and a battery 604 are mounted on a printed wiring board 601. The printed wiring board 601 is mounted on a panel 600 including a display element by an FPC 603.

This embodiment can be combined as appropriate with any of the other embodiments in this specification.

Embodiment 14

In this embodiment, electronic devices and lighting devices of one embodiment of the present invention are described with reference to drawings.

<Electronic Device>

Electronic devices and lighting devices can be fabricated using the semiconductor device of one embodiment of the present invention. In addition, highly reliable electronic devices and lighting devices can be fabricated using the semiconductor device of one embodiment of the present invention. Furthermore, electronic devices and lighting devices including touch sensors with improved detection sensitivity can be fabricated using the semiconductor device of one embodiment of the present invention.

Examples of electronic devices include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, a large game machine such as a pinball machine, and the like.

In the case of having flexibility, the electronic device or lighting device of one embodiment of the present invention can be incorporated along a curved inside/outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

As examples of the secondary battery, a lithium ion secondary battery such as a lithium polymer battery (lithium ion polymer battery) using a gel electrolyte, a lithium ion battery, a nickel-hydride battery, a nickel-cadmium battery, an organic radical battery, a lead-acid battery, an air secondary battery, a nickel-zinc battery, and a silver-zinc battery can be given.

The electronic device of one embodiment of the present invention may include an antenna. When a signal is received by the antenna, the electronic device can display an image, data, or the like on a display portion. When the electronic device includes a secondary battery, the antenna may be used for contactless power transmission.

Figure 49A:
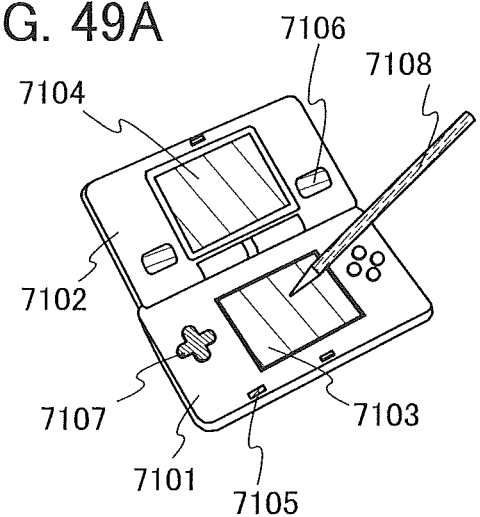
FIGS. 49A to 49E each illustrate an electronic device of one embodiment of the present invention.

FIG. 49A illustrates a portable game machine including a housing 7101, a housing 7102, a display portion 7103, a display portion 7104, a microphone 7105, speakers 7106, an operation key 7107, a stylus 7108, and the like. The semiconductor device of one embodiment of the present invention can be used for an integrated circuit, a CPU, or the like incorporated in the housing 7101. When the light-emitting device according of one embodiment of the present invention is used as the display portion 7103 or 7104, it is possible to provide a user-friendly portable game machine with quality that hardly deteriorates. Although the portable game machine illustrated in FIG. 49A includes two display portions, the display portion 7103 and the display portion 7104, the number of display portions included in the portable game machine is not limited to two.

Figure 49B:
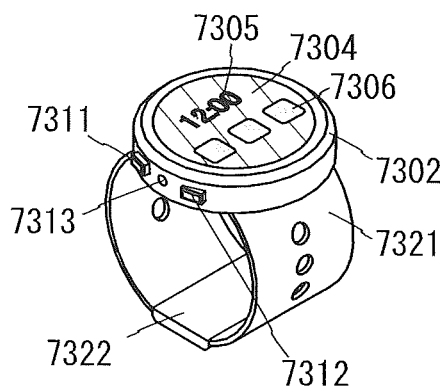

FIG. 49B illustrates a smart watch, which includes a housing 7302, display portions 7304, 7305, and 7306, operation buttons 7311 and 7312, a connection terminal 7313, a band 7321, a clasp 7322, and the like. The semiconductor device of one embodiment of the present invention can be used for a memory, a CPU, or the like incorporated in the housing 7302.

Figure 49C:
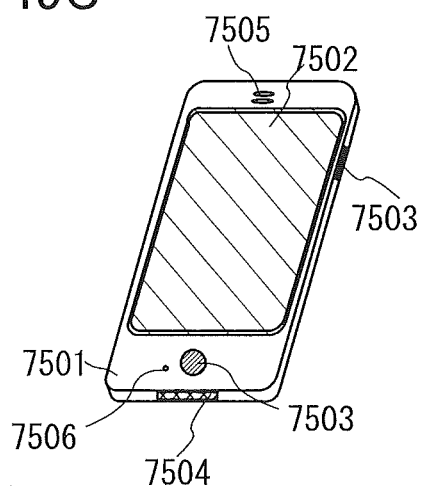

FIG. 49C illustrates a portable information terminal, which includes a display portion 7502 incorporated in a housing 7501, operation buttons 7503, an external connection port 7504, a speaker 7505, a microphone 7506, and the like. The semiconductor device of one embodiment of the present invention can be used for a mobile memory, a CPU, or the like incorporated in the housing 7501. Note that the display portion 7502 is small- or medium-sized but can perform full high vision, 4 k, or 8 k display because it has greatly high definition; therefore, a significantly clear image can be obtained.

Figure 49D:
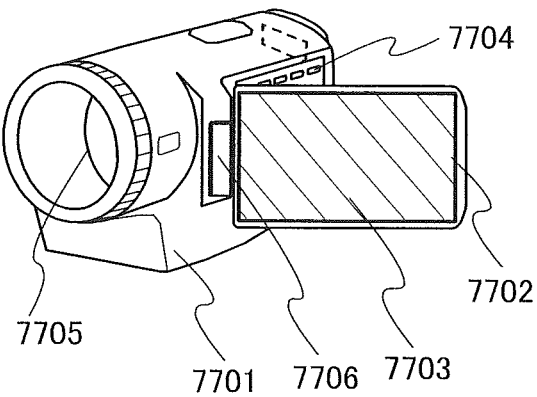

FIG. 49D illustrates a video camera, which includes a first housing 7701, a second housing 7702, a display portion 7703, operation keys 7704, a lens 7705, a joint 7706, and the like. The operation keys 7704 and the lens 7705 are provided for the first housing 7701, and the display portion 7703 is provided for the second housing 7702. The first housing 7701 and the second housing 7702 are connected to each other with the joint 7706, and the angle between the first housing 7701 and the second housing 7702 can be changed with the joint 7706. Images displayed on the display portion 7703 may be switched in accordance with the angle at the joint 7706 between the first housing 7701 and the second housing 7702. The imaging device in one embodiment of the present invention can be provided in a focus position of the lens 7705. The semiconductor device of one embodiment of the present invention can be used for an integrated circuit, a CPU, or the like incorporated in the first housing 7701.

Figure 49E:
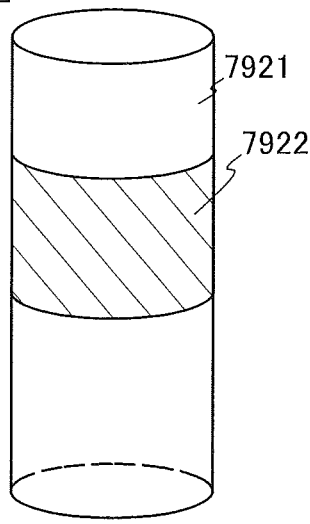

FIG. 49E illustrates a digital signage including a display portion 7922 provided on a utility pole 7921. The display device of one embodiment of the present invention can be used for a control circuit of the display portion 7922.

Figure 50A:
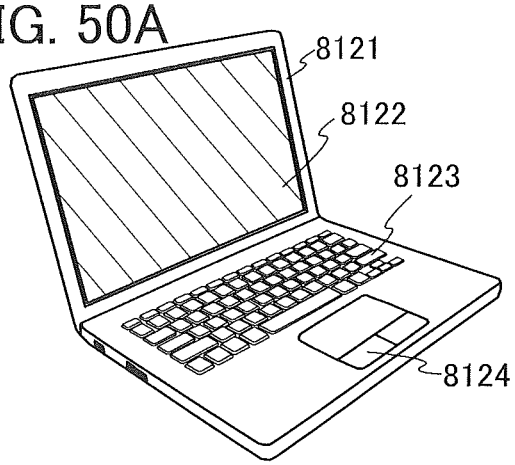
FIGS. 50A to 50D each illustrate an electronic device according to one embodiment of the present invention.

FIG. 50A illustrates a notebook personal computer, which includes a housing 8121, a display portion 8122, a keyboard 8123, a pointing device 8124, and the like. The semiconductor device of one embodiment of the present invention can be used for a CPU or a memory incorporated in the housing 8121. Note that the display portion 8122 is small- or medium-sized but can perform 8 k display because it has greatly high definition; therefore, a significantly clear image can be obtained.

Figure 50B:
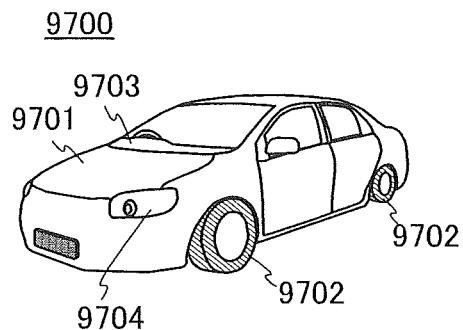
Figure 50C:
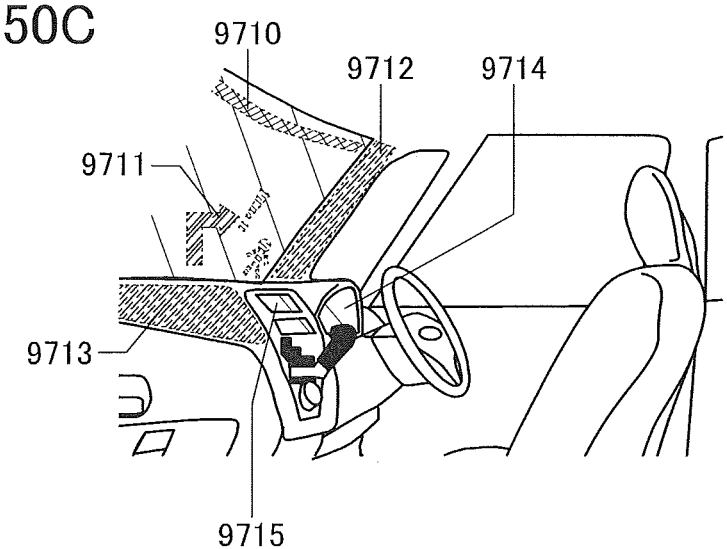

FIG. 50B is an external view of an automobile 9700. FIG. 50C illustrates a driver's seat of the automobile 9700. The automobile 9700 includes a car body 9701, wheels 9702, a dashboard 9703, lights 9704, and the like. The semiconductor device of one embodiment of the present invention can be used in a display portion and a control integrated circuit of the automobile 9700. For example, the semiconductor device of one embodiment of the present invention can be used in display portions 9710 to 9715 illustrated in FIG. 50C.

The display portion 9710 and the display portion 9711 are display devices or input/output devices provided in an automobile windshield. The display device or input/output device of one embodiment of the present invention can be a see-through display device or input/output device, through which the opposite side can be seen, by using a light-transmitting conductive material for its electrodes. Such a see-through display device or input/output device does not hinder driver's vision during the driving of the automobile 9700. Therefore, the display device or input/output device of one embodiment of the present invention can be provided in the windshield of the automobile 9700. Note that in the case where a transistor or the like for driving the display device or input/output device is provided in the display device or input/output device, a transistor having light-transmitting properties, such as an organic transistor using an organic semiconductor material or a transistor using an oxide semiconductor, is preferably used.

The display portion 9712 is a display device provided on a pillar portion. For example, an image taken by an imaging unit provided in the car body is displayed on the display portion 9712, whereby the view hindered by the pillar portion can be compensated. The display portion 9713 is a display device provided on the dashboard. For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Displaying an image to compensate for the area that a driver cannot see, makes it possible for the driver to confirm safety easily and comfortably.

Figure 50D:
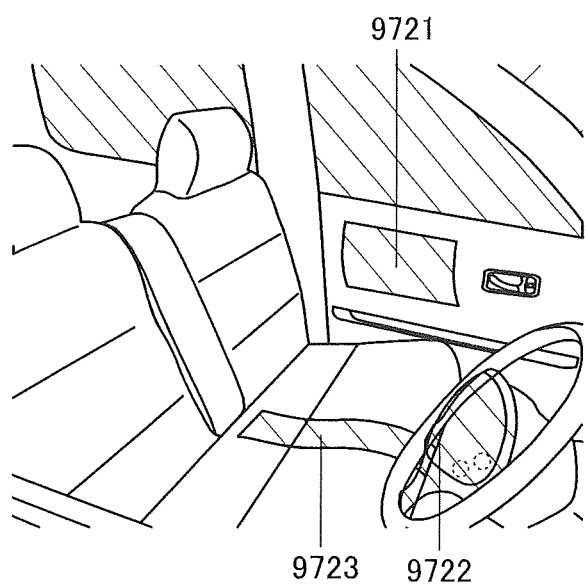

FIG. 50D illustrates the inside of a car in which a bench seat is used as a driver seat and a front passenger seat. A display portion 9721 is a display device or input/output device provided in a door portion. For example, an image taken by an imaging unit provided in the car body is displayed on the display portion 9721, whereby the view hindered by the door can be compensated. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portion 9714, the display portion 9715, and the display portion 9722 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

Figure 51A:
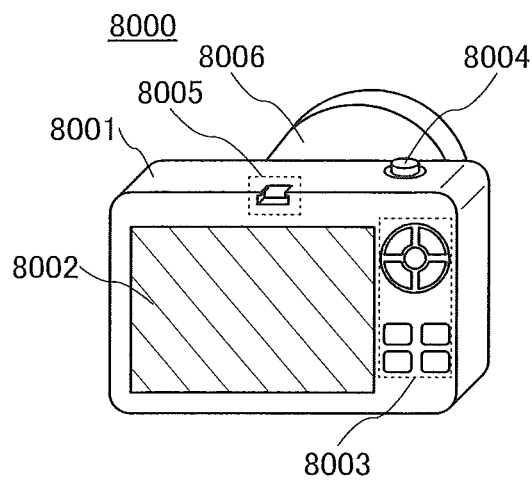
FIGS. 51A to 51C each illustrate an electronic device of one embodiment of the present invention.

FIG. 51A illustrates an external view of a camera 8000. The camera 8000 includes a housing 8001, a display portion 8002, an operation button 8003, a shutter button 8004, a connection portion 8005, and the like. A lens 8006 can be put on the camera 8000.

The connection portion 8005 includes an electrode to connect with a finder 8100, which is described below, a stroboscope, or the like.

Although the lens 8006 of the camera 8000 here is detachable from the housing 8001 for replacement, the lens 8006 may be included in a housing.

Images can be taken at the touch of the shutter button 8004. In addition, images can be taken at the touch of the display portion 8002 that serves as a touch panel.

The display device or input/output device of one embodiment of the present invention can be used in the display portion 8002.

Figure 51B:
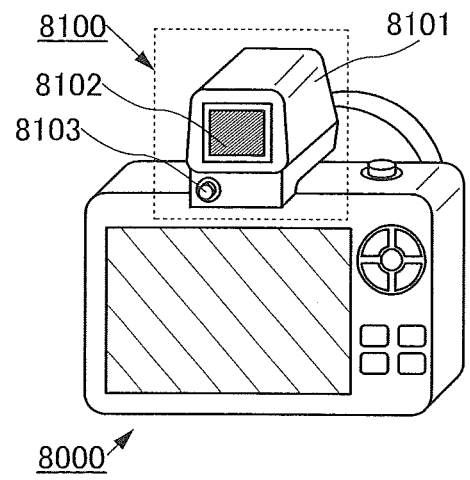

FIG. 51B shows the camera 8000 with the finder 8100 connected.

The finder 8100 includes a housing 8101, a display portion 8102, a button 8103, and the like.

The housing 8101 includes a connection portion for the camera 8000 and the connection portion 8005, and the finder 8100 can be connected to the camera 8000. The connection portion includes an electrode, and an image or the like received from the camera 8000 through the electrode can be displayed on the display portion 8102.

The button 8103 has a function of a power button, and the display portion 8102 can be turned on and off with the button 8103.

The semiconductor device of one embodiment of the present invention can be used for an integrated circuit and an image sensor included in the housing 8101.

Although the camera 8000 and the finder 8100 are separate and detachable electronic devices in FIGS. 51A and 51B, the housing 8001 of the camera 8000 may include a finder having the display device or input/output device of one embodiment of the present invention.

Figure 51C:
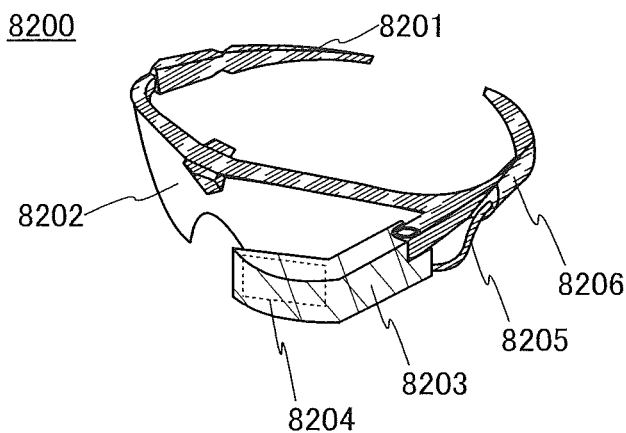

FIG. 51C illustrates an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. In addition, the movement of the eyeball and the eyelid of a user can be captured by a camera in the main body 8203 and then coordinates of the points the user looks at can be calculated using the captured data to utilize the eye of the user as an input means.

The mounting portion 8201 may include a plurality of electrodes to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The semiconductor device of one embodiment of the present invention can be used for an integrated circuit included in the main body 8203.

At least part of this embodiment can be implemented in combination with any of the embodiments described in this specification as appropriate.

Embodiment 15

In this embodiment, application examples of an RF tag using the semiconductor device of one embodiment of the present invention are described with reference to FIGS. 52A to 52F.

APPLICATION EXAMPLES OF RF TAG

Figure 52A:
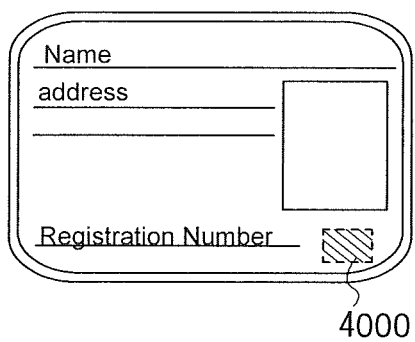
FIGS. 52A to 52F illustrate application examples of an RF tag of one embodiment of the present invention.
Figure 52B:
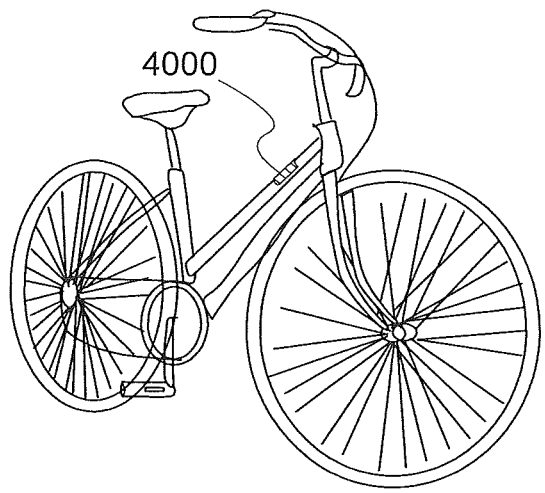
Figure 52C:
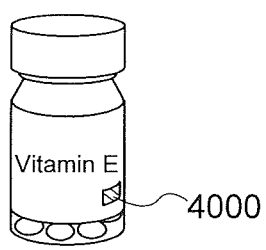
Figure 52D:
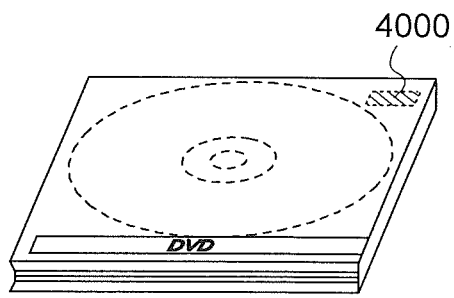
Figure 52E:
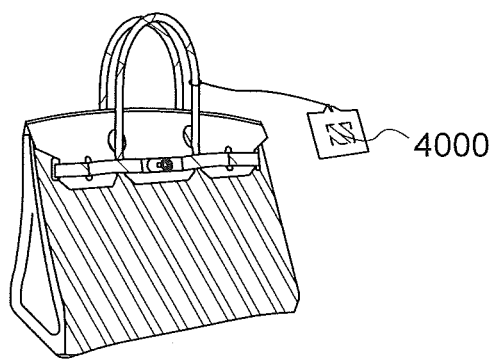
Figure 52F:
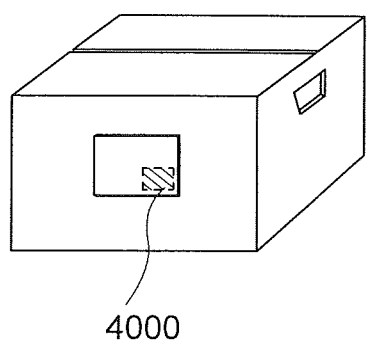

The RF tag is widely used and can be provided for, for example, products such as bills, coins, securities, bearer bonds, documents (e.g., driver's licenses or resident's cards, see FIG. 52A), vehicles (e.g., bicycles, see FIG. 52B), packaging containers (e.g., wrapping paper or bottles, see FIG. 52C), recording media (e.g., DVD or video tapes, see FIG. 52D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 52E and 52F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag including the semiconductor device of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

This embodiment can be combined as appropriate with any of the other embodiments in this specification.

This application is based on Japanese Patent Application serial no. 2015-146369 filed with Japan Patent Office on Jul. 24, 2015, the entire contents of which are hereby incorporated by reference.

What is claimed is:

1. A semiconductor device comprising:
an oxide semiconductor having a channel formation region;
a gate electrode;
a source electrode;
a drain electrode;
a first insulating layer;
a second insulating layer; and
a third insulating layer,
wherein the oxide semiconductor comprises indium, gallium, and zinc,
wherein an electron affinity of the oxide semiconductor is higher than an electron affinity of a material forming the third insulating layer by 1.3 eV or less and 0.07 eV or more,
wherein the gate electrode and the oxide semiconductor overlap with each other with the first insulating layer and the third insulating layer therebetween,
wherein the first insulating layer is in contact with a side surface of the second insulating layer, is buried in the second insulating layer, and is over the third insulating layer,
wherein a top surface of the first insulating layer is exposed from the second insulating layer,
wherein the gate electrode comprises a region facing the side surface of the second insulating layer with the first insulating layer positioned between the gate electrode and the second insulating layer,
wherein the oxide semiconductor comprises a region where a side surface and a top surface of the oxide semiconductor are in direct contact with the third insulating layer, wherein a top surface of the third insulating layer is in direct contact with a bottom surface of the source electrode and a bottom surface of the drain electrode, wherein the oxide semiconductor comprises a region where an acute angle is formed between a plane that is parallel to a bottom surface of the oxide semiconductor and the side surface of the oxide semiconductor, and wherein a thickness of the third insulating layer in a region overlapping with the source electrode and the drain electrode is less than 10 nm.

2. The semiconductor device according to claim 1, further comprising a fourth insulating layer over the gate electrode.

3. The semiconductor device according to claim 1, wherein a line width of the gate electrode is greater than or equal to 3 nm and less than or equal to 60 nm.

4. The semiconductor device according to claim 1, comprising a region where a distance between an end portion of the source electrode and an end portion of the drain electrode that face each other is greater than or equal to 5 nm and less than or equal to 80 nm.

5. The semiconductor device according to claim 1, wherein side surfaces of the first insulating layer are in contact with the second insulating layer.

6. The semiconductor device according to claim 1, wherein the second insulating layer is on and in contact with a top surface of the source electrode and a top surface of the drain electrode.

7. A semiconductor device comprising:

an oxide semiconductor layer having a channel formation region;

a source electrode and a drain electrode;

a first insulating layer covering the oxide semiconductor layer;

a second insulating layer over the first insulating layer;

a gate insulating layer buried in the second insulating layer; and a gate electrode over the gate insulating layer, wherein the oxide semiconductor comprises indium, gallium, and zinc, wherein a top surface of the first insulating layer is in direct contact with a bottom surface of the source electrode and a bottom surface of the drain electrode, wherein an electron affinity of the oxide semiconductor is higher than an electron affinity of a material forming the first insulating layer by 1.3 eV or less and 0.07 eV or more, and wherein a top surface of the gate insulating layer is exposed from the second insulating layer.

8. The semiconductor device according to claim 7, wherein a line width of the gate electrode is greater than or equal to 3 nm and less than or equal to 60 nm.

9. The semiconductor device according to claim 7, wherein side surfaces of the gate insulating layer are in contact with the second insulating layer.

10. The semiconductor device according to claim 7, wherein the second insulating layer is on and in contact with a top surface of the source electrode and a top surface of the drain electrode.

* * * * *